(12) United States Patent
Kanaya et al.

(10) Patent No.: US 6,603,161 B2
(45) Date of Patent: Aug. 5, 2003

(54) SEMICONDUCTOR DEVICE HAVING FERROELECTRIC CAPACITOR AND METHOD FOR MANUFACTURING THE SAME

(75) Inventors: Hiroyuki Kanaya, Yokohama (JP); Yasuyuki Taniguchi, Tokyo (JP); Tohru Ozaki, Tokyo (JP); Yoshinori Kumura, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/801,920

(22) Filed: Mar. 9, 2001

(65) Prior Publication Data

US 2001/0022372 A1 Sep. 20, 2001

(30) Foreign Application Priority Data

Mar. 10, 2000 (JP) ............................... 2000-066734
Mar. 27, 2000 (JP) ............................... 2000-087403
Mar. 27, 2000 (JP) ............................... 2000-087417

(51) Int. Cl.[7] ........................ H01L 29/76; H01L 27/108
(52) U.S. Cl. .................... 257/295; 257/308; 257/311
(58) Field of Search .................... 257/295, 306, 257/307, 308, 309, 311; 438/3, 253, 396

(56) References Cited

U.S. PATENT DOCUMENTS

| | | | | |
|---|---|---|---|---|
| 5,330,931 A | * | 7/1994 | Emesh et al. ............... | 438/3 |
| 5,489,548 A | * | 2/1996 | Nishioka et al. ............ | 438/396 |
| 5,576,240 A | * | 11/1996 | Radosevich et al. ......... | 438/396 |
| 5,777,839 A | * | 7/1998 | Sameshima et al. .......... | 361/311 |
| 5,838,605 A | * | 11/1998 | Bailey ..................... | 365/145 |
| 5,903,492 A | | 5/1999 | Takashima ................. | 365/145 |
| 5,907,762 A | * | 5/1999 | Evans et al. ............... | 438/3 |
| 6,081,417 A | * | 6/2000 | Matsuki .................... | 361/311 |
| 6,235,577 B1 | * | 5/2001 | Jeon ....................... | 438/253 |
| 6,278,153 B1 | * | 8/2001 | Kikuchi et al. ............. | 257/310 |
| 6,284,568 B1 | * | 9/2001 | Selsikar et al. ............ | 438/239 |

FOREIGN PATENT DOCUMENTS

JP  4-11-3976  * 6/1999 ........... H01L/27/10

OTHER PUBLICATIONS

Takashima et al., A Sub–40–ns Chain FRAM Architecture with 7–ns Cell–Plate–Line Drive, Nov. 1999, IEEE Journal of Solid State Circuits, vol. 34, No. 11, pp. 1557–1563.*
Takashima et al., Gain Cell Block Architecture for Giga–bit–Scale Chain Ferroelectric RAM, 1999, Symposium on VLSI Circuits Digest of Technical Papers, pp. 103–104.*
U.S. patent application Ser. No. 09/359,324, filed Jul. 23, 1999, Kanaya et al.
U.S. patent application Ser. No. 09/801,920, filed Mar. 9, 2001, Kanaya et al.
U.S. patent application Ser. No. 09/956,001, filed Sep. 20, 2001, Ozaki et al.
U.S. patent application Ser. No. 10/178,744, filed Jun. 25, 2002, Kanaya et al.

* cited by examiner

*Primary Examiner*—George Eckert
(74) *Attorney, Agent, or Firm*—Oblon, Spivak, McClelland, Maier & Neustadt, P.C.

(57) ABSTRACT

There is provided a semiconductor device having a ferroelectric capacitor formed on a semiconductor substrate covered with an insulator film, wherein the ferroelectric capacitor comprises: a bottom electrode formed on the insulator film; a ferroelectric film formed on the bottom electrode; and a top electrode formed on the ferroelectric film. The ferroelectric film has a stacked structure of either of two-layer-ferroelectric film or three-layer-ferroelectric film. The upper ferroelectric film is metallized and prevents hydrogen from diffusing in lower ferroelectric layer. Crystal grains of the stacked ferroelectric films are preferably different.

11 Claims, 39 Drawing Sheets

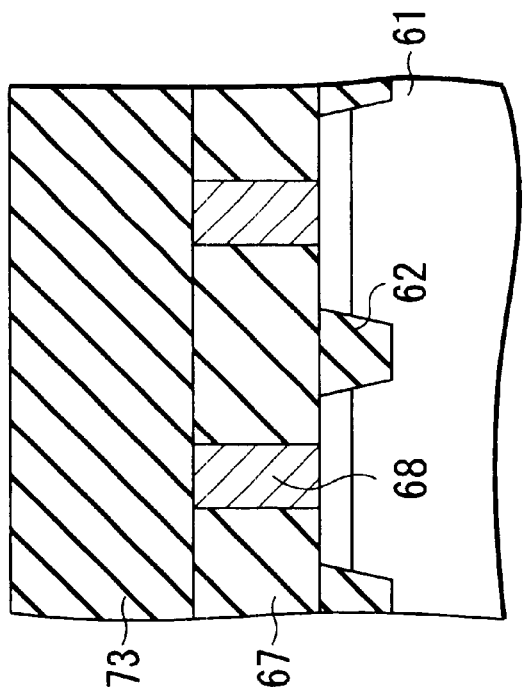
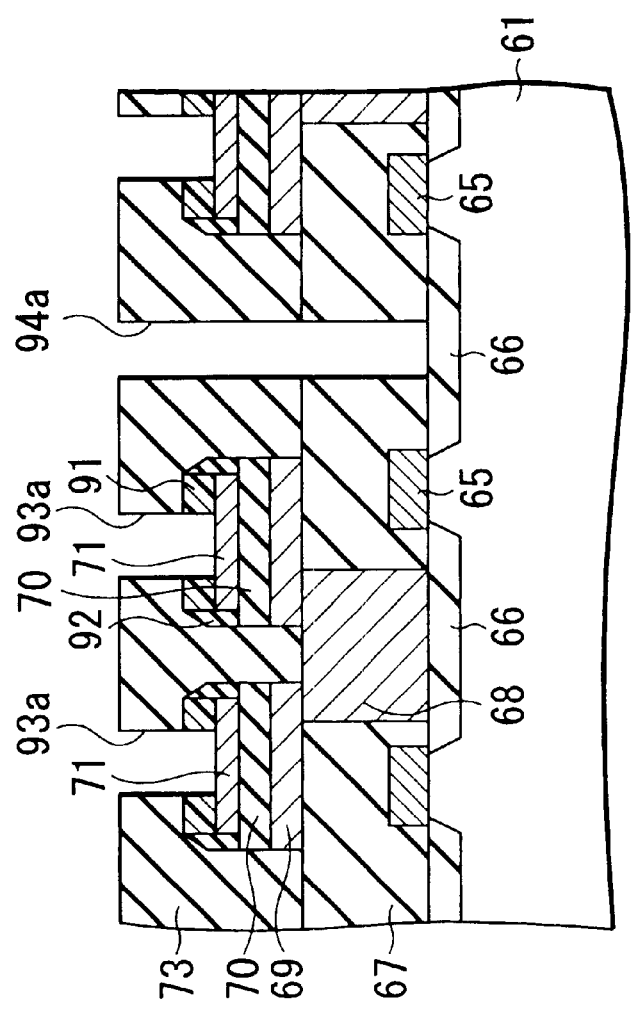
FIG. 39B
FIG. 39A

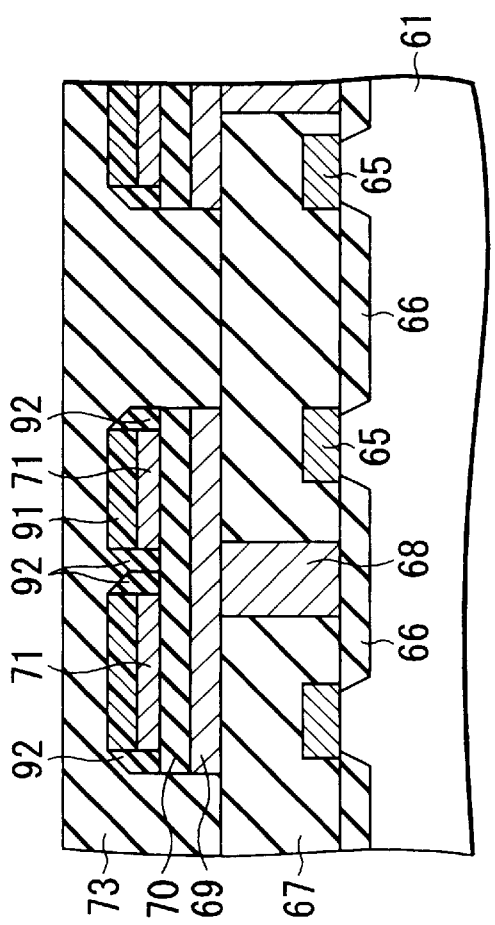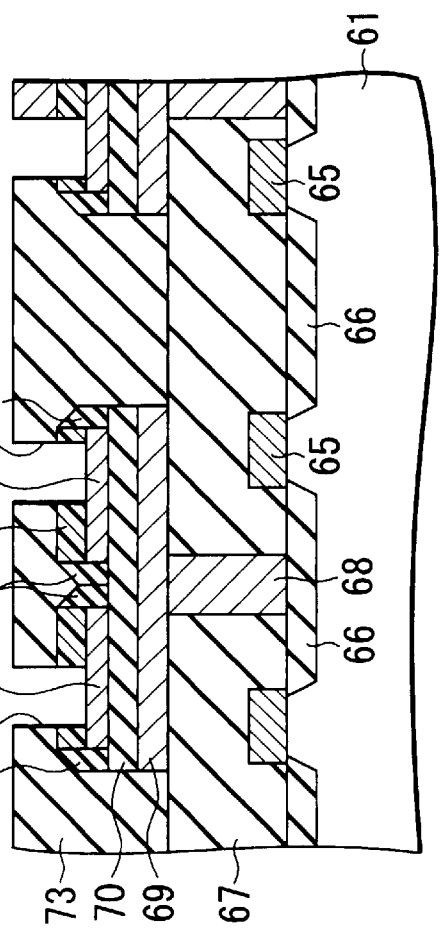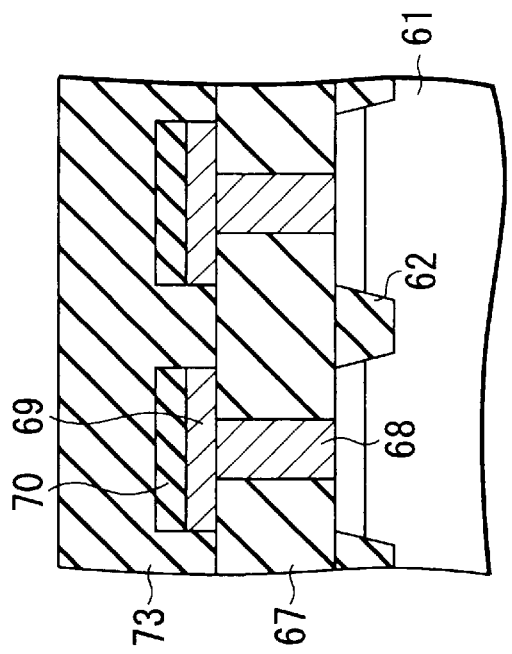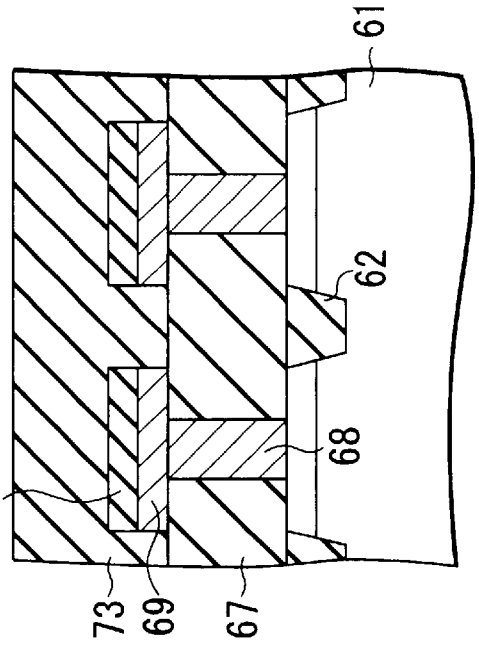

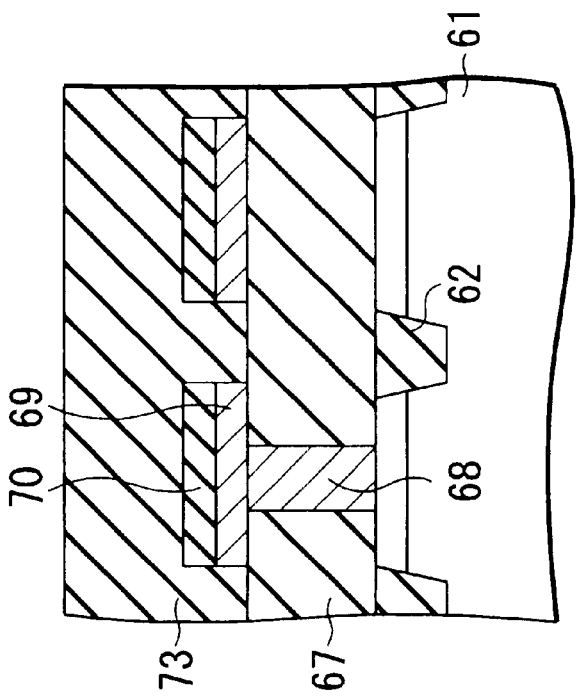
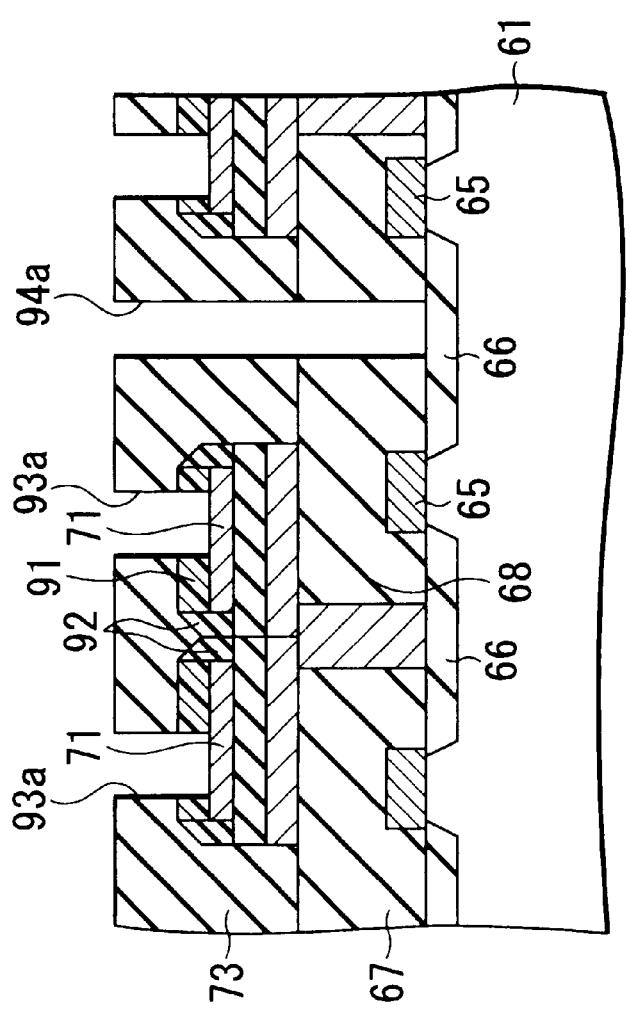
FIG. 49B
FIG. 49A

SEMICONDUCTOR DEVICE HAVING FERROELECTRIC CAPACITOR AND METHOD FOR MANUFACTURING THE SAME

CROSS-REFERENCE TO RELATED APPLICATIONS

This application is based upon and claims the benefit of priority from the prior Japanese Patent Applications No. 2000-066734, filed Mar. 10, 2000; No. 2000-087403, filed Mar. 27, 2000; and No. 2000-087417, filed Mar. 27, 2000, the entire contents of all of which are incorporated herein by reference.

BACKGROUND OF THE INVENTION

The present invention relates to a semiconductor device having a ferroelectric capacitor and a method for manufacturing the ferroelectric capacitor.

Ferroelectric substances have a hysteresis characteristic between applied electric fields and the amount of electric polarization; thus, polarization remains even if a voltage applied between opposite ends of the ferroelectric substance is returned to zero. That is, the ferroelectric substance is characterized in that electric polarization generated when electric fields are applied remains even after the application of electric fields has been stopped and in that the direction of the polarization is reversed when electric fields of a certain intensity or more are applied in a direction opposite to that of the above electric fields.

Memory which consists of series connected memory cells each having a transistor having a source terminal and a drain terminal and a ferroelectric capacitor inbetween the two terminals, hereafter named "Series connected TC unit type ferroelectric RAM" is gathering the industry's attention. In these Series connected TC unit type ferroelectric RAMs, the cell area per memory cell is reduced based on the non-volatile characteristic of ferroelectric substances, by connecting opposite ends of a ferroelectric capacitor (C) between a source and a drain of a cell transistor (T) to constitute a unit cell and connecting a plurality of such unit cells in series.

These Series connected TC unit type ferroelectric RAMs are known, for example, from "High-Density Chain Ferroelectric Random Access Memory (CFRAM)", VLSI Circuit Symposium, 1997, p. 83–84, "A Sub-40 ns Random-Access Chain FRAM Architecture with 7 ns Cell-Plate-Line Drive", ISSCC Tech. Digest Papers, pp. 102–103, February 1999, and "Ferro Electric RAM", D. Takashima et al., JSSCC, pp. 787–792, May 1998".

FIG. 1 shows an equivalent circuit of the Series connected TC unit type ferroelectric RAMs described in these documents. In this figure, eight transistors T0 to T7 are connected in series, and ferroelectric capacitors are each connected between a source and a drain of a corresponding one of the transistors to constitute a cell array block. The cell array block has one end connected to a bit line BL via a selection gate transistor ST1 and the other end connected to a plate line PL via a selection gate transistor ST2 (or directly).

The transistors T0 to T7 have their gates connected to word lines WL0 to WL7, respectively, and the selection gate transistors ST1 and ST2 have their gates connected to selection gate lines BS1 and BS2, respectively. Specifically, the word lines WL0 to WL7 and the selection gate lines BS1 and BS2 are configured by continuously forming corresponding gate electrodes between a plurality of other cell array blocks (not shown).

The Series connected TC unit type ferroelectric RAMs are advantageous in that the unit cell area can be reduced by sharing a diffusion layer of the adjacent transistor within the cell array block; theoretically, these memories can achieve $4F^2$ (F denotes a minimum size). Further, the area occupied by peripheral circuits can be reduced compared to ordinary ferroelectric memories, thereby reducing the chip size and costs.

The Series connected TC unit type ferroelectric RAMs also have an excellent characteristic that the plate line PL connected to the other end can be formed of the diffusion layer formed outside the cell array and thus has low resistance, whereby drivers are not required to have high performance. The Series connected TC unit type ferroelectric RAMs can thus operate faster than ordinary ferroelectric memories.

As described above, the Series connected TC unit type ferroelectric RAMs have various characteristics, but also have problems.

That is, for memory cells of a capacitor on plug (COP) structure in which, for example, a tungsten plug (W plug) is formed on a source and a drain diffusion layer of a transistor as a contact plug with a ferroelectric capacitor formed on the W plug, a barrier metal must be interposed between the W plug and the ferroelectric capacitor to prevent oxidation of the W plug, but no metal has been found suitable to be such a barrier metal.

Thus, an upper and a lower electrode of the ferroelectric capacitor are connected to the source and drain diffusion layers of the transistor by separately forming metal wiring.

FIGS. 2A to 2E show a conventional method for manufacturing a ferroelectric capacitor for a series connected TC unit type ferroelectric RAM, in the order of steps.

First, as shown in FIG. 2A, a lower electrode 12, a ferroelectric film 13, and an upper electrode 14 are sequentially deposited on an interlayer insulating film 11 provided on a semiconductor substrate.

Then, as shown in FIG. 2B, an etching mask 15 having a predetermined pattern shape is formed and used to etch the upper electrode 14.

Then, the mask 15 is removed and a new etching mask 16 having a predetermined pattern shape is subsequently formed as shown in FIG. 2C. In this case, the mask 16 is shaped so as to continuously cover the two upper electrodes 14. The mask 16 us used to etch the remaining part of the ferroelectric film 13 and lower electrode 12.

Then, as shown in FIG. 2D, an interlayer insulating film 17 is deposited on the entire top surface, wiring grooves 18 and contact holes 19 for the two upper electrodes 14 are formed in the interlayer insulating film 17, and a wiring groove 20 and a contact hole 21 for the lower electrode 12 are further formed.

Subsequently, contact plugs/wires 22 are formed so as to fill the wiring grooves 18 and 20 and the contact holes 19 and 21. The contact plugs/wires 22 are connected to a source and a drain diffusion layers of a transistor (not shown).

In this conventional method, when the contact hole 21 for the lower electrode 12 is formed, the interlayer insulated layer 17 and the ferroelectric film 13 must be etched. An etching rate for the ferroelectric film is low, about one tenth (for example, 50 nm/sec.) of that for the interlayer insulating film, thus requiring a large amount of time to form the deep contact hole 21 for the lower electrode 12. Consequently, when the contact holes 19 for the upper electrodes 14 are formed, relatively large parts of the upper electrodes 14 are removed as shown in FIG. 2D, thereby disadvantageously degrading capacitor characteristics or inducing capacitor leakage.

Furthermore, it has been found that since the contact hole 21 for the lower electrode 12 penetrates the ferroelectric film 13, an etching gas may damage the ferroelectric film to degrade polarization.

BRIEF SUMMARY OF THE INVENTION

The present invention has been made in view of the foregoing. An object of the invention is to provide a semiconductor device, a semiconductor storage device and a method of manufacturing the same, in which the degradation of capacitor characteristics or the capacitor leakage is prevented when a part of the upper electrode is etched in the process of making contact holes and in which the damage to the ferroelectric film is reduced to prevent the deterioration of the ferroelectric capacitor, which would otherwise occur due to polarization.

According to the present invention, there is provided a semiconductor device comprising a first interlayer insulating film formed on a semiconductor substrate, a lower electrode formed on the first interlayer insulating film, a pair of ferroelectric films formed on the lower electrode separately from each other, and a pair of upper electrode formed on the pair of ferroelectric films, wherein the lower electrode, the pair of ferroelectric films, and the pair of upper electrodes constitute a pair of ferroelectric capacitors and portions of the lower electrode which are located under the pair of ferroelectric films are thicker than the other portions of the lower electrode.

According to the present invention, there is provided a method for manufacturing a semiconductor device comprising sequentially forming a lower electrode, a ferroelectric film, and an upper electrode on a first interlayer insulating film formed on a semiconductor substrate, forming a first mask on the upper electrode, using the first mask to sequentially etch the upper electrode and the ferroelectric film to leave on the lower electrode a pair of laminated structure comprising the ferroelectric film and the upper electrode, forming a second mask having such a pattern shape that continuously covers at least the pair of laminated structure, using the second mask to etch the lower electrode to thereby leave portions of the lower electrode in which the pair of laminated structures comprising the ferroelectric film and the upper electrode are formed.

According to the present invention, there is provided a semiconductor device comprising an interlayer insulating film formed on a semiconductor substrate, a lower electrode formed on the interlayer insulating film, a pair of ferroelectric films formed on the lower electrode separately from each other and each having a recess portion, and a pair of upper electrodes formed so as to fill recess portions of the pair of ferroelectric films, wherein the lower electrode, the pair of ferroelectric films, and the pair of upper electrode constitute a pair of ferroelectric capacitors.

According to the present invention, there is provided a method for manufacturing a semiconductor device comprising forming a lower electrode on a first interlayer insulating film formed on a semiconductor substrate, leaving the lower electrode only at selected portions of the first interlayer insulating film, while removing the other portions, forming a second interlayer insulating film on the entire top surface including a surface of the lower electrode and then executing a flattening process to expose the lower electrode, forming a third interlayer insulating film on the entire top surface and then forming two openings in the third interlayer insulating film so as to lead to the surface of the lower electrode, sequentially forming a ferroelectric film and an upper electrode on the entire top surface including interiors of the two openings, and executing a flattening process to leave laminated structures in the two openings, the laminated structures comprising the ferroelectric film and the upper electrode.

According to the present invention, there is provided a method for manufacturing a semiconductor device comprising forming a lower electrode on a first interlayer insulating film formed on a semiconductor substrate, leaving the lower electrode only at selected portions of the first interlayer insulating film, while removing the other portions, forming a second interlayer insulating film on the entire top surface including a surface of the lower electrode and then executing a flattening process, forming two openings in the second interlayer insulating film so as to lead to the surface of the lower electrode, sequentially forming a ferroelectric film and an upper electrode on the entire top surface including interiors of the two openings, and leaving laminated structures only in the two openings, the laminated structures comprising the ferroelectric film and the upper electrode.

According to the present invention, there is provided a method for manufacturing a semiconductor device comprising forming a first interlayer insulating film on a second interlayer insulating film formed on a semiconductor substrate, forming a first opening in the first interlayer insulating film, depositing a lower electrode on the entire top surface, executing a flattening process to expose the first interlayer insulating film, while leaving the lower electrode in the first opening, forming a third interlayer insulating film on the entire top surface, forming a pair of second openings in the third interlayer insulating film so as to lead to a surface of the lower electrode, sequentially forming a ferroelectric film and an upper electrode on the entire top surface including interiors of the pair of second openings, and flattening the ferroelectric film and the upper electrode to leave the ferroelectric film and the upper electrode in the pair of second openings.

According to the present invention, there is provide a semiconductor device comprising a first interlayer insulating film formed on a semiconductor substrate, a first lower electrode formed on the first interlayer insulating film, a pair of second lower electrodes formed on the first lower electrode separately from each other and each having a recess portion, a pair of ferroelectric films formed so as to fill recess portions of the pair of second lower electrodes and each having a recess portion, and a pair of upper electrodes formed so as to fill recess portions of the pair of ferroelectric films, wherein the first lower electrode, the pair of second lower electrodes, the pair of ferroelectric films, and the pair of upper electrode constitute a pair of ferroelectric capacitors.

According to the present invention, there is provided a method for manufacturing a semiconductor device comprising forming a first interlayer insulating film on a second interlayer insulating film formed on a semiconductor substrate, forming a first opening in the first interlayer insulating films, forming a first lower electrode on the entire top surface, executing a flattening process to expose the first interlayer insulating film, while leaving the first lower electrode in the first opening, forming a third interlayer insulating film on the entire top surface, forming a pair of second openings in the third interlayer insulating film so as to lead to a surface of the lower electrode, sequentially forming a second lower electrode, a ferroelectric film, and an upper electrode on the entire top surface including interiors of the pair of second openings, and flattening the second lower electrode, the ferroelectric film, and the upper electrode to leave the second lower electrode, the ferroelectric film, and the upper electrode in the pair of second openings.

According to the present invention, there is provided a method for manufacturing a semiconductor device comprising forming a first lower electrode on a first interlayer insulating film formed on a semiconductor substrate, leaving the first lower electrode only at selected portions of the first interlayer insulating film, while removing the other portions, forming a second interlayer insulating film on the entire top surface including a surface of the first lower electrode and then executing a flattening process to expose the first lower electrode, forming a third interlayer insulating film on the entire top surface and then forming two openings in the third interlayer insulating film so as to lead to the surface of the lower electrode, sequentially forming a second lower electrode, a ferroelectric film, and an upper electrode on the entire top surface including interiors of the two openings, executing a flattening process to leave laminated structures in the two openings, the laminated structures comprising the second lower electrode, the ferroelectric film, and the upper electrode.

According to the present invention, there is provided a method for manufacturing a semiconductor device comprising forming a first lower electrode on a first interlayer insulating film formed on a semiconductor substrate, leaving the first lower electrode only at selected portions of the first interlayer insulating film, while removing the other portions, forming a second interlayer insulating film on the entire top surface including a surface of the first lower electrode and then executing a flattening process, forming two openings in the second interlayer insulating film so as to lead to the surface of the first lower electrode, sequentially forming a second lower electrode, a ferroelectric film, and an upper electrode on the entire top surface including interiors of the two openings, and executing one of an etchback process and flattening etching process to leaving laminated structures only in the two openings, the laminated structures composing the second lower substrate, the ferroelectric film, and the upper electrode.

According to the present invention, there is provide a semiconductor storage device comprising a semiconductor substrate, a plurality of transistors formed on the semiconductor substrate, a first interlayer insulating film formed so as to cover the plurality of transistors, and a plurality of ferroelectric capacitors each comprising a laminated structure of a lower electrode, a ferroelectric film, and an upper electrode sequentially formed on the first interlayer insulating film, wherein the plurality of ferroelectric capacitors constitute sets each comprising two of these ferroelectric capacitors, the lower electrode is shared by the one set of ferroelectric capacitors, the upper electrode is individually separated between the one set of ferroelectric capacitors, and a space between the upper electrodes of the one set of ferroelectric capacitors is smaller than a space between the upper electrodes of the one set of ferroelectric capacitors and the upper electrodes of an adjacent set of ferroelectric capacitors.

More specifically, the one set of ferroelectric capacitors have their peripheries formed into inclined surfaces extending continuously from a top surface of the upper electrode to a bottom surface of the lower electrode and having no step, and the individual upper electrodes of the one set of ferroelectric capacitors are separated by a generally V-shaped groove.

Thus, the upper electrodes of the ferroelectric capacitors are not spaced at equal intervals, and the space between the upper electrodes of one set of ferroelectric capacitors on the shared lower electrode is smaller than the space between the upper electrodes of one set of ferroelectric capacitors and the upper electrodes of the adjacent set of ferroelectric capacitors, thereby reducing the unit cell area.

According to the present invention, the semiconductor substrate preferably partitioned into a plurality of element forming areas each having the plurality of transistor formed therein, adjacent ones of the plurality of transistors share a diffusion area and are arranged in a row, and the ferroelectric capacitors are connected in parallel with the transistors to constitute a cell array block.

In this case, gate electrodes of the transistors extended in a direction crossing a transistor arranging direction of the cell array block constitute a word line, and the space between the upper electrodes of the one set of ferroelectric capacitors is smaller than the width of the word line.

When the upper electrodes are separated by the space smaller than the width of the word line, the upper electrodes have larger areas to provide excellent characteristics even if the ferroelectric capacitors are arranged at a very small pitch. Specifically, the word line width is equal to a minimum dimension according to design rules.

Furthermore, according to the present invention, there is provide a semiconductor storage device comprising a semiconductor substrate, a plurality of transistors formed on the semiconductor substrate, a first interlayer insulating film formed so as to cover the plurality of transistors, and a plurality of ferroelectric capacitors each comprising a laminated structure of a lower electrode, a ferroelectric film, and an upper electrode sequentially formed on the first interlayer insulating film, wherein the plurality of ferroelectric capacitors constitute sets each comprising two of these ferroelectric capacitors, the lower electrode is shared by the one set of ferroelectric capacitors, the upper electrode is individually separated between the one set of ferroelectric capacitors and has a space, the one set of ferroelectric capacitors have peripheries thereof formed into inclined surfaces extending continuously from a top surface of the upper electrode to a bottom surface of the lower electrode and having no step, and the individual upper electrodes of the one set of ferroelectric capacitors are separated by a generally V-shaped groove.

According to the present invention, there is provided a method for manufacturing semiconductor storage device comprising forming a plurality of transistors in and on a semiconductor substrate, forming an interlayer insulating film on the entire top surface, forming a lower-electrode material film, a ferroelectric film, and an upper-electrode material film on the interlayer insulating film to constitute a plurality of ferroelectric capacitors, forming an etching mask on each upper-electrode forming area of the upper-electrode material film, using the etching mask to separate the upper electrodes of the plurality of ferroelectric capacitors, while separating, in order to allow the lower electrode to be shared by one set of plurality of ferroelectric capacitors, the lower electrode between the adjacent ferroelectric capacitors of the set.

According to the present invention, there is provide a method for manufacturing a semiconductor storage device comprising forming an isolation film in a semiconductor substrate and partitioning the semiconductor substrate into a plurality of element forming areas, forming a plurality of transistors in each of the plurality of element forming areas, the transistors each having a first and a second diffusion regions in such a manner that the transistor is adjacent, at one side, to the first diffusion region, which is shared by the adjacent transistor on this side, while the transistor is adjacent, at the other side, to the second diffusion region, which is shared by the adjacent transistor on this side, forming a first interlayer insulating film on the entire top surface, burying a contact plug in the first interlayer insulating film, the contact plug being connected to each of the first diffusion areas of the plurality of transistors, sequentially forming a lower-electrode material film, a ferroelectric film, and an upper-electrode material film on the first interlayer insulating film to constitute a plurality of ferroelectric capacitors, forming an etching mask on each upper-electrode forming area of the upper-electrode material film, using the etching mask and etching to separate upper electrodes of each of the ferroelectric capacitor while separating the adjacent pairs of ferroelectric capacitors in such a manner that the pair of ferroelectric capacitors share the lower electrode connected to the contact plug, forming a second interlayer insulating film so as to cover all of the top surface, and a step of forming a wiring layer on the second interlayer insulating film, for connecting the upper electrode of the ferroelectric capacitor to the second diffusion region of the corresponding transistor.

According to the present invention, there is provide a method for manufacturing a semiconductor storage device comprising forming a plurality of transistors in a semiconductor substrate, the transistors each having a first and a second diffusion regions in such a manner that the transistor is adjacent, at one side, to the first diffusion region, which is shared by the adjacent transistor on this side, while the transistor is adjacent, at the other side, to the second diffusion region, which is shared by the adjacent transistor on this side, forming a first interlayer insulating film on the entire top surface, forming an opening leading to a surface of the first diffusion region of each of the plurality of transistors and forming a plug electrode in the opening, sequentially forming a lower-electrode material film, a ferroelectric film, and an upper-electrode material film on the first interlayer insulating film so as to contact with the plug electrode, forming a mask pattern for etching the upper-electrode material film so that a pair of upper electrodes are located on the plug electrode, using the mask pattern to etch the upper-electrode material film, the ferroelectric film, and the lower-electrode material film to thereby form a pair of upper electrodes, a ferroelectric film, and a lower electrode on the plug electrode, forming a second interlayer insulating film on the entire top surface, and forming a wiring layer for connecting the second diffusion regions of the plurality of transistors and the upper electrodes together.

According to the present invention, there is provide a method for manufacturing a semiconductor storage device comprising forming a plurality of transistors in a semiconductor substrate, the transistors each having a first and a second diffusion regions in such a manner that the transistor is adjacent, at one side, to the first diffusion region, which is shared by the adjacent transistor on this side, while the transistor is adjacent, at the other side, to the second diffusion region, which is shared by the adjacent transistor on this side, forming a first interlayer insulating film on the entire top surface, forming a first opening leading to a surface of the first diffusion region of each of the plurality of transistors and forming a plug electrode in the opening, sequentially forming a lower-electrode material film, a ferroelectric film, and an upper-electrode material film on the first interlayer insulating film so as to contact with the plug electrode, forming a mask pattern for etching the upper-electrode material film, using the mask pattern to etch the upper-electrode material film to form a pair of upper electrodes, forming a side wall insulating film on side walls of the pair of upper electrodes and arranging, on the plug electrode, a portion of the side wall insulating film located between the pair of upper electrodes, using the mask pattern and the side wall insulating film to sequentially etch the ferroelectric film and the lower-electrode material film to form a pair of ferroelectric films and a lower electrode on the plug electrode, forming a second interlayer insulating film on the entire top surface, and forming a wiring layer for connecting the second diffusion regions of the plurality of transistors and the upper electrodes together.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 33A, 33B, 34A, 34B, 35A, 35B, 36A, 36B, 37A, 37B, 38A, 38B, 39A, and 39B are sectional views showing steps of manufacturing the series connected TC unit type ferroelectric RAM according to the tenth embodiment of the present invention;

FIGS. 43A, 43B, 44A, 44B, 45A, 45B, 46A, 46B, 47A, 47B, 48A, 48B, 49A, and 49B are sectional views showing steps of manufacturing the series connected TC unit type ferroelectric RAM according to the thirteenth embodiment of the present invention;

DETAILED DESCRIPTION OF THE INVENTION

Embodiments of the present invention will be described below in detail with reference to the drawings.

FIGS. 3A to 3F show a method for manufacturing a series connected TC unit type ferroelectric RAM according to a first embodiment of the present invention, in the order of steps.

Figure 3A:
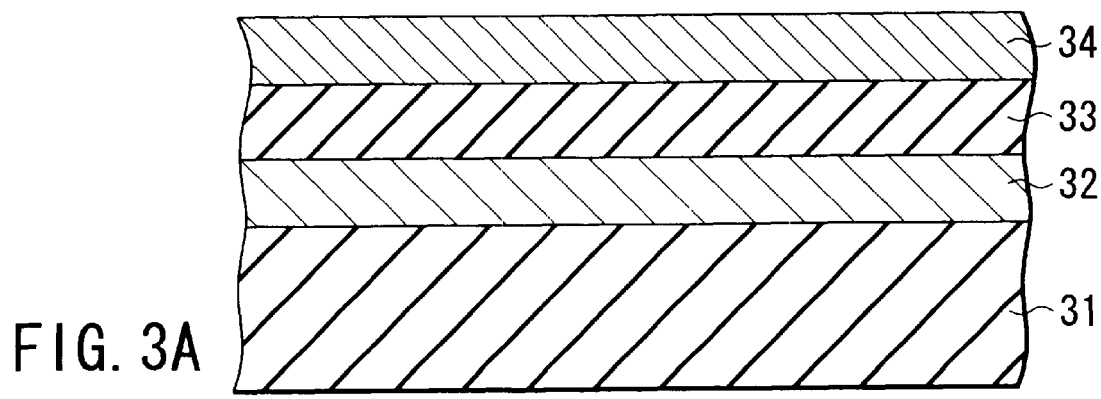
FIGS. 3A to 3F show a method for manufacturing a series connected TC unit type ferroelectric RAM according to a first embodiment of the present invention, in the order of steps.

First, as shown in FIG. 3A, a lower electrode 32, a ferroelectric film 33, and an upper electrode 34 are sequentially deposited, by means of the CVD or sputtering process, on an interlayer insulating film (SiO$_2$) 31 on a silicon semiconductor substrate (not shown) having elements such as switching transistors formed thereon. The lower electrode 32 composes, for example, one Pt film layer but may comprise one film layer containing at least one metal selected from IrO$_x$, Ru, Ti, Al, Sr, Re, Mg, La, and Ca or a plurality of film layers containing different metals.

The lower electrode 32 has a thickness of, for example, 100 nm. The ferroelectric film 33 composes, for example, SBT but may comprise a lead zirconate titanate (PZT: PbZr$_{1-x}$Ti$_x$O$_3$), or STB or BTO of a composite provskite structure. The ferroelectric film 33 has a thickness of, for example, 150 nm. Furthermore, like the lower electrode 32, the upper electrode 34 comprises, for example, one Pt film layer but may composes one film layer containing at least one metal selected from IrO$_x$, Ru, Ti, Al, Sr, Re, Mg, La, and Ca or a plurality of film layers containing different metals. The upper electrode 34 has a thickness of, for example, 100 nm.

Figure 3B:
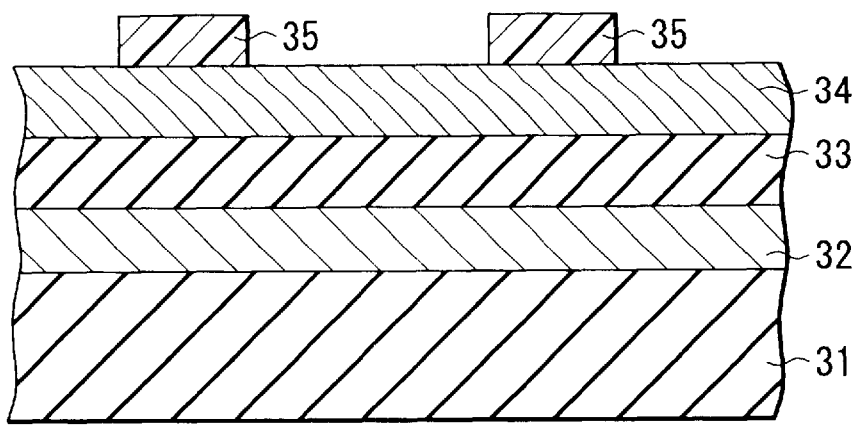

Then, as shown in FIG. 3B, an etching resist mask 35 having a predetermined pattern shape is formed on the upper electrode 34. A hard mask composing W$_x$N$_y$, Ti$_x$N$_y$, SiO$_2$, Al$_2$O$_3$, alumina, or a combination thereof may be formed instead of the resist mask 35.

Figure 3C:
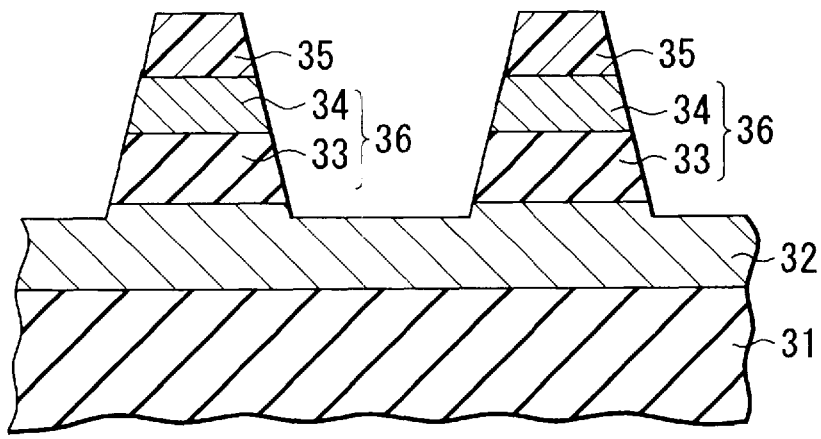

Subsequently, as shown in FIG. 3C, the upper electrode 34 and the ferroelectric film 33 are etched by means of a dry etching process, for example, the RIE (Reactive Ion Etching) process using the mask 35, to leave a pair of laminate structures 36 on the lower electrode 32, the structures composing the upper electrode 34 and the ferroelectric film 33. At this time, a part of the lower electrode 32 may be etched as shown in the figure.

Figure 3D:
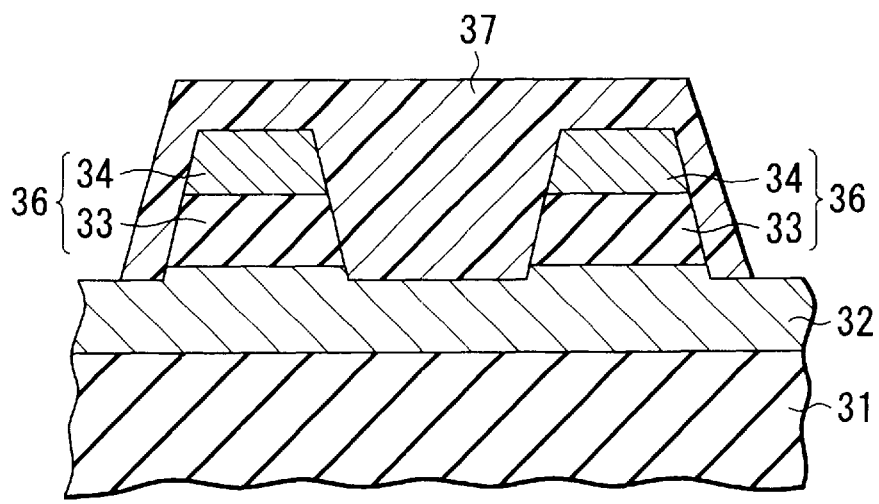

Then, as shown in FIG. 3D, the mask 35 is removed by means of the ashing process, and a new etching mask 37 is formed which has a predetermined pattern shape. At this time, the upper mask 37 is patterned so as to have such a pattern shape that continuously covers the pair of laminated structures 36. Subsequently, the lower electrode 31 is etched by means of a dry etching process, for example, the RIE process using the mask 37, to leave only portions of the lower electrode 32 in which the pair of laminated structures 36 comprising the upper electrode 34 and the ferroelectric film 33 are placed.

Figure 3E:
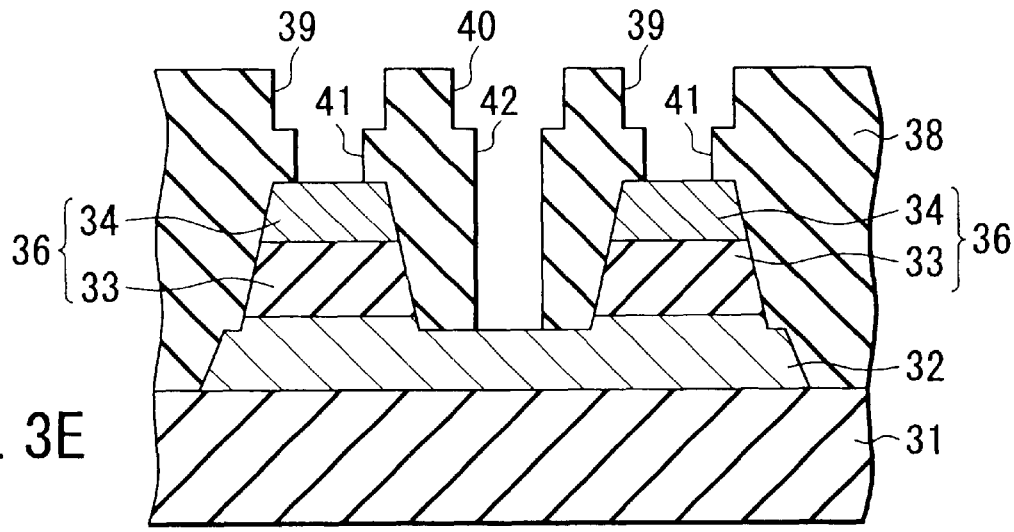

Then, the mask 37 is removed by means of the ashing process. Subsequently, as shown in FIG. 3E, an interlayer insulating film 38 is deposited on the entire top surface by means of the CVD (Chemical Vapor Deposition) process and is flattened, for example, by means of the CMP (Chemical Mechanical Polishing) process. Wiring grooves 39 are formed on the pair of laminated structures 36 and a wiring groove 40 is formed on a lower electrode 32. Subsequently, contact holes 41 leading to the upper electrode 34 are formed in the wiring grooves 39 and a contact hole 42 leading to the lower electrode 32 is opened in the wiring groove 40.

In FIG. 3E, the contact hole 42 leading to the lower electrode 32 is formed between the pair of contact holes 41 leading to the upper electrode 34, but may be formed at an end of the pair of contact holes 41.

In this case, an etching selection ratio between the interlayer insulating film 36 comprising SiO$_2$ and the upper electrode 34 composing Pt has a large value of 10 or more, so that the etching over amount of the upper and lower electrodes 34 and 32 is small even when the deep contact hole 42 leading to the lower electrode 32 is formed.

Figure 3F:
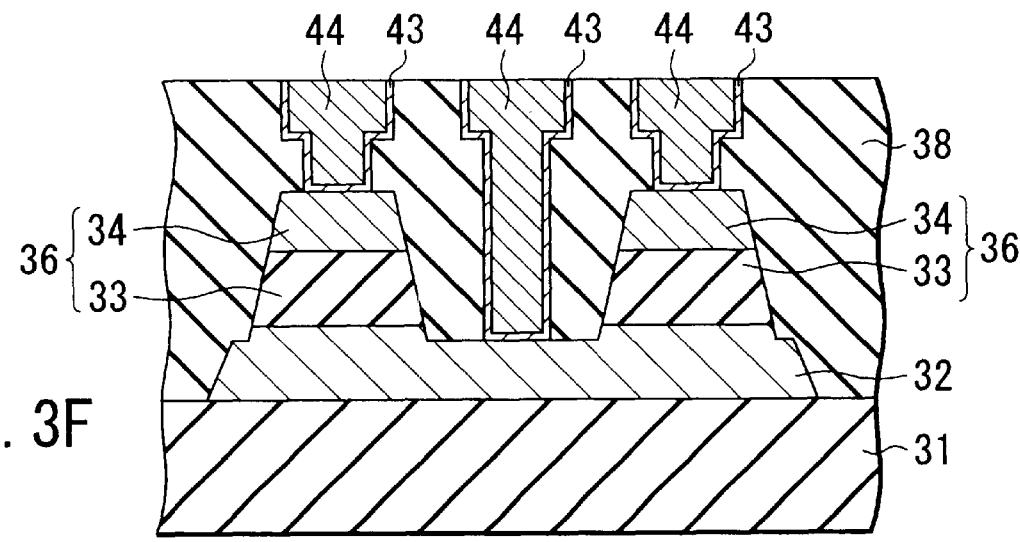

Then, as shown in FIG. 3F, for example, a TiN film 43 is deposited, as a barrier metal, in each of the wiring grooves 39 and 40 and in each of the contact holes 41 and 42 by means of the sputtering process, and an Al plug/wire 44 is then formed in each of the contact holes 41 and 42 and in each of the wiring grooves 39 and 40 by means of a burying process using the sputtering and reflow of Al and a flattering process using the CMP process. A W plug may be used instead of the Al plug. A Cu material may also be used.

Figure 4:
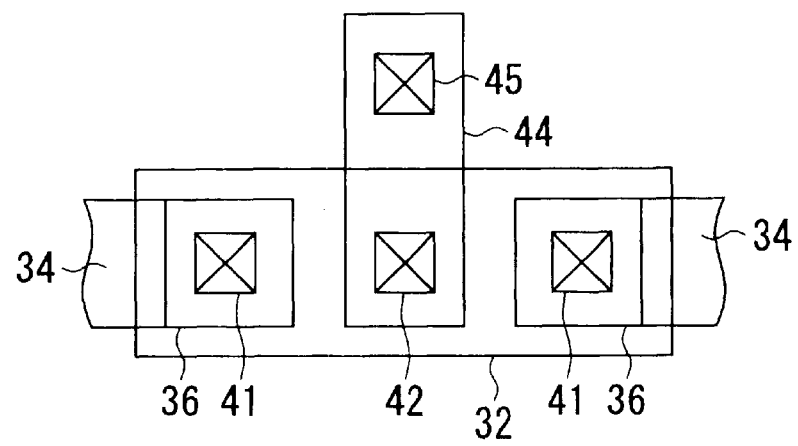
FIG. 4 is a pattern top view of the series connected TC unit type ferroelectric RAM shown in FIG. 3F.

FIG. 4 is a pattern top view of the series connected TC unit type ferroelectric RAM shown in FIG. 3F. As shown in this figure, the Al plug/wire 44 connected to the lower electrode 32 extends in a direction crossing the arranging direction of the pair of laminated structures and is connected to a diffusion area of a transistor (not shown) formed on the silicon substrate.

According to the method of the first embodiment, the upper electrode 34 and the ferroelectric film 33 are simultaneously etched, so when the contact holes 41 for the upper electrode 34 are opened, the ferroelectric film 33, which has a lower etching rate than the interlayer insulating film 38, is not required to be etched. This prevents a major part of the upper electrode from being removed as in the prior art, thus avoiding degradation of the capacitor characteristics and capacitor leakage.

Furthermore, when the contact hole 42 for the lower electrode 32 is opened, the ferroelectric film 33 is not required to be etched, thereby preventing damage to the ferroelectric film and thus degradation of polarization as occurring in the prior art.

Further, the first embodiment can reduce the cell size of the capacitor. The reason will be described below with reference to FIG. 5.

Figure 2A:
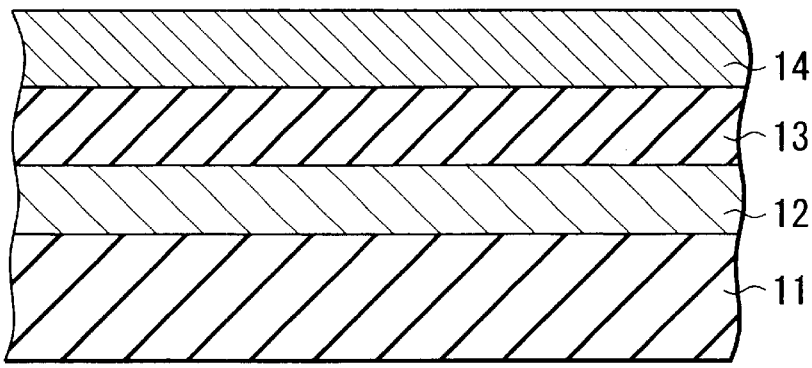
FIGS. 2A to 2E are sectional views showing a conventional method for manufacturing a ferroelectric capacitor of the series connected TC unit type ferroelectric RAM, in the order of steps.
Figure 2B:
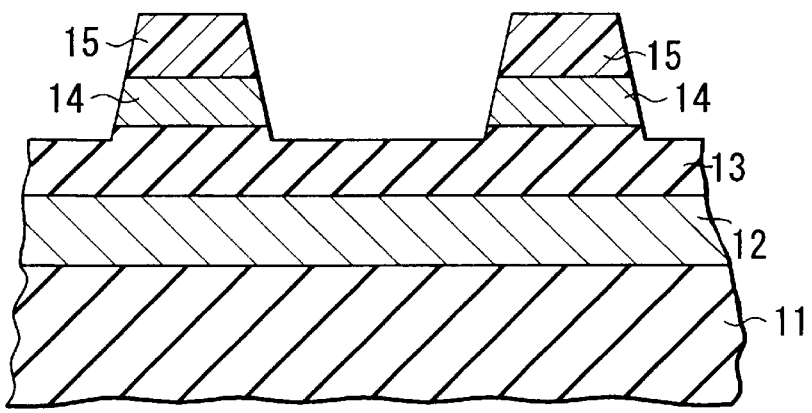
Figure 2C:
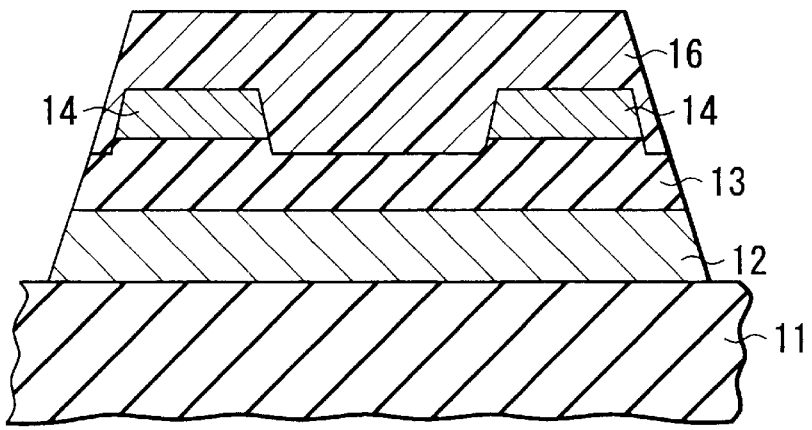
Figure 2D:
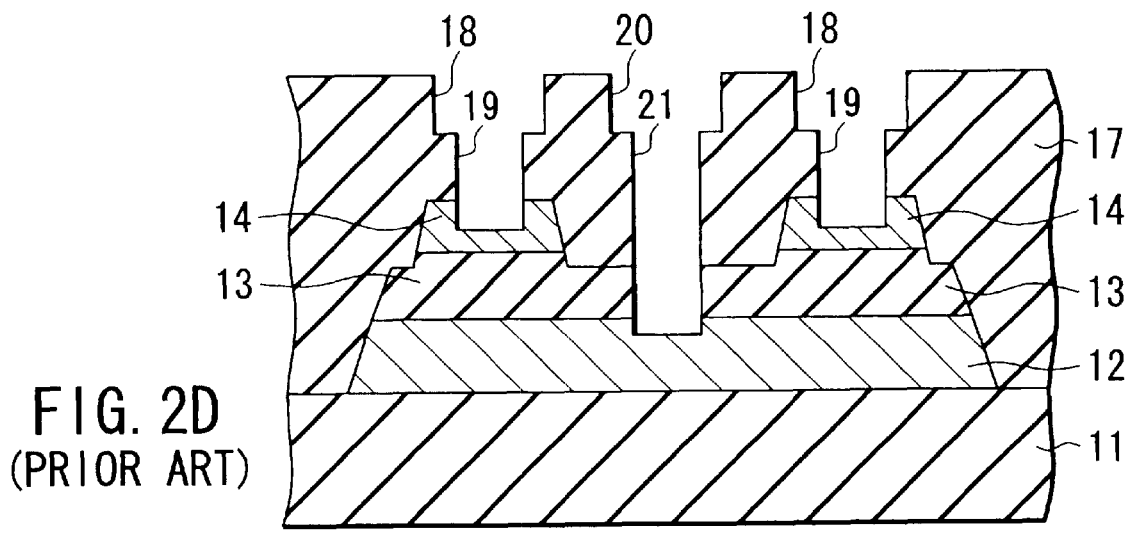
Figure 2E:
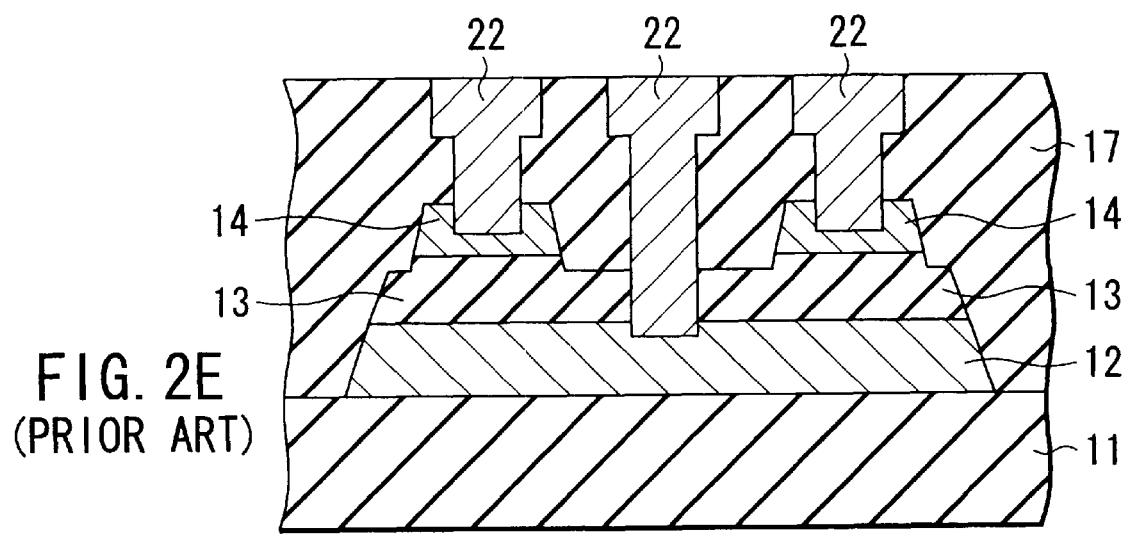
Figure 5:
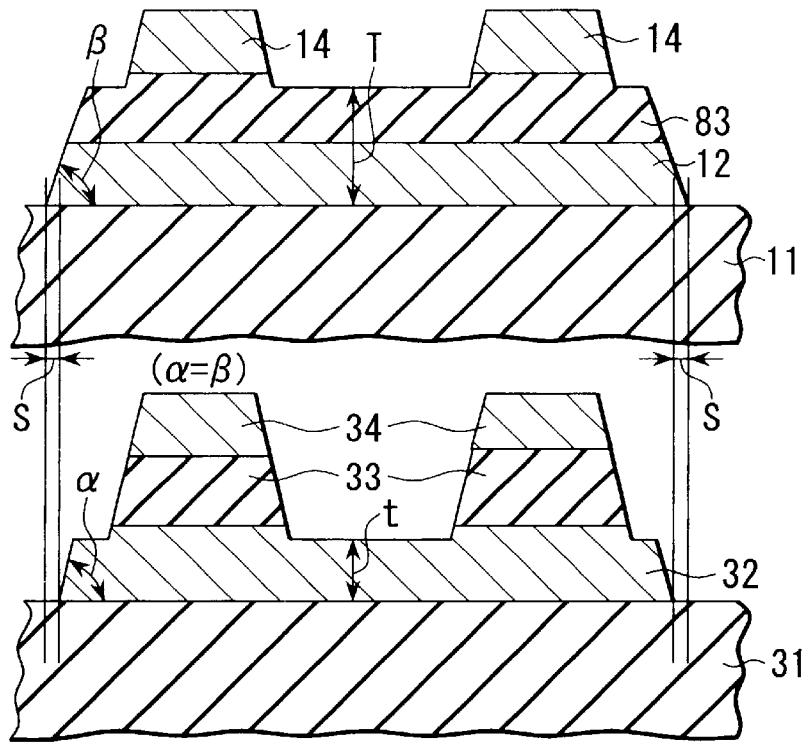
FIG. 5 is a sectional view of a sectional structure obtained after the step in FIG. 2B according to a conventional method and a sectional structure of a capacitor obtained after the step in FIG. 3C according to the first embodiment.

FIG. 5 shows a sectional structure (in the upper part of the figure) obtained after the step in FIG. 2B according to the conventional method and a sectional structure (in the lower part of the figure) of the capacitor obtained after the step in FIG. 3C according to the first embodiment.

In general, the electrodes (Pt, Ir, or the like) and ferroelectric substance (PZT, SBT, or the like) used for the ferroelectric capacitor cannot be easily etched to have a sharp profiling, and angles $\alpha$ and $\beta$ ($\alpha=\beta$) of corners of the capacitor at its bottom end tend to be smaller than 90°, as shown in FIG. 5.

In the method according to the first embodiment, the upper electrode 34 and the ferroelectric film 33 are simultaneously etched, and at this time, the lower electrode is partly etched. Then, the lower electrode 32 is finally etched, so that the cell size is determined by the processing size of the lower electrode 32. Furthermore, in this case, the area of a bottom portion of the lower electrode 32 increase compared to the actual mask size due to the taper. Accordingly, a mask conversion difference decreases consistently with the thickness t of the lower electrode 32.

In contrast, in the conventional method shown in the upper part of FIG. 5, the upper electrode 14 is etched before the ferroelectric film 13 and the lower electrode 12 are processed. Thus, a film having a large thickness T corresponding to the sum of the thicknesses of the lower electrode 12 and of the ferroelectric film 13 must be simultaneously processed. Thus, the area of the bottom portion of the lower electrode 12 increases beyond the actual mask size.

Accordingly, the size of the etched lower electrode is smaller with the method of the first embodiment than with the conventional method by the dimension S in the figure on one side. As a result, the cell size of the capacitor can be reduced compared to the prior art.

The sides of the mask 37 may be tapered as shown in FIG. 3D such that its lower surface is larger than its upper surface. If so, a fence of the same material as the lower electrode 32 will hardly form at the interface between the lower electrode 32 and the mask 37 in the process of etching the lower electrode 32.

Next, a method for manufacturing a series connected TC unit type ferroelectric RAM according to a first variation of the first embodiment of the present invention will be explained. In the above description, a resist mask 35 is formed as an etching mask for etching the upper electrode 34 and the ferroelectric film 33 at the step in FIG. 3B, and the resist mask 37 is formed as an etching mask for etching the upper electrode 34 as shown in FIG. 3D.

In contrast, in the manufacturing method according to the first variation, a hard mask is formed instead of the resist mask.

Figure 6:
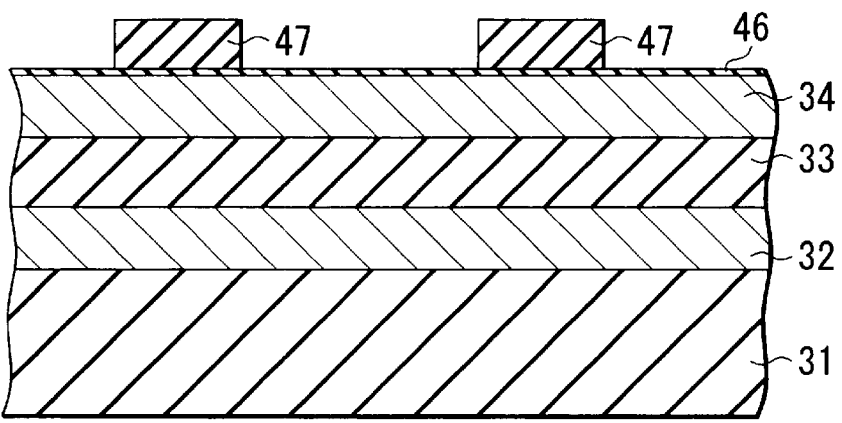
FIG. 6 is a sectional view showing a step of a method for manufacturing a series connected TC unit type ferroelectric RAM according to a first variation of the first embodiment of the present invention.

The step shown in FIG. 6 corresponds to FIG. 3B. An alumina film 46 made of, for example, $Al_2O_3$, amorphous alumina or $Al_xO_y$ is formed on the upper electrode 34, and a silicon oxide film is then deposited on the entire top surface and patterned by means of the PEP to form a hard mask 47 composed of the silicon oxide film. Subsequently, the upper electrode 34 and the ferroelectric film 33 are etched using the hard mask 47.

Figure 7:
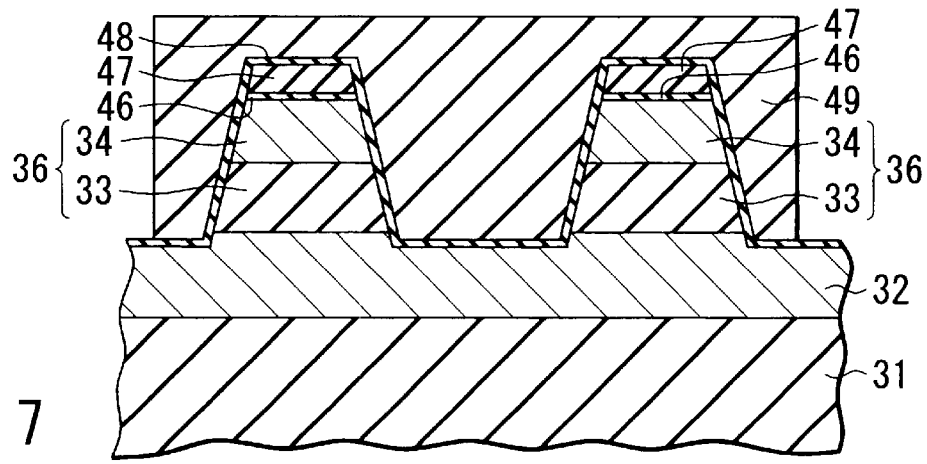
FIG. 7 is a sectional view showing a step of the method for manufacturing a series connected TC unit type ferroelectric RAM according to the first variation of the first embodiment of the present invention, the step being different from that in FIG. 6.

The step shown in FIG. 7 corresponds to FIG. 3D. The upper electrode 34 and the ferroelectric film 33 are etched and an alumina film 48 is then formed on the entire top surface. Then, a silicon oxide film is deposited on the entire top surface and patterned by means the PEP to form a hard mask 49 composed of the silicon oxide film. Subsequently, the lower electrode 32 is etched using the hard mask 49.

As described previously, hard masks composing $W_xN_y$, $Ti_xN_y$, $SiO_2$, an alumina, or a combination thereof may be formed instead of the masks 47 and 49 comprising silicon oxide films.

Next, a second embodiment of the present invention will be described.

It has been reported that an IrOx/TiAlN-based electrode is relatively conveniently used as the lower electrode of the ferroelectric capacitor in order to restrain oxidation of a contact plug in a series connected TC unit type ferroelectric RAM of a COP structure. In this case, however, the total thickness of the lower electrode is about 150 nm or more and is combined with the thickness of the ferroelectric film, thus further increasing the mask conversion difference.

Thus, when the series connected TC unit type ferroelectric RAM of the COP structure is manufactured in the same manner as in the first embodiment, the mask conversion difference can be reduced to lessen the cell size.

Figure 8:
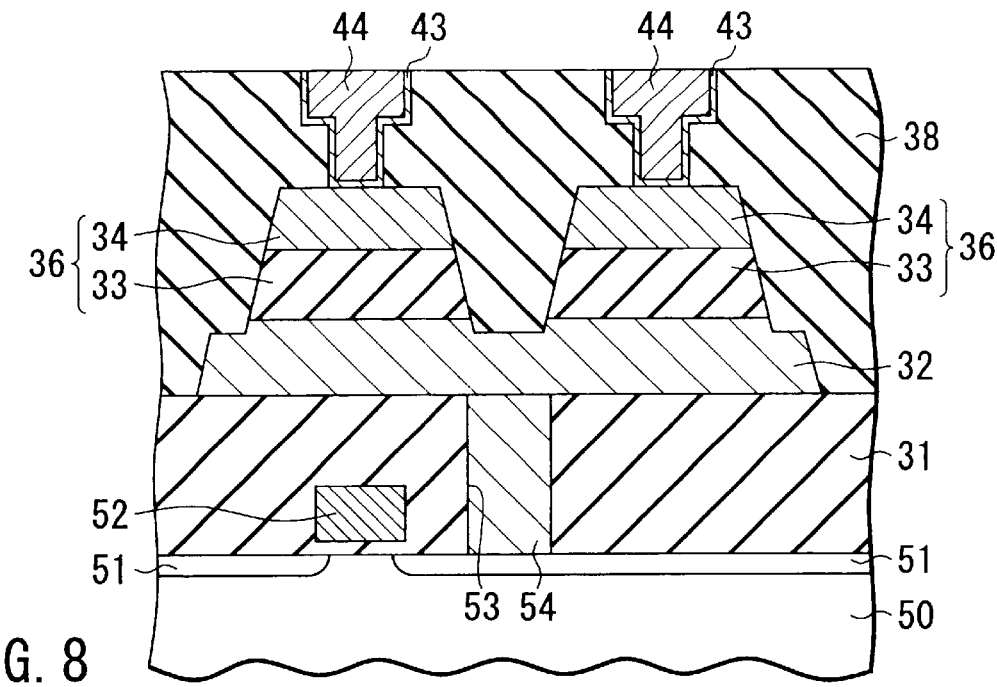
FIG. 8 is a view showing the sectional structure of a series connected TC unit type ferroelectric RAM of a COP structure according to a second embodiment of the present invention, which has been manufactured in the same manner as in the first embodiment.

FIG. 8 shows the sectional structure of a series connected TC unit type ferroelectric RAM of the COP structure according to the second embodiment of the present invention, which has been manufactured in the same manner as in the first embodiment.

In FIG. 8, reference numeral 50 denotes a silicon semiconductor substrate having a pair of diffusion regions 51 and 51 formed on a surface area thereof and constituting a source and a drain regions of a switching transistor. Further, a gate electrode 52 for this switching transistor is formed in the interlayer insulating film 31.

Moreover, the interlayer insulating film 31 has a contact hole 53 opened so as to expose the surface of one of the pair of diffusion regions 51 and 51, and a plug 54 composed of, for example, polysilicon is formed so as to fill the contact hole 53. Before forming the plug 54, a barrier metal, for example, a TiN film may be formed. Then, the pair of laminated structures 36 composed of the lower electrode 32, the ferroelectric film 33, and the upper electrode 34, the interlayer insulating film 38, and the Al plugs/wires 44 connected to the pair of the upper electrodes 34 are formed on the plug 54 as in the same manner as described in the first embodiment. The lower electrode 32, however, is connected to the diffusion region 51 of the transistor via the plug 54, so that in this case, the opening of the contact hole 42 for the lower electrode 32 and the formation of the Al plug/wire 44 in the contact hole 42 can be omitted.

FIGS. 9A to 9F show a method for manufacturing a series connected TC unit type ferroelectric RAM according to a third embodiment of the present invention, in the order of steps.

Figure 9A:
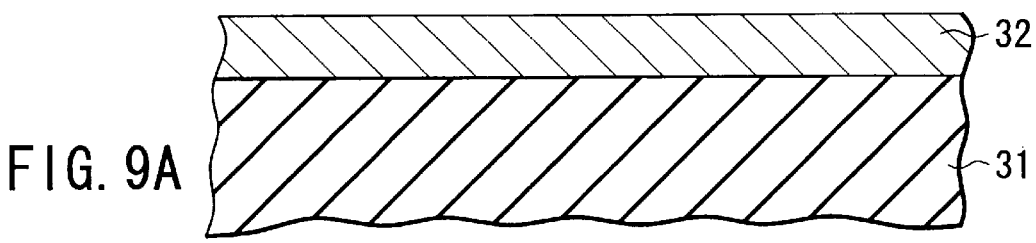
FIGS. 9A to 9F are sectional views showing a method for manufacturing a series connected TC unit type ferroelectric RAM according to a third embodiment of the present invention, in the order of steps.

First, as shown in FIG. 9A, the lower electrode 32 is deposited and formed, by means of the sputtering process or the like, on the interlayer insulating film ($SiO_2$) 31 on a silicon semiconductor substrate (not shown) having elements such as switching transistors formed thereon.

Figure 9B:
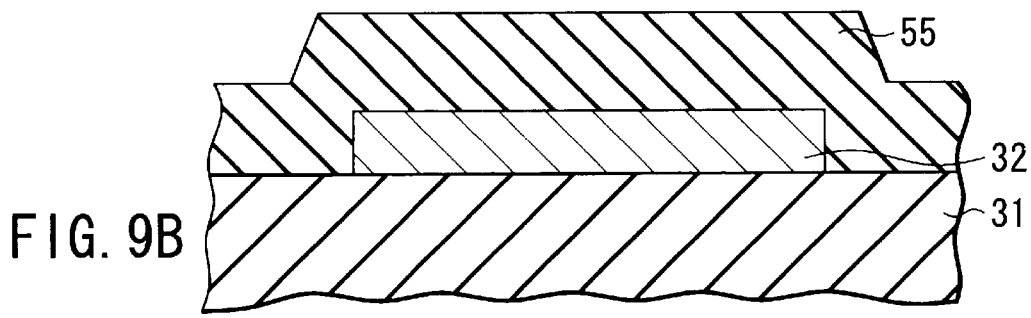

Then, an etching mask having a predetermined pattern shape is formed on the lower electrode 32, and the latter is etched by means of a dry etching process, for example, the RIE process using this mask, to leave only a predetermined portion of the lower electrode 32 on the interlayer insulating film 31. Subsequently, an interlayer insulating film 55 is deposited on the entire top surface by means of, for example, the CVD process, as shown in FIG. 9B.

Figure 9C:
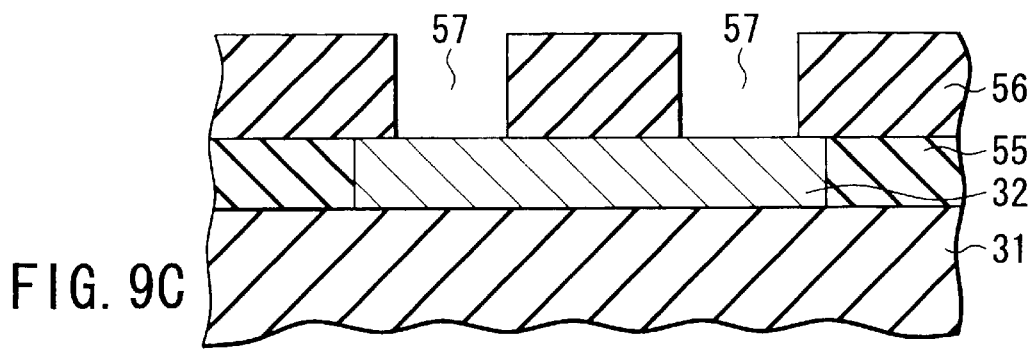

Then, as shown in FIG. 9C, a surface of the lower electrode 32 is exposed by means of a flattening process based on, for example, the CMP process, and an interlayer insulating film 56 is deposited on the entire top surface by means of, for example, the CVD process. Furthermore, two spaced holes (openings) 57 and 57 are opened in the interlayer insulating film 56 so as to expose the surface of the lower electrode 32. The holes 57 and 57 can be formed by means of the RIE process using an etching mask formed by a series of processes including coating of a resist film, transferring of a pattern to the resist film, and development.

Figure 9D:
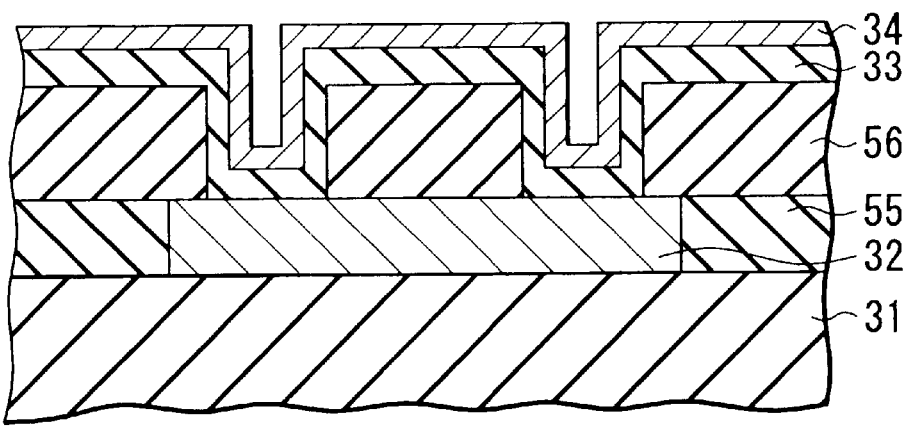

Subsequently, as shown in FIG. 9D, the ferroelectric film 33 and the upper electrode 34 are sequentially deposited, by means of the CVD process or the sputtering process, on the entire top surface including interiors of the two holes 57 and 57. The ferroelectric film 33 composes, for example, PZT but may compose STB or BTO of a composite provskite structure. Furthermore, like the lower electrode 32, the upper electrode 34 composes, for example, one Pt film layer but may compose one film layer containing at least one metal selected from $IrO_x$, Ru, Ti, Al, Sr, Re, Mg, La, and Ca or a plurality of film layers containing different metals.

In this embodiment, when the ferroelectric film 33 and the upper electrode 34 are deposited, the two holes 57 and 57 are prevented from being fully buried. To achieve this, these layers are deposited in such a manner that the total thickness of the ferroelectric film 33 and the upper electrode 34 is smaller than the opening diameter of each of the holes 57. The holes 57 may have a large diameter.

Figure 9E:
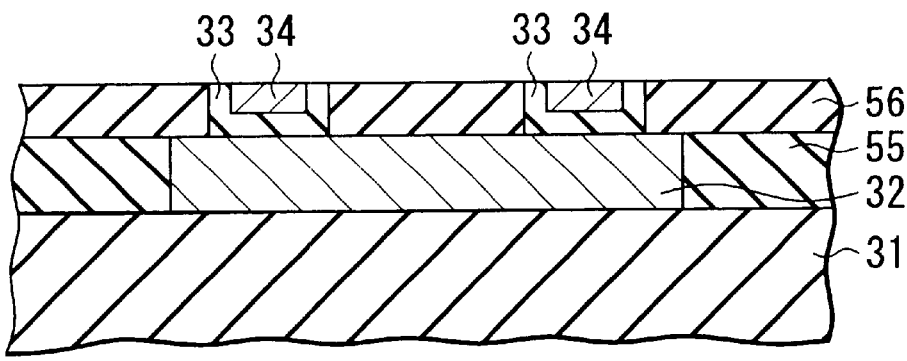

Next, as shown in FIG. 9E, the upper electrode 34, the ferroelectric film 34, and the interlayer insulating film 55 are partly removed by means of a flattening process based on, for example, the CMP process. In this case, the top surface of the upper electrode 34 is polished until it becomes flat. Thus, the ferroelectric film 33 has a recess portion.

Figure 9F:
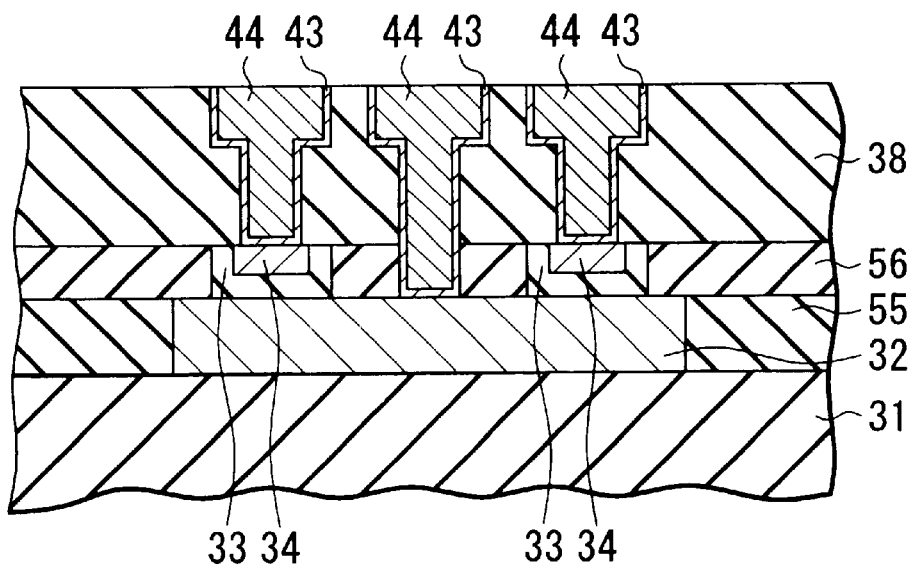

Then, as shown in FIG. 9F, the interlayer insulating film 38 is deposited on the entire top surface by means of, for example, the CVD process and is then flattened. Subsequently, wiring grooves are formed on the pair of upper electrodes 34 and on the lower electrode 32 by means of a dry etching process using a mask having a predetermined pattern, contact holes leading to the upper electrodes 34 are formed in the corresponding wiring grooves, and a contact hole leading to the lower electrode 32 is formed in the corresponding wiring groove. Further, the TiN film 43 is deposited, as a barrier metal, in each of the wiring grooves and in each of the contact holes by means of the sputtering process, and the Al plug/wire 44 is then formed in each of the contact holes and in each of the wiring grooves by means of a burying process using the sputtering and reflow of Al and a flattering process using the CMP process. A W plug may be used instead of the Al plug. A Cu material may also be used.

In this embodiment, the etching selection ratio between the interlayer insulating film 38 and 56 composing SiO$_2$ and the upper electrode 34 composing Pt also has a large value of 10 or more, so that the etching over amount of the upper and lower electrodes 34 and 32 is small even when the deep contact hole 42 leading to the lower electrode 32 is formed.

Further, when the contact holes for the upper and lower electrodes 34 and 32 are opened, the ferroelectric film 33, which has a lower etching rate than the interlayer insulating film, is not required to be etched. This avoids disadvantages such as degradation of the capacitor characteristics and capacitor leakage.

FIGS. 10A to 10D show several steps of manufacturing a series connected TC unit type ferroelecric RAM according to a first variation of the third embodiment of the present invention.

Figure 10A:
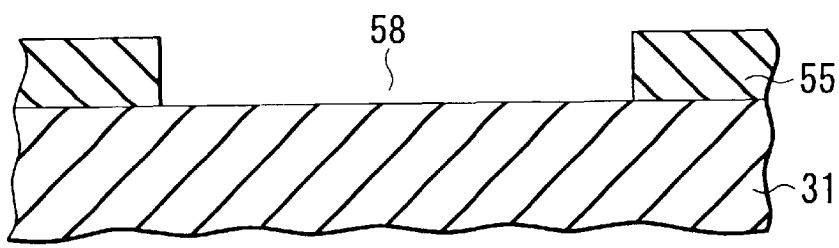
FIGS. 10A to 10D are sectional views showing several steps of manufacturing a series connected TC unit type ferroelectric RAM according to a first variation of the third embodiment of the present invention.

In the method of the third embodiment, as a method for leaving a part of the lower electrode 32 on the interlayer insulating film, the lower electride 32 is deposited on the entire top surface and etched using the mask. In the method according to this variation, however, the interlayre insulating film 31 is deposited on the entire top surface and the interlayer insulating film 55 having the holes 58 of the predetermined shape is formed, as shown in FIG. 10A. This interlayer insulating film 55 is obtained by depositing the interlayer insulating film 55 on the entire top surface, forming the etching mask thereon which has the predetermined shape, and using this mask to etch the interlayer insulating film 55 by means of, for example, the RIE process to thereby open the holes 58.

Figure 10B:
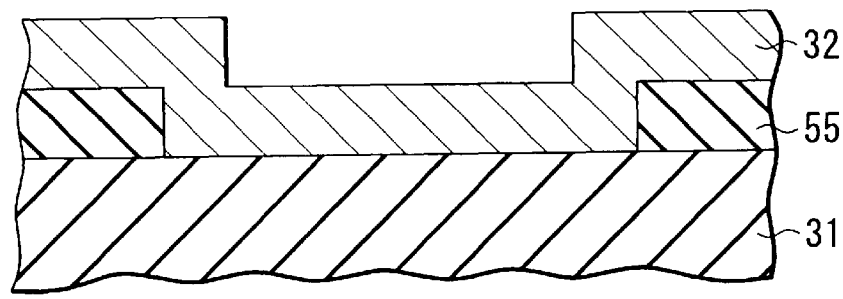

Then, as shown in FIG. 10B, the lower substrate 32 is deposited and formed on the entire top surface by means of the sputtering process.

Figure 10C:
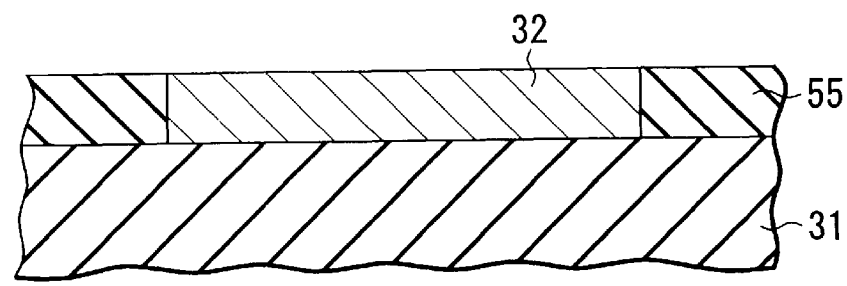

Subsequently, as shown in FIG. 10C, the entire top surface is polished by means of a flattening process, for example, the CMP process until the surface of the interlayer insulating film 55 is exposed.

Figure 10D:
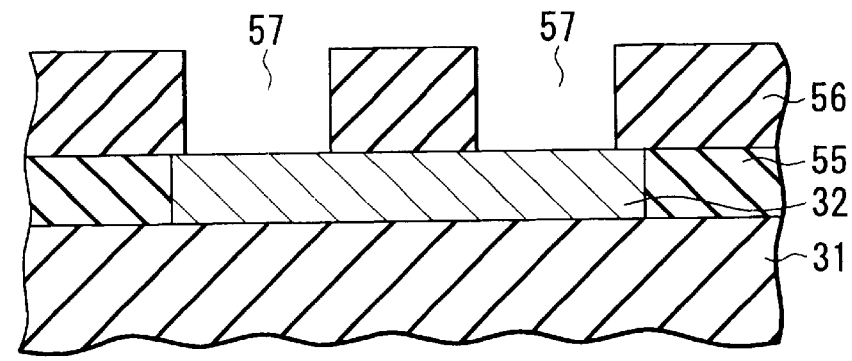

Then, as shown in FIG. 10D, the interlayer insulating film 56 is deposited on the entire top surface by means of, for example, the CVD process. Furthermore, the two spaced holes 57 and 57 are opened in the interlayer insulating film 56 so as to expose the surface of the lower electrode 32. The subsequent steps are similar to those of the third embodiment, and description thereof is omitted.

In the method of this variation, the etching selection ratio between the interlayer insulating film 38 and 56 composing SiO$_2$ and the upper electrode 34 composing Pt also has a large value of 10 or more, so that the etching over amount of the upper and lower electrodes 34 and 32 is small even when the deep contact hole leading to the lower electrode 32 is formed.

Further, when the contact holes for the upper and lower electrodes 34 and 32 are opened, the ferroelectric film 33, which has a lower etching rate than the interlayer insulating film, is not required to be etched. This avoids disadvantages such as degradation of the capacitor characteristics and capacitor leakage.

Figure 11:
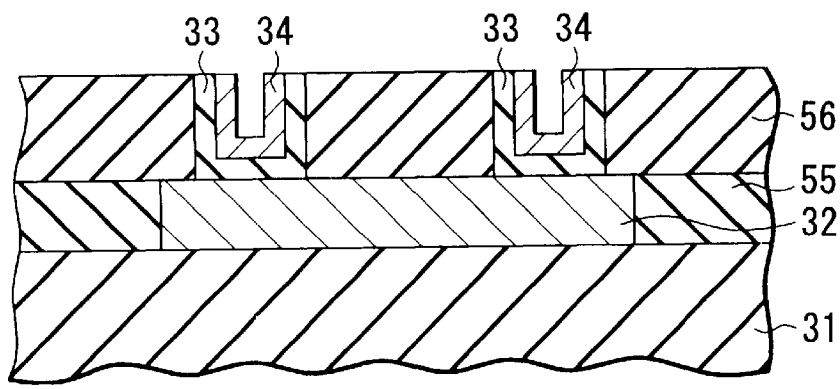
FIG. 11 is a sectional view showing a step of manufacturing a series connected TC unit type ferroelectric RAM according to a second variation of the third embodiment of the present invention.

FIG. 11 shows a step of manufacturing a series connected TC unit type ferroelecric RAM according to a second variation of the third embodiment of the present invention. In the above method of the third embodiment, the ferroelectric film 33 and the upper electrode 34 are deposited on the entire top surface including the interiors of the pair of holes 57 and 57 formed in the interlayer insulating film 56, and when the upper electrode 34, the ferroelectric film 33, and the interlayer insulating film 56 are flattened to remove a part of these layers, these layers are polished until the top surface of the upper electrode 34 is exposed.

In contrast, in this second variation, these layers are polished by means of the CMP process in such a manner that the upper electrode 34 remains to have a recess cross section similarly to the ferroelectric film 33.

Figure 12A:
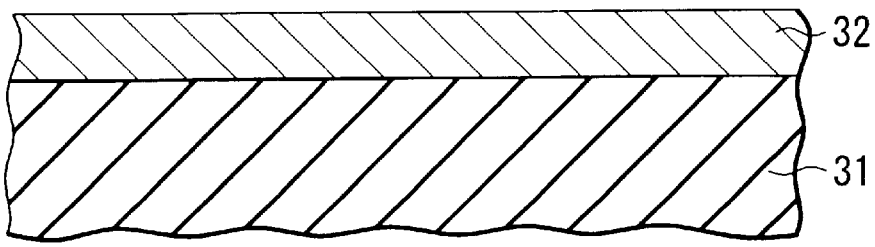
FIGS. 12A to 12C are sectional views showing several steps of manufacturing a series connected TC unit type ferroelectric RAM according to a third variation of the third embodiment of the present invention.
Figure 12B:
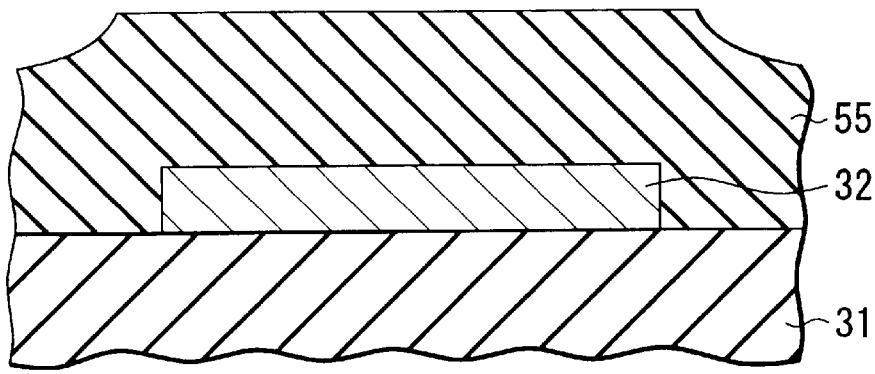
Figure 12C:
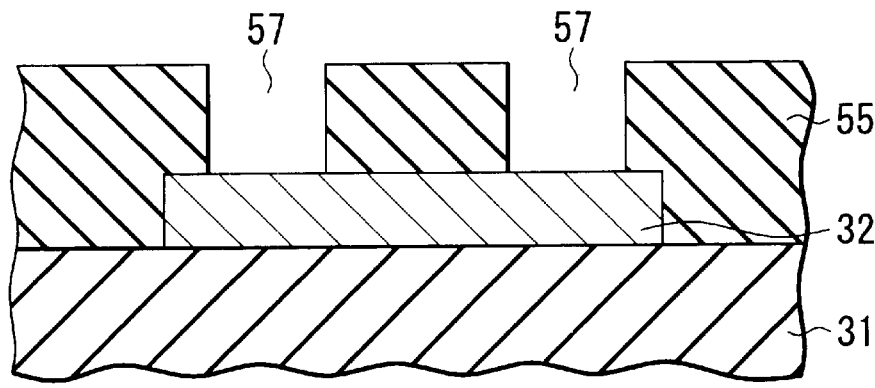

FIGS. 12A to 12C show several steps of manufacturing a series connected TC unit type ferroelecric RAM according to a third variation of the third embodiment of the present invention.

In the method of the third embodiment, as a method for leaving a part of the lower electrode 32 on the interlayer insulating film 31, the lower electrode 32 is deposited on the entire top surface and etched using the mask. In the method according to this variation, however, the interlayer insulating film 31 is deposited on the entire top surface as shown in FIG. 12A and the lower electrode 32 is then deposited and formed on the entire top surface by means of the sputtering process.

Then, an etching mask having a predetermined pattern shape is formed on the lower electrode 32, and the latter is then etched by means of a dry etching process, for example, the RIE process using this mask, to leave a predetermined portion of the lower electrode 32 on the interlayer insulating film 31. Subsequently, as shown in FIG. 12B, the interlayer insulating film 55 that is thicker than that in FIG. 9B is deposited on the entire top surface.

Then, the interlayer insulating film 55 is flattened by means of the etchback process or the flattening etching process, and an etching mask having a predetermined pattern is formed thereon and used to open the two spaced holes 57 and 57 in the interlayer insulating film 55 so as to expose the surface of the lower electrode 32. The subsequent steps are similar to those of the third embodiment, and description thereof is omitted.

Figure 13A:
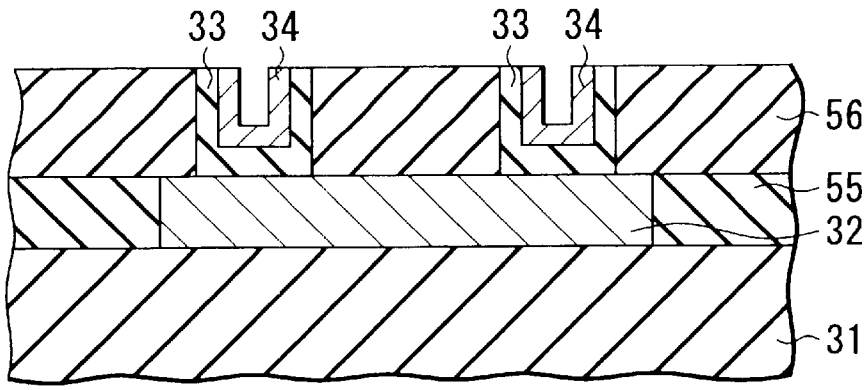
FIGS. 13A and 13B are sectional views showing several steps of manufacturing a series connected TC unit type ferroelectric RAM according to a fourth variation of the third embodiment of the present invention.
Figure 13B:
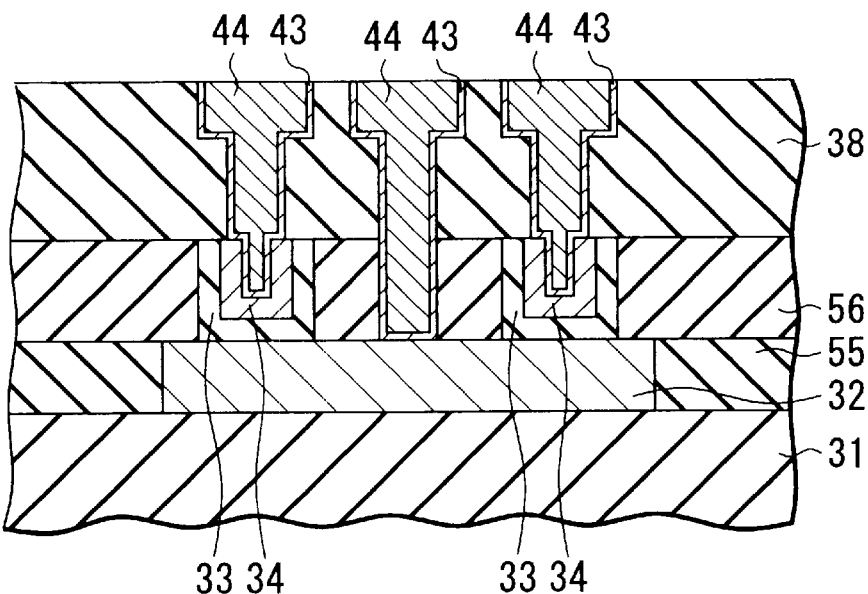

FIGS. 13A and 13B show several steps of manufacturing a series connected TC unit type ferroelecric RAM according to a fourth variation of the third embodiment of the present invention.

In the method of the third embodiment, at the step in FIG. 9D, the ferroelectric film 33 and the upper electrode 34 are deposited on the entire top surface including the interiors of the two holes 57 and 57, and at the step in FIG. 9E, the entire top surface is flattened and polished until the top surface of the upper electrode 34 becomes flat, to remove a part of the ferroelectric film 33 and interlayer insulating film 56.

In contrast, in the method according to this fourth variation, when the upper electrode 34, the ferroelectric film 33, and the interlayer insulating film 56 are polished to remove a part of them, these layers are polished in such a manner that the upper electrode 34 remains to have a recess portion.

Subsequently, similarly to the step in FIG. 9F, as shown in FIG. 13B, the interlayer insulating film 38 is deposited on the entire top surface by means of, for example, the CVD process and is then flattened. Subsequently, wiring grooves are formed on the pair of upper electrodes 34 and on the lower electrode 32 by means of a dry etching process using a mask having a predetermined pattern, contact holes leading to the upper electrodes 34 are formed in the corresponding wiring grooves, and a contact hole leading to the lower electrode 32 is formed in the corresponding wiring groove. Further, the TiN film 43 is deposited, as a barrier metal, in each of the wiring grooves and in each of the contact holes by means of the sputtering process, and the Al plug/wire 44 is then formed in each of the contact holes and in each of the wiring grooves by means of a burying process using the sputtering and reflow of Al and a flattering process using the CMP process. A W plug may be used instead of the Al plug. A Cu material may also be used.

Figure 14A:
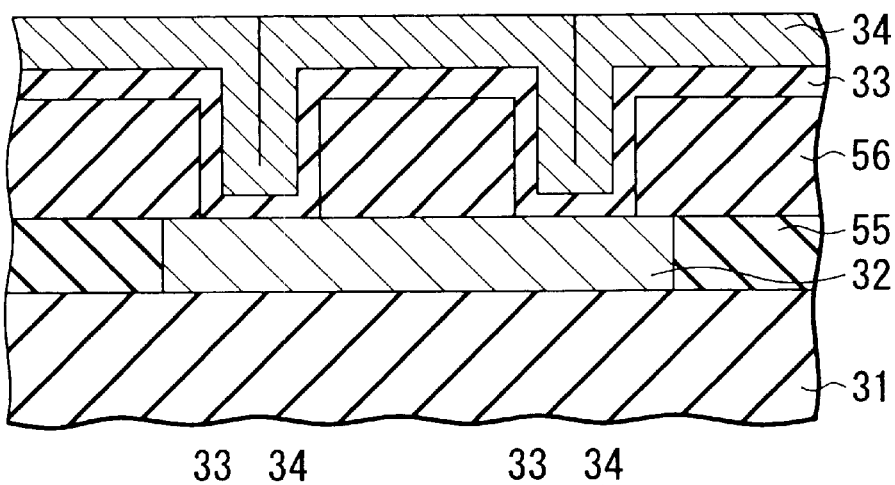
FIGS. 14A to 14C are sectional views showing several steps of manufacturing a series connected TC unit type ferroelectric RAM according to a fifth variation of the third embodiment of the present invention.
Figure 14B:
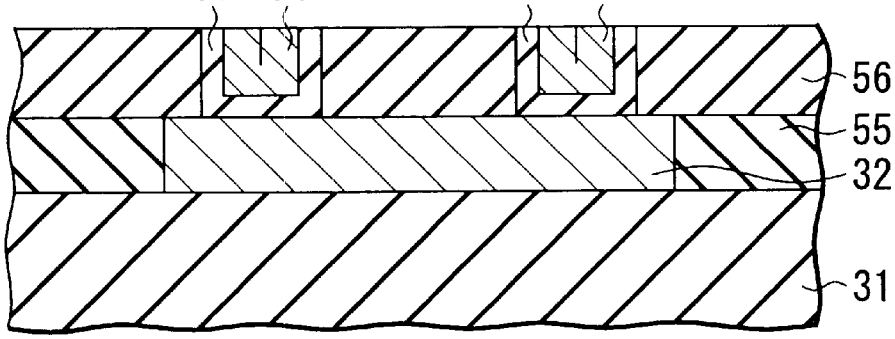
Figure 14C:
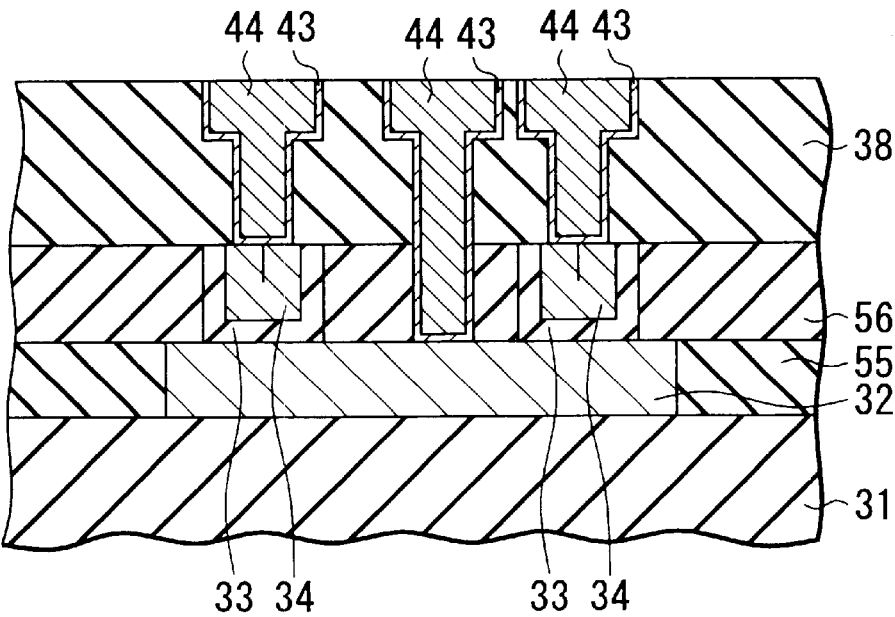

FIGS. 14A to 14C show several steps of manufacturing a series connected TC unit type ferroelectric RAM according to a fifth variation of the third embodiment of the present invention. In the method of the third embodiment, at the step in FIG. 9A, when the ferroelectric film 33 and the upper electrode 34 are deposited on the entire top surface including the interiors of the two holes 57 and 57, the latter are prevented from being fully buried.

On the contrary, in the method of this fifth variation, the ferroelectric film 33 and the upper electrode 34 are deposited so as to completely fill the two holes 57 and 57, as shown in FIG. 14A. To obtain such a cross section, the ferroelectric film 33 and the upper electrode 34 are deposited in such a manner that their total thickness is smaller than the opening diameter of each of the holes 57 or the latter have a large opening diameter.

Subsequently, the entire top surface is flattened, for example, by means of the CMP process to remove a part of the upper electrode 34, the ferroelectric film 33, and the interlayer insulating film 56, as shown in FIG. 14B.

Then, as shown in FIG. 14C, the interlayer insulating film 38 is deposited on the entire top surface by means of, for example, the CVD process and is then flattened. Subsequently, wiring grooves are formed on the pair of upper electrodes 34 and on the lower electrode 32 by means of a dry etching process using a mask having a predetermined pattern, contact holes leading to the upper electrodes 34 are formed in the corresponding wiring grooves, and a contact hole leading to the lower electrode 32 is formed in the corresponding wiring groove. Further, the TiN film 43 is deposited, as a barrier metal, in each of the wiring grooves and in each of the contact holes by means of the sputtering process, and the Al plug/wire 44 is then formed in each of the contact holes and in each of the wiring grooves by means of a burying process using the sputtering and reflow of Al and a flattering process using the CMP process. A W plug may be used instead of the Al plug. A Cu material may also be used.

Figure 15:
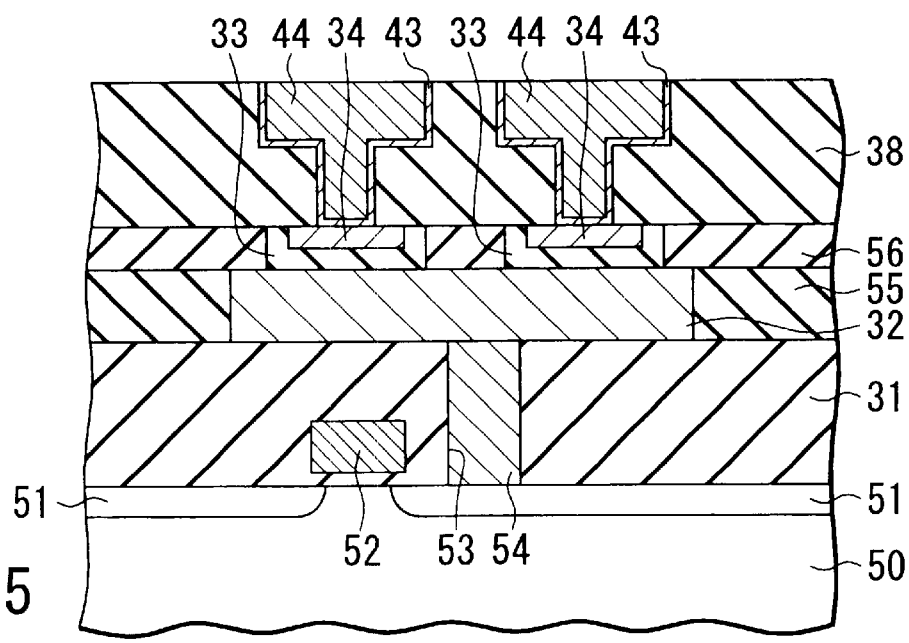
FIG. 15 is a sectional view showing the sectional structure of a series connected TC unit type ferroelectric RAM of the COP structure according to a fourth embodiment of the present invention, which has been manufactured in the same manner as in the third embodiment.

FIG. 15 shows the sectional structure of a series connected TC unit type ferroelecric RAM of the COP structure according to a fourth embodiment of the present invention, which has been manufactured in the same manner as in the third embodiment.

In FIG. 15, reference numeral 50 denotes a semiconductor substrate having a pair of diffusion regions 51 formed in a surface area thereof and constituting a source and a drain regions of a switching transistor. A gate electrode 52 for this switching transistor is formed in the interlayer insulating film 31. Further, the interlayer insulating film 31 has a contact hole 53 opened therein so as to expose a surface of one of the pair of diffusion regions 51, and a contact plug, for example, a polysilicon plug 54 is formed so as to fill the contact hole 53. Before forming the plug 54, a barrier metal, for example, a TiN film is formed. Then, the lower electrode 32, the upper electrode 34, the ferroelectric film 33, the interlayer insulating film 38, the Al plugs/wires 44 connected to the upper electrode 34, and others are formed on the plug 54 in the same manner as described in the third embodiment. The lower electrode 32, however, is connected to the diffusion region 51 of the transistor via the W plug 54, so that in this case, the opening of the contact hole 42 for the lower electrode 32 and the formation of the Al plug/wire 44 in the contact hole 42 can be omitted.

If the series connected TC unit type ferroelecric RAM of the COP structure is manufactured in the same manner as in the third embodiment, the mask conversion difference can be reduced for the same reason as described previously, thereby reducing the cell size.

FIGS. 16A to 16G show a method for manufacturing a series connected TC unit type ferroelecric RAM according to a fifth embodiment of the present invention, in the order of steps.

Figure 16A:
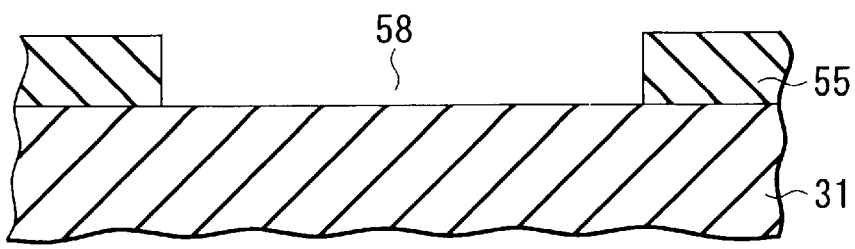
FIGS. 16A to 16G are sectional views showing a method for manufacturing a series connected TC unit type ferroelectric RAM according to a fifth embodiment of the present invention, in the order of steps.

First, as shown in FIG. 16A, the interlayer insulating film 55 is deposited, by means of, for example, the CVD process, all over the interlayer insulating film ($SiO_2$) 31 on a silicon semiconductor substrate (not shown) having elements such as switching transistors formed thereon, and a hole (opening) 58 is formed in the interlayer insulating film 55. The hole 58 is opened by forming an etching mask of a predetermined pattern shape on the interlayer insulating film 55 and using this mask to etch the interlayer insulating film 55 by means of, for example, the RIE method.

Figure 16B:
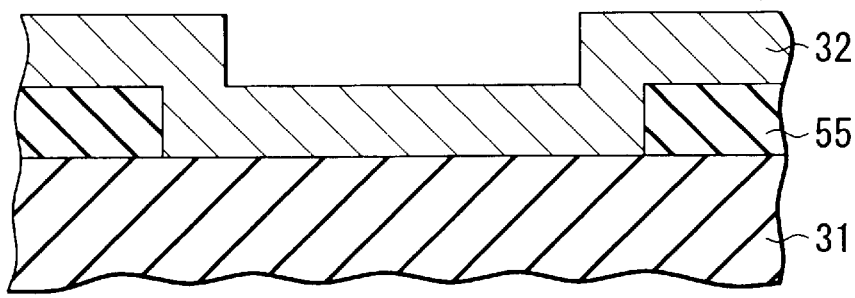

Then, as shown in FIG. 16B, the first lower electrode 32 is deposited and formed on the entire top surface by means of the sputtering method. The first upper electrode 32 composes, for example, one Pt film layer but may compose one film layer containing at least one metal selected from $IrO_x$, Ru, Ti, Al, Sr, Re, Mg, La, and Ca or a plurality of film layers containing different metals.

Figure 16C:
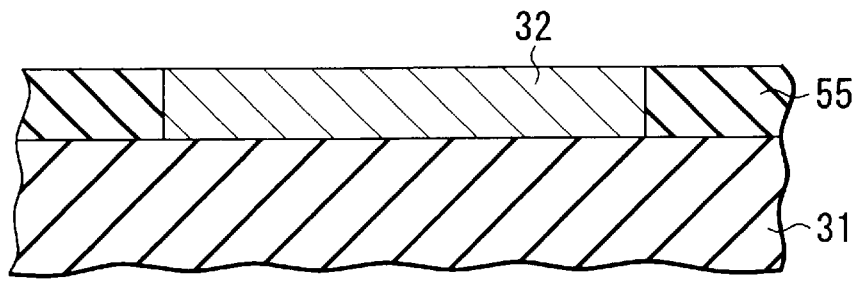

Subsequently, as shown in FIG. 16C, the entire top surface is polished by means of a flattening process, for example, the CMP process until the surface of the interlayer insulating film 55 is exposed.

Figure 16D:
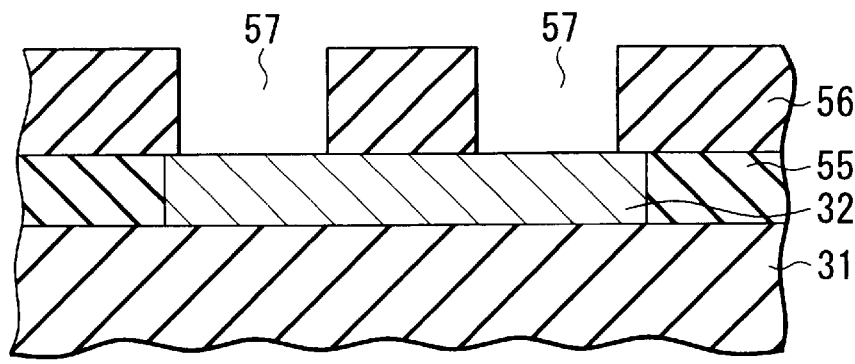

Then, as shown in FIG. 16D, the interlayer insulating film 56 is deposited on the entire top surface by means of the CVD process, and the two spaced holes 57 and 57 are opened in the interlayer insulating film 56 so as to expose the surface of the first lower electrode 32.

Figure 16E:
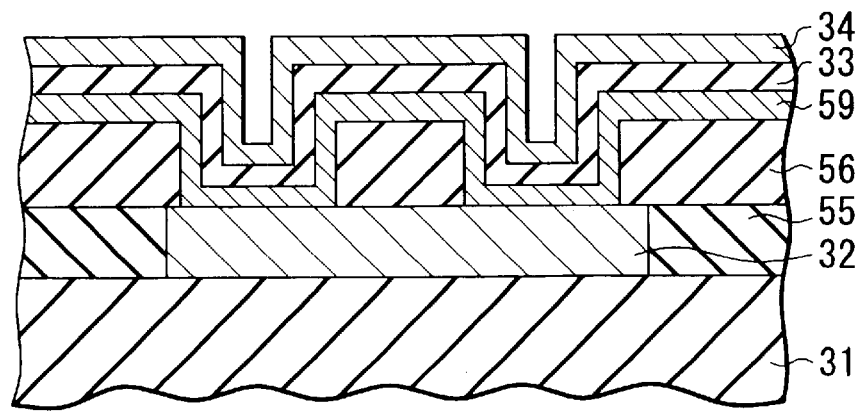

Subsequently, as shown in FIG. 16E, a second lower electrode 59, the ferroelectric film 33, and the upper electrode 34 are sequentially deposited, by means of the CVD process or the sputtering process, on the entire top surface including interiors of the two holes 57 and 57. Like the first lower eletrode 32, the second lower electrode 59 composes, for example, one Pt film layer but may compose one film layer containing at least one metal selected from $IrO_x$, Ru, Ti, Al, Sr, Re, Mg, La, and Ca or a plurality of film layers containing different metals. The ferroelectric film 33 may comprise, for example, PZT, or STB or BTO of a composite provskite structure. Furthermore, like the first and second lower electrodes 32 and 59, the upper electrode 34 composes, for example, one Pt film layer but may comprise one film layer containing at least one metal selected from $IrO_x$, Ru, Ti, Al, Sr, Re, Mg, La, and Ca or a plurality of film layers containing different metals.

In this embodiment, when the second lower electrode 59, the ferroelectric film 33, and the upper electrode 34 are deposited, the two holes 57 and 57 are prevented from being fully buried. To achieve this, these layers are deposited in such a manner that the total thickness of the second lower electrode 59, the ferroelectric film 33, and the upper electrode 34 is smaller than the opening diameter of each of the wiring grooves or that the holes 57 and 57 have a large opening diameter.

Figure 16F:
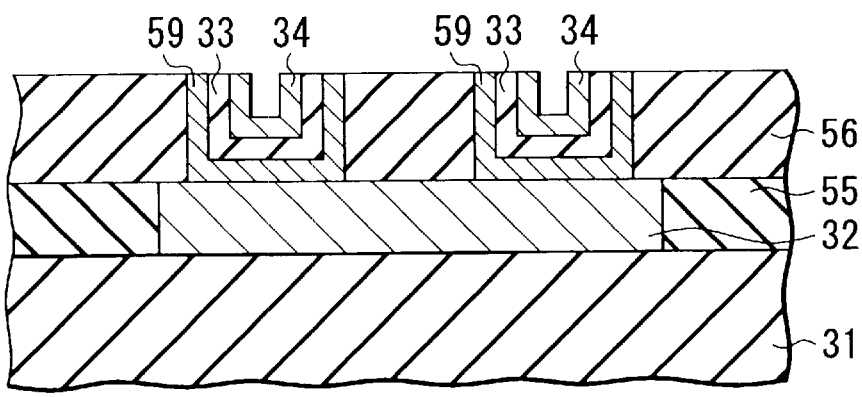

Then, as shown in FIG. 16F, the entire top surface is flattened, for example, by means of the CMP process to remove a part of the second lower electrode 59, the ferroelectric film 33, and the upper electrode 34. In this case, these layers are polished in such a manner that the upper electrode 34 remains to have a recess portion.

Figure 16G:
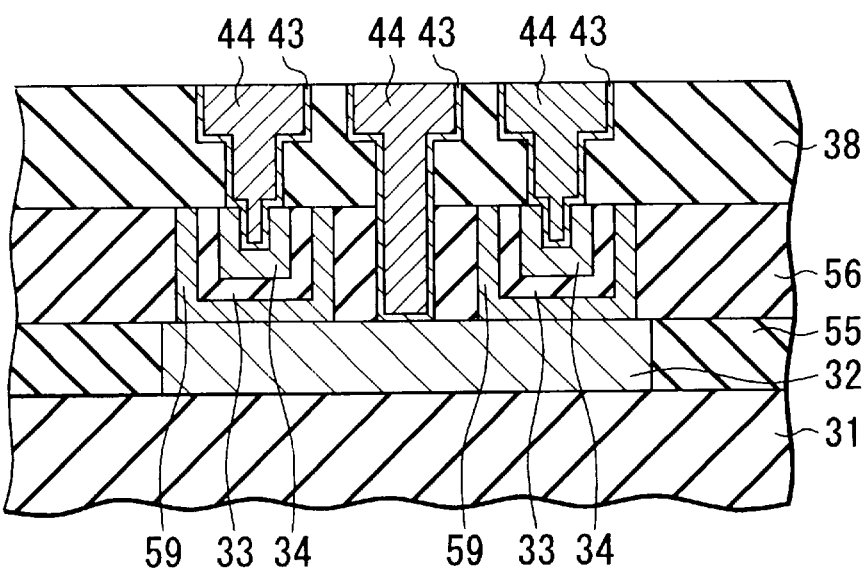

Subsequently, as shown in FIG. 16G, the interlayer insulating film 38 is deposited on the entire top surface by means of, for example, the CVD process and is then flattened. Subsequently, wiring grooves are formed on the pair of upper electrodes 34 and on the first lower electrode 32 by means of a dry etching process using a mask having a predetermined pattern, contact holes leading to the upper electrodes 34 are formed in the wiring grooves on the upper electrode 34, and a contact hole leading to the first lower electrode 32 is formed in the wiring groove on the first lower electrode 32. Further, the TiN film 43 is deposited, as a barrier metal, in each of the wiring grooves and in each of the contact holes by means of the sputtering process, and the Al plug/wire 44 is then formed in each of the contact holes and in each of the wiring grooves by means of a burying process using the sputtering and reflow of Al and a flattening process using the CMP process. A W plug may be used instead of the Al plug. A Cu material may also be used.

In this embdoiement, the etching selection ratio between the interlayer insulating film 38 and 56 composing $SiO_2$ and the upper electrode 34 composing Pt also has a large value of 10 or more, so that the etching over amount of the upper electrode 34 and first lower electrode 32 is small even when the deep contact hole 42 leading to the first lower electrode 32 is formed.

Further, when the contact holes for the upper electrode 34 and first lower electrodes 32 are opened, the ferroelectric film 33, which has a lower etching rate than the interlayer insulating films 38 and 56, is not required to be etched. This avoids disadvantages such as degradation of the capacitor characteristics and capacitor leakage.

The contact holes leading to the upper electrodes 34 may have so large a diameter that the contact holes expose a part of the ferroelectric film 33.

Figure 17A:
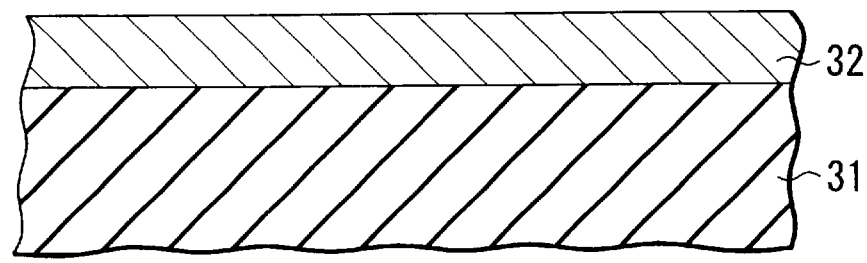
FIGS. 17A to 17C are sectional views showing several steps of manufacturing a series connected TC unit type ferroelectric RAM according to a first variation of the fifth embodiment of the present invention.
Figure 17B:
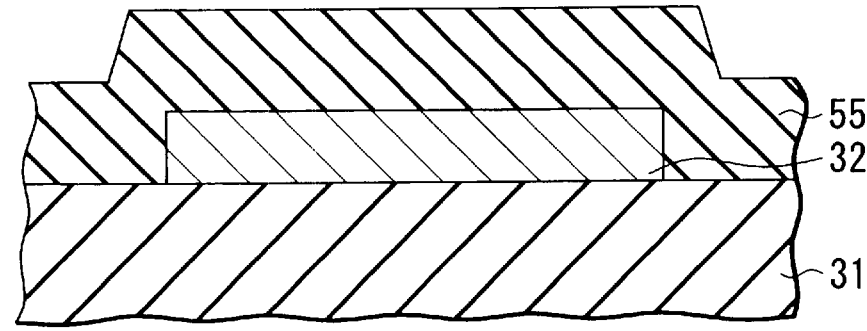
Figure 17C:
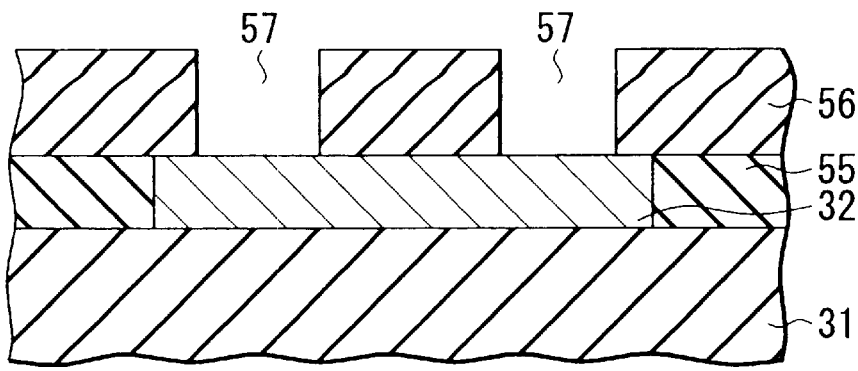

FIGS. 17A to 17C show several steps of manufacturing a series connected TC unit type ferroelecric RAM according to a first variation of the fifth embodiment of the present invention.

In the fifth embodiment, as a method for leaving a part of the lower electrode 32 on the interlayer insulating film 31, the first lower electrode 32 is deposited on the interlayer insulating film 55 having the hole 58 formed therein and is then flattened. In the method according to this variation, however, the first lower electrode 32 is deposited all over the top surface of the interlayer insulating film 31 by means of, for example, the sputtering process, as shown in FIG. 17A.

Then, an etching mask having a predetermined pattern shape is formed thereon and used to etch the first lower electrode 32 by means of, for example, the RIE process to leave a part of the first lower electrode 32 on the interlayer insulated process 31 as shown in FIG. 17B. Subsequently, the interlayer insulating film 55 is deposited on the entire top surface by means of, for example, the CVD process.

Subsequently, as shown in FIG. 17C, the entire top surface is polished by means of a flattening process, for example, the CMP process until the surface of the interlayer insulating film 55 is exposed. Further, the interlayer insulating film 56 is deposited on the entire top surface by means of the CVD process, and the two spaced holes 57 and 57 are opened in the interlayer insulating film 56 so as to expose the surface of the first lower electrode 32. The subsequent steps are similar to those of the method of the fifth embodiment and description thereof is omitted.

In this variation, the etching selection ratio between the interlayer insulating film 38 and 56 composing $SiO_2$ and the upper electrode 34 composing Pt also has a large value of 10 or more, so that the etching over amount of the upper electrode 34 and first lower electrode 32 is small even when the deep contact hole 42 leading to the first lower electrode 32 is formed.

Further, when the contact holes for the upper electrode 34 and first lower electrodes 32 are opened, the ferroelectric film 33, which has a lower etching rate than the interlayer insulating films, is not required to be etched. This avoids disadvantages such as degradation of the capacitor characteristics and capacitor leakage.

Alternatively, in the fifth embodiment, in addition to the method shown in FIGS. 17A to 17C, a part of the first lower electrode 32 may be left on the interlayer insulating film 31 and the two holes 57 and 57 may be opened in the overlying interlayer insulating film so as to expose the surface of the first lower electrode 32, in the same manner as shown in FIGS. 12A to 12C.

Figure 18:
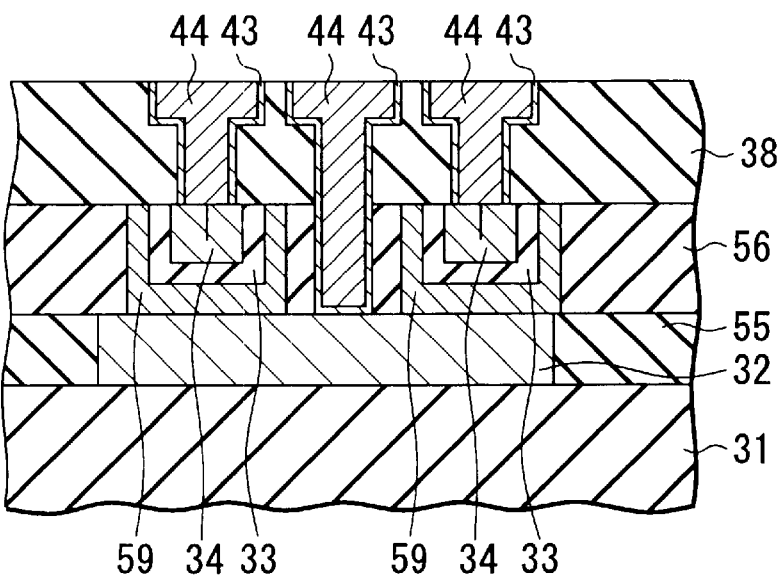
FIG. 18 is a sectional view showing a step of manufacturing a series connected TC unit type ferroelectric RAM according to a second variation of the fifth embodiment of the present invention.

FIG. 18 shows a step of manufacturing a series connected TC unit type ferroelecric RAM according to a second variation of the fifth embodiment of the present invention. In the method of the fifth embodiment, when the second lower electrode 59, the ferroelectric film 33, and the upper electrode 34 are deposited on the entire top surface including the interiors of the two holes 57 and 57 at the step in FIG. 16E, the two holes 57 and 57 are prevented from being fully buried.

On the contrary, in the method of this second variation, the second lower electrode 59, the ferroelectric film 33, and the upper electrode 34 are deposited so as to completely fill the two holes 57 and 57, as shown in FIG. 18. To obtain such a cross section, the second lower electrode 59, the ferroelectric film 33, and the upper electrode 34 are deposited in such a manner that their total thickness is smaller than the opening diameter of each of the holes 57 or the latter have a large opening diameter.

Figure 19:
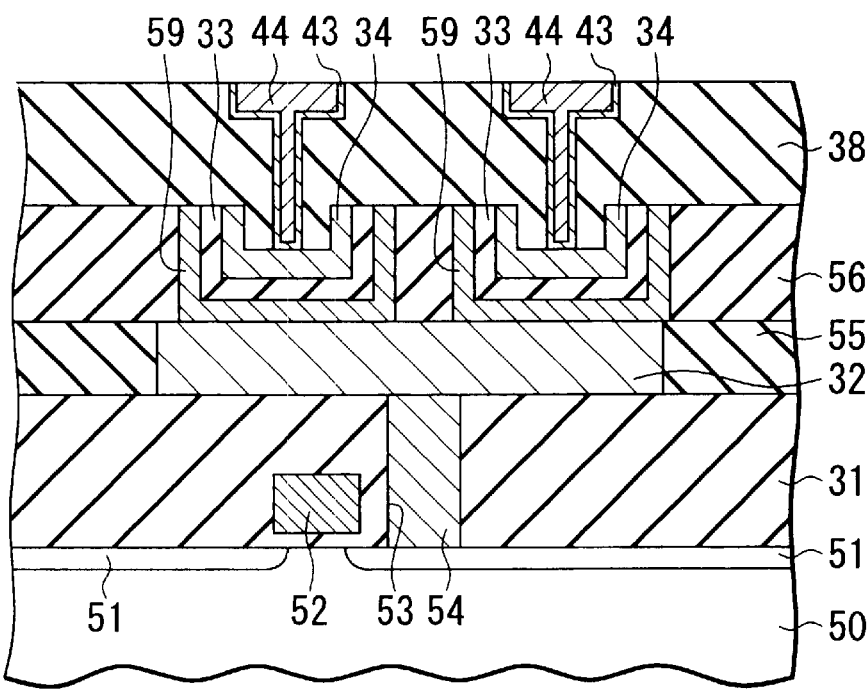
FIG. 19 is a sectional view showing the sectional structure of a series connected TC unit type ferroelectric RAM of the COP structure according to a sixth embodiment of the present invention, which has been manufactured in the same manner as in the fifth embodiment.

FIG. 19 shows the sectional structure of a series connected TC unit type ferroelecric RAM of the COP structure according to a sixth embodiment of the present invention, which has been manufactured in the same manner as in the fifth embodiment.

In FIG. 19, reference numeral 50 denotes a semiconductor substrate having a pair of diffusion regions 51 formed in a surface area thereof and constituting a source and a drain regions of a switching transistor. A gate electrode 52 for this switching transistor is formed in the interlayer insulating film 31. Further, the interlayer insulating film 31 has a contact hole 53 opened therein so as to expose a surface of one of the pair of diffusion regions 51 and 51, and a contact plug, for example, a polysilicon plug 54 is formed so as to fill the contact hole 53. Before forming the plug 54, a barrier metal, for example, a TiN film is formed. Then, the lower electrode 32, the second lower electrode 59, the ferroelectric film 33, the upper electrode 34, the interlayer insulating film 38, the Al plugs/wires 44 connected to the upper electrode 34, and others are formed on the plug 54 in the same manner as in the fifth embodiment. In this case, however, the first lower electrode 34 is connected to the diffusion area 51 of the transistor via the W plug 54, so that the opening of the contact hole for the first lower electrode 32 and the formation of the Al plug/wire in this contact hole can be omitted.

If the series connected TC unit type ferroelecric RAM of the COP structure is manufactured in the same manner as in the fifth embodiment, the mask conversion difference can be reduced for the same reason as described previously, thereby reducing the cell size.

In the example of the memory device in the sixth embodiment, the upper electrode 34 is shown to have a recess portion, but may of course have a flat surface as shown in FIG. 18.

The contact holes leading to the upper electrodes 34 may have so large a diameter that the contact holes expose a part of the ferroelectric film 33.

FIGS. 20A to 20E show a method for manufacturing a series connected TC unit type ferroelecric RAM according to a seventh embodiment of the present invention, in the order of steps.

In the method of the first embodiment, the lower electrode 32, the ferroelectric film 33, and the upper electrode 34 are sequentially deposited, the upper electrode 34 and the ferroelectric film 33 are subsequently etched using a mask, and the lower electrode 32 is then etched. If, however, the ferroelectric film 33 is etched to a certain extent and then etched until the remaining thickness of the ferroelectric film 33 becomes one-thirds or less of its original thickness, then the etching amount of the upper electrode 34 can be reduced when the contact hole leading to the lower electrode 32 is opened in the ferroelectric film 33 and in the interlayer insulating film formed the ferroelectric film 33.

This method will be explained below.

Figure 20A:
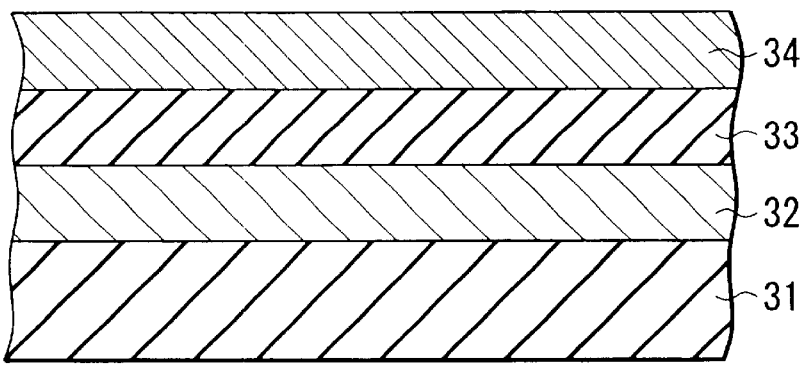
FIGS. 20A to 20E are sectional views showing a method for manufacturing a series connected TC unit type ferroelectric RAM according to a seventh embodiment of the present invention, in the order of steps.

First, as shown in FIG. 20A, the lower electrode 32, the ferroelectric film 33, and the upper electrode 34 are deposited, by means of the CVD process or the sputtering process, on the interlayer insulating film (SiO$_2$) 31 on a silicon semiconductor substrate (not shown) having elements such as switching transistors formed thereon. The lower electrode 32 composes, for example, one Pt film layer but may compose one film layer containing at least one metal selected from IrO$_x$, Ru, Ti, Al, Sr, Re, Mg, La, and Ca or a plurality of film layers containing different metals. The lower electrode 32 has a thickness of, for example, 100 nm. The ferroelectric film 33 composes, for example, PZT but may compose STB or BTO of a composite provskite structure. The ferroelectric film 33 has a thickness of, for example, 150 nm. Furthermore, like the lower electrode 32, the upper electrode 34 composes, for example, one Pt film layer but may compose one film layer containing at least one metal selected from IrO$_x$, Ru, Ti, Al, Sr, Re, Mg, La, and Ca or a plurality of film layers containing different metals. The upper electrode 34 has a thickness of, for example, 100 nm.

Figure 20B:
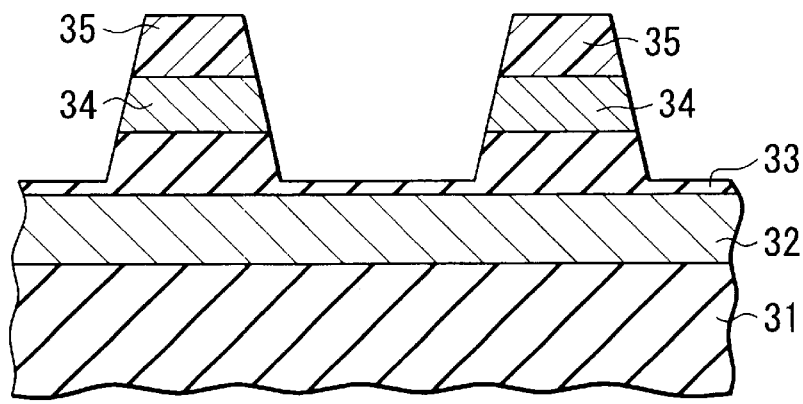

Then, as shown in FIG. 20B, the resist mask 35 having a predetermined pattern shape is formed on the upper electrode 34. The resist mask 35 may be replaced with a hard mask such as an oxide film mask. Subsequently, the upper electrode 34 and the ferroelectric film 33 are etched by a dry etching process, for example, the RIE process using the mask 35. These layers are etched until the remaining thickness of the ferroelectric film 33 becomes about 20 nm, that is, one-thirds or less of its original thickness.

Figure 20C:
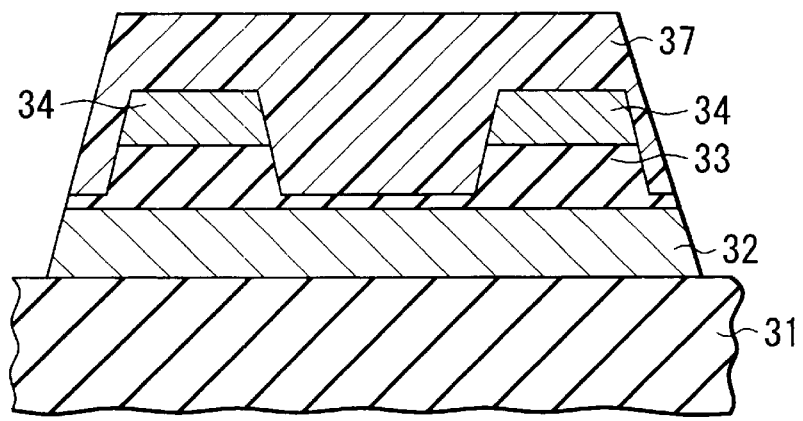

Then, the mask 35 is removed by means of the ashing process, and a new etching mask 37 having a predetermined pattern shape is formed as shown in FIG. 20C. The mask 37 may be a hard mask such as an oxide film mask, instead of the resist mask. Subsequently, the remaining ferroelectric film 33 and lower electrode 32 are etched by means of a dry etching process, for example, the RIE process using the mask 37.

Figure 20D:
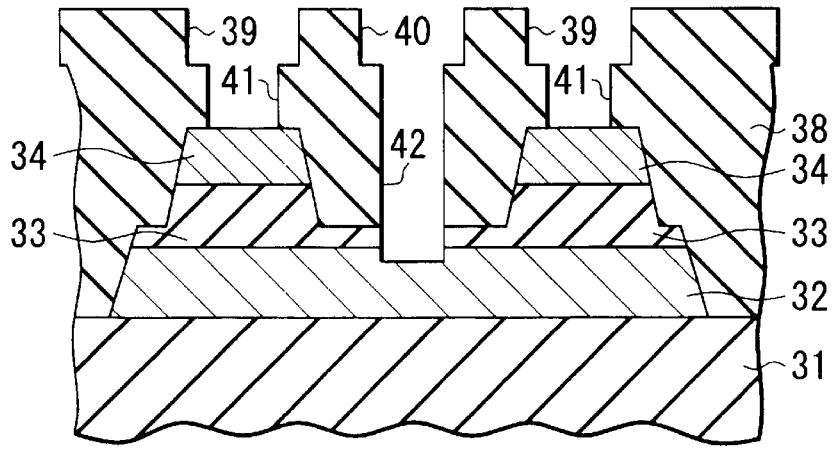

Then, after the mask 37 has been removed by means of the ashing process, the interlayer insulating film 38 is deposited by means of the CVD process and then flattened by means of, for example, the CMP process, the wiring grooves 39 and 40 are formed by means of a dry etching process using a mask of a predetermined pattern, and the contact holes 41 and 42 are formed in the wiring grooves 39 and 40, as shown in FIG. 20D.

In FIG. 20D, the contact hole 42 leading to the lower electrode 32 is formed between the pair of contact holes 41 leading to the upper electrode 34, but may be formed at an end of the pair of contact holes 41.

In this case, the etching selection ratio between the interlayer insulating film 38 composing SiO$_2$ and the upper electrode 34 composing Pt has a large value of 10 or more and the remaining part of the ferroelectric film 33 has a sufficiently small thickness, so that the etching over amount of the upper and lower electrodes 34 and 32 is small even when the deep contact hole 42 leading to the lower electrode 32 is formed.

Figure 20E:
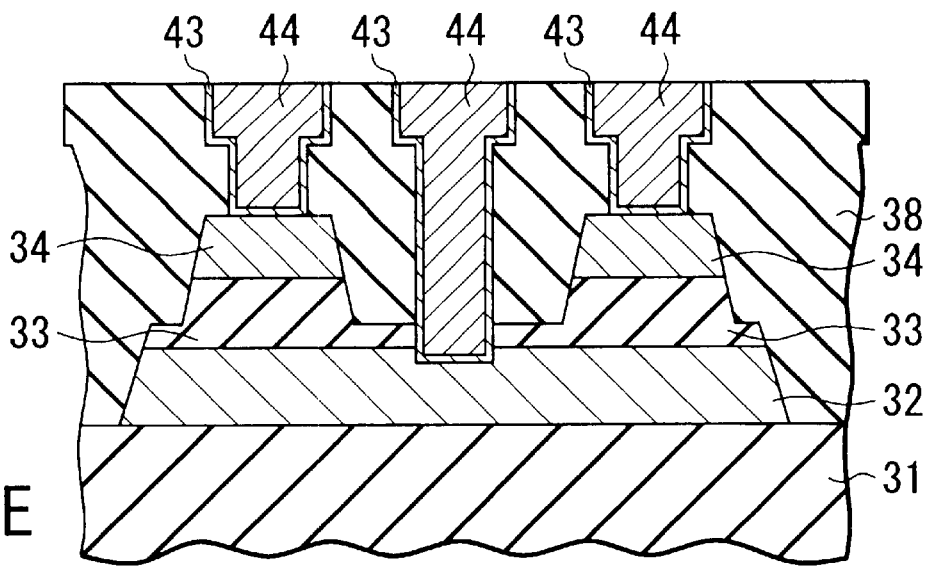

Then, as shown in FIG. 20E, the TiN film 43 is deposited, as a barrier metal, in each of the wiring grooves 39 and 40 and in each of the contact holes 41 and 42 by means of the sputtering process, and the Al plug/wire 44 is then formed in each of the contact holes 41 and 42 and in each of the wiring grooves 39 and 40 by means of a burying process using the sputtering and reflow of Al and a flattering process using the CMP process. A W plug may be used instead of the Al plug. A Cu material may also be used. Alternatively, the Al plug/wire 44 may be formed after the deposition of Al, by means of selective etching such as RIE.

Next, a method for manufacturing a series connected TC unit type ferroelecric RAM according to a first variation of the seventh embodiment of the present invention. In the above description, at the step in FIG. 20B, the resist mask 35 is formed as an etching mask for etching the upper electrode 34 and at the step in FIG. 20C, the resist mask 37 is formed as an etching mask for etching the lower electrode 32.

In contrast, in the manufacturing method of this first variation, hard masks are formed instead of the resist masks.

Figure 21:
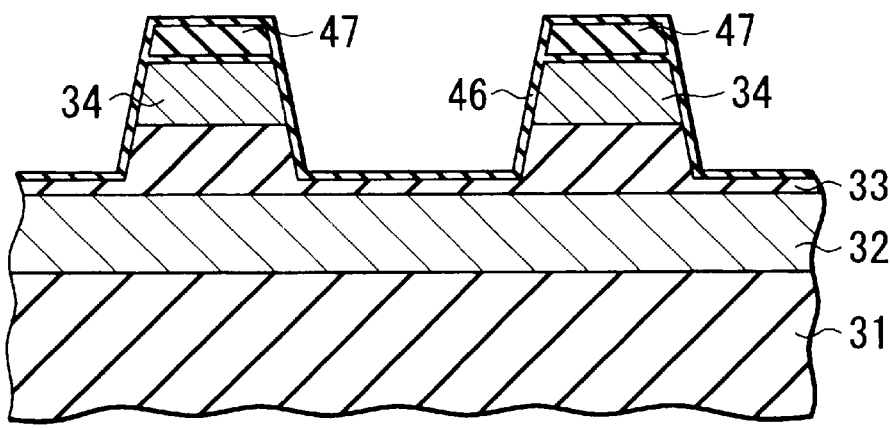
FIG. 21 is a sectional view showing a step of manufacturing a series connected TC unit type ferroelectric RAM according to a first variation of the seventh embodiment of the present invention.

The step shown in FIG. 21 corresponds to that shown in FIG. 20B, after the alumina film 46 has been formed on the upper electrode 34, a silicon oxide film is deposited on the entire top surface and patterned by means of PEP to form the hard mask 47 composed of a silicon oxide film. Subsequently, the upper electrode 34 and the ferroelectric film 33 are etched using the hard mask 47.

Figure 22:
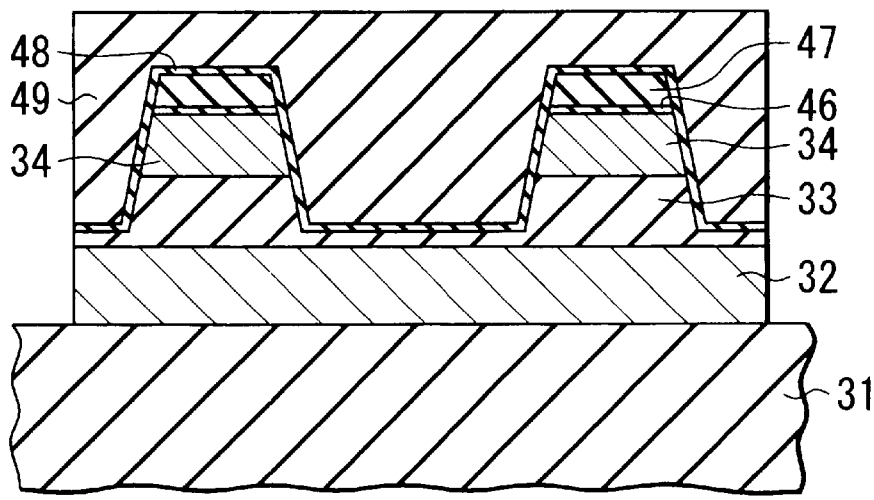
FIG. 22 is a sectional view showing a step of the method for manufacturing a series connected TC unit type ferroelectric RAM according to the first variation of the seventh embodiment of the present invention, the step being different from that in FIG. 21.

The step shown in FIG. 22 corresponds to that shown in FIG. 20C, after the upper electrode 34 and the ferroelectric film 33 have been etched, the alumina film 48 is formed on the entire top surface, and a silicon oxide film is then deposited on the entire top surface and patterned by means of PEP to form the hard mask 47. Subsequently, the upper electrode 34 and the ferroelectric film 33 are etched using the hard mask 47.

As described previously, hard masks composing $W_xN_y$, $Ti_xN_y$, $SiO_2$, $Al_2O_3$, an alumina, or a combination thereof may be formed instead of the resist masks 47 and 49 composing silicon oxide films.

The series connected TC unit type ferroelecric RAMs and its manufacturing methods according to the first to seventh embodiments as described above can hinder degradation of the capacitor characteristics and capacitor leakage caused by the partial etching of the upper electrode 34 and can restrain damage to the ferroelectric film 33 to prevent degradation of the polarization of the ferroelectric capacitor.

Figure 1:
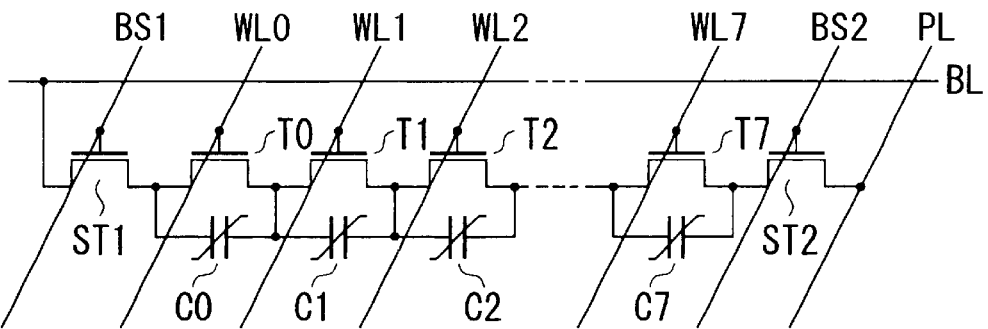
FIG. 1 is an equivalent circuit diagram of a series connected TC unit type ferroelectric RAM.
Figure 23A:
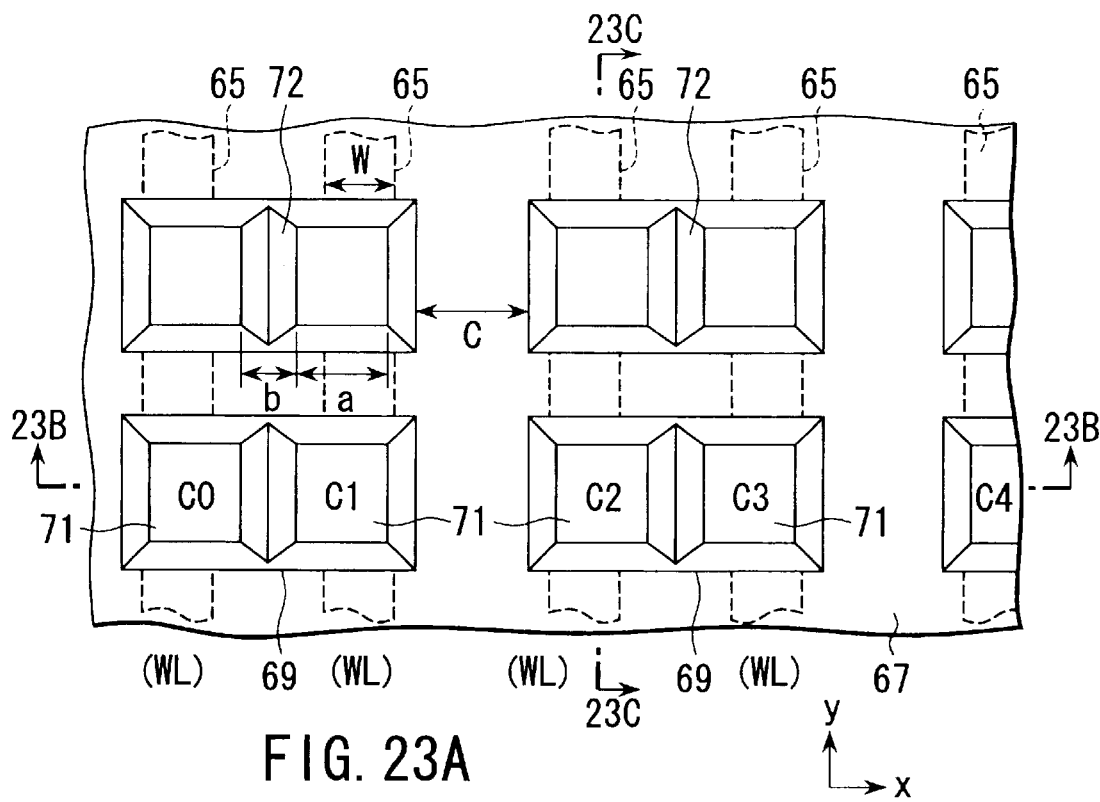
FIG. 23A is a view showing a layout of a cell array area of a series connected TC unit type ferroelectric RAM according to an eighth embodiment of the present invention.
Figure 23B:
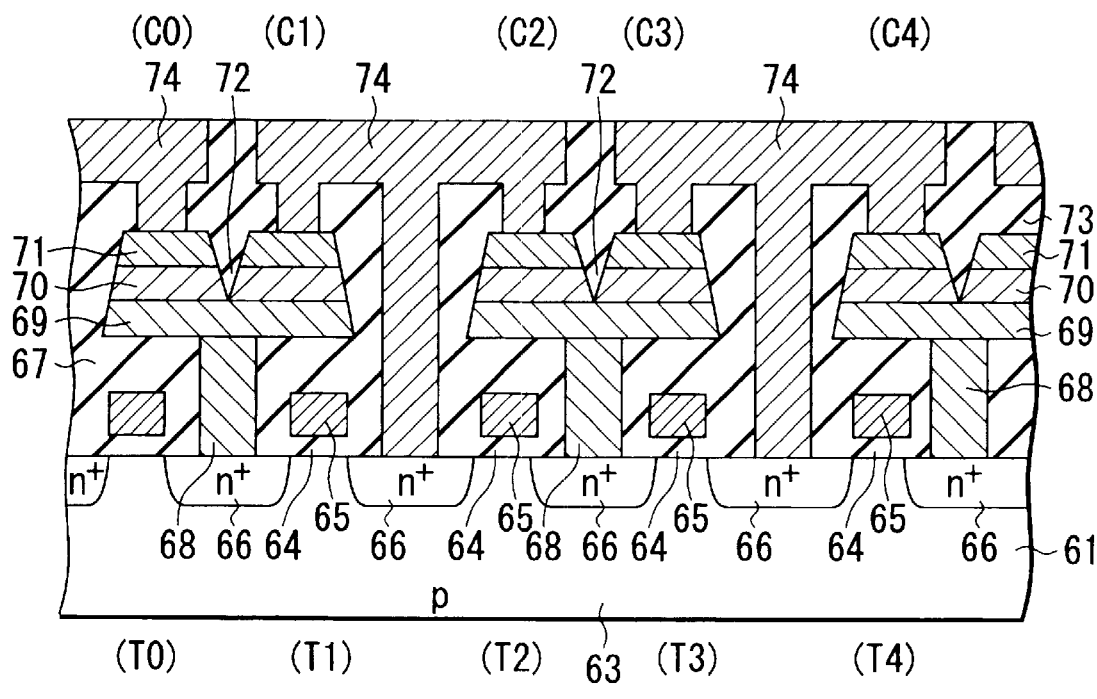
FIGS. 23B and 23C are different sectional views of FIG. 23A.
Figure 23C:
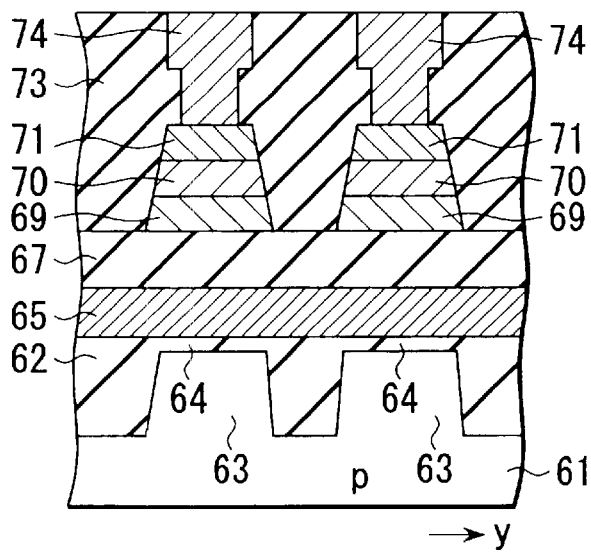

FIG. 23A shows a layout of a cell array area of a series connected TC unit type ferroelecric RAM according to an eighth embodiment of the present invention, and FIGS. 23B and 23C show different cross sections of FIG. 23A. In FIG. 23A, illustration of upper wiring is omitted. References C1, C2, . . . and T0, T1, . . . , shown in FIG. 23B, denote ferroelectric capacitors and transistors in the cell array block shown in the equivalent circuit in FIG. 1.

A cell array is formed in a p-type region of a silicon semiconductor substrate 61. The silicon semiconductor substrate 51 has a plurality of striped element forming areas 63 formed therein and partitioned by an isolation film 62 as shown in FIG. 23C. A gate electrode 65 is formed on each of the element forming areas 63 via a gate insulating film 64 and a source and a drain regions 66 are formed adjacent to the element forming area 63, thereby constituting a transistor. In the cell array block arranged in the direction x in FIG. 23A, the diffusion regions 66 of the plurality of transistors are each shared by the adjacent transistors. The gate electrodes 65 are continuously patterned over a plurality of cell array blocks arranged in the direction y in FIG. 23A, to constitute a word line WL.

The substrate with the transistors formed thereon is covered with the interlayer insulating film 67. Contact plugs 68 are buried in the interlayer insulating film 67 in such a manner that every other contact plug 68 is connected to the corresponding diffusion region 66. The contact plug 68 composes impurity-doped polysilicon or tungsten. A ferroelectric capacitor composed of a lower electrode 69, a ferroelectric film 70, and an upper electrode 71 is formed on the interlayer insulating film 67 with the contact plug 68 buried therein.

The lower electrode 69 is a TiAlN/IrO$_x$/Pt electrode including a barrier metal, the ferroelectric film 70 is an SBT or a PZT film, and the upper film 71 is an Ir/IrOx electrode. The lower electrode 69 may be a TiAlN/IrO$_x$/Pt/SRO electrode and the upper film 71 may be an SRO/Ir/electrode Every two ferroelectric capacitors have the shared lower electrode 69 and are paired such that the lower electrode 69 has two individual upper electrodes 71 thereon. The shared lower electrode 69 is connected to one diffusion region 66 via one contact plug 68. The paired ferroelectric capacitors having the common lower electrode 69 have their peripheries formed into continuous inclined surfaces by continuously etching the capacitors from a top surface of the upper electrode 71 to a bottom surface of the lower electrode 69 using the same mask, and the upper electrodes 71 of the paired ferroelectric capacitors are separated by a V-shaped groove 72.

In FIG. 23A, the width a of the upper electrode 71 in the direction x is larger than the width W of the gate electrode 65 (word line WL) which is equal to a minimum dimension according to design rules, for example, 0.4 μm or more. Further, the space b between the upper electrodes 71 separated by the V-shaped groove 72 is half or less of the width a of the upper electrode 71 and is smaller than a space c between the paired ferroelectric capacitors that are adjacent in the direction x. Specifically, the width a is set at about 1 μm, the size of the space c is set between about 1 and 1.5 μm so as to accommodate the size of a contact and a margin therefore, and the size of the space b is set such that b≦a/2, for example, 0.4 μm or less. The above-mentioned relationship between the width a of the upper electrode 71 and the size of the space b has only to be met for the maximum width of the upper electrode 71 but is more preferably met for the minimum value (b<a) of the width a.

The surface with the ferroelectric capacitors formed thereon is covered with the interlayer insulating film 73. A wiring layer 74 connecting the upper electrodes 71 to the diffusion region 66 is formed on the interlayer insulating film 73. Specifically, in this embodiment, wiring grooves and contact holes are formed in the interlayer insulating film 73 and the wiring layer 74 is buried in the wiring grooves and in the contact holes by depositing Al and by means of the reflow process. Alternatively, the wiring layer 74 may be formed by depositing Cu using the CVD process or the like. Alternatively, a W plug may be buried in each of the contact holes and the wiring layer such as Al may then be buried in each of the wiring grooves.

This constitutes a cell array block having the plurality of transistors connected in series and the plurality of ferroelectric capacitors connected in series, the transistors and the ferroelectric capacitors being connected together in parallel.

Next, specific steps of manufacturing the series connected TC unit type ferroelecric RAM according to the eight embodiment of the present invention will be described with reference to FIGS. 24A to 24F. FIGS. 24A to 24F correspond to cross sections of FIG. 23B.

Figure 24A:
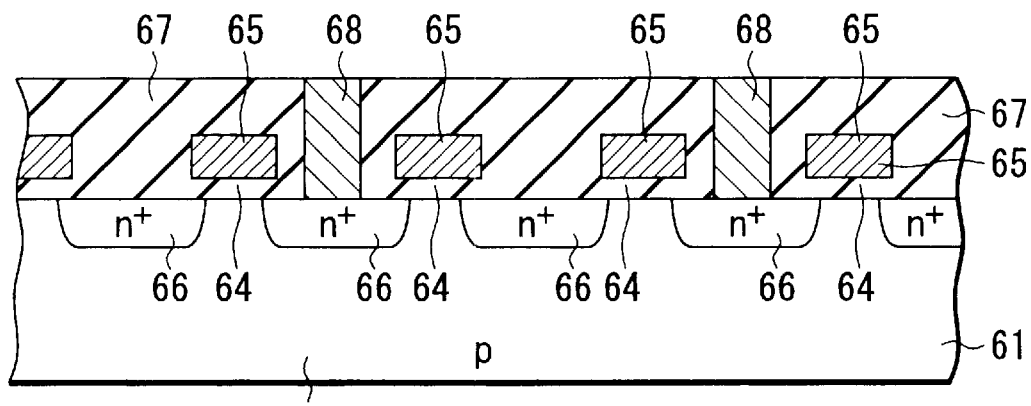
FIGS. 24A to 24F are sectional views showing specific steps of manufacturing the series connected TC unit type ferroelectric RAM according to the eight embodiment of the present invention.

First, the isolation film 62 is buried in the cell array area of the silicon semiconductor substrate 61 as shown in FIG. 23C, to form a plurality of striped element forming areas 63. The gate electrode 65 is formed on each of the element forming areas 63 via the gate insulating film 64, and the source and drain diffusion regions 66 are formed adjacent to the gate electrodes 65 in a self-aligning manner. As described previously, the gate electrodes 65 are continuously patterned in the direction y to form the word line WL. The interlayer insulating film 67 is formed so as to cover the thus formed transistors. Contact holes are formed in the interlayer insulating film 67, and the contact plugs 68 composed of polysilicon or the like are buried in the contact holes. FIG. 24A shows a structure obtained by the above steps.

Figure 24B:
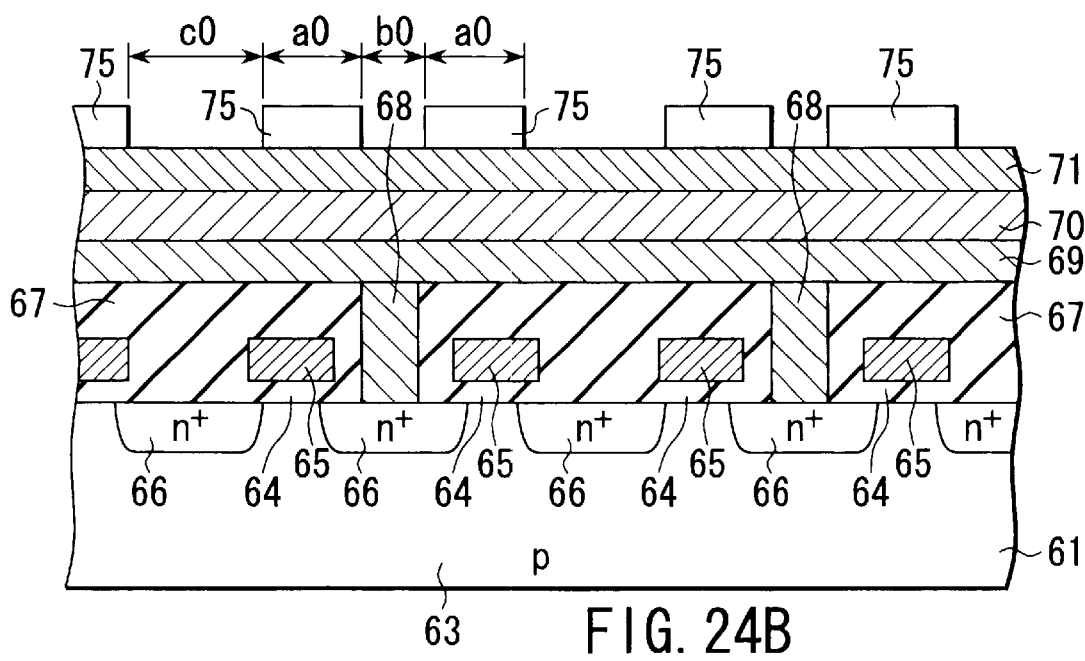

Subsequently, as shown in FIG. 24B, a material film of the lower electrode 69, the ferroelectric film 70, and a material film of the upper electrode 71 are sequentially deposited to form ferroelectric capacitors. The material film of the lower electrode 69 is a TiAlN/IrO$_x$/Pt film containing a barrier metal, the ferroelectric film 70 is a PZT film, and the material film of the upper electrode 71 is an Ir/IrO$_x$ electrode. An alumina film may be formed on the upper electrode 71.

Subsequently, as shown in FIG. 24B, a PEP step is executed to form an etching mask 75 for patterning the upper electrode 71. The etching mask 75 may be a resist mask or a hard mask ($W_xN_y$, $Ti_xN_y$, $SiO_2$, an alumina, or a combination thereof). The etching mask 75 has a width a0 larger than the gate electrode 65, a portion b0 constituting a space between the paired upper electrodes on the shared lower electrode 69 has a size equivalent to the width of the word line, that is, 0.4 μm or less, and a space c0 forming an upper electrode contact has a value that allows for a contact margin. The mask 75 may be a hard mask. In this case, the portion b0 becomes short if the mask 75 is tapered.

Figure 24C:
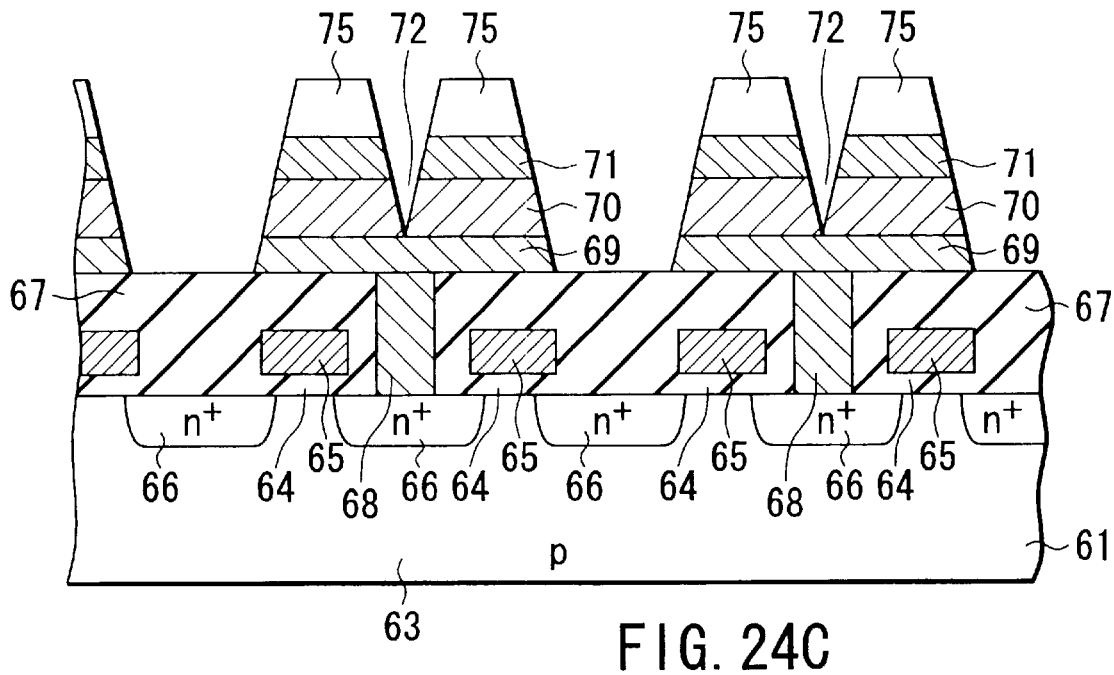

Then, the material film of the upper electrode 71, the ferroelectric film 70, and the material film of the lower electrode 69 are continuously and sequentially dry-etched as shown in FIG. 24C. In this case, due to a microloading effect, even when the material film of the upper electrode 71 has been completed in the large spaces c0, the material film of the lower electrode 69 remains in the small spaces b0. As a result, peripheries of the paired ferroelectric capacitors are formed into continuous inclined surfaces without any step with the upper electrodes 71 on the shared lower electrode 69 separated by the sharp V-shaped groove 72. That is, the one lithography step and the one dry etching step allow separation of the upper electrodes 71 individually provided for each ferroelectric capacitor, while allowing patterning of the lower electrode 69 shared by the two ferroelectric capacitors. The V-shaped groove 72, however, is not required to be perfectly V-shaped but may be substantially V-shaped.

The mask 75 may be a hard mask. If the mask 75 is tapered, the portion b0 decreases. This reduces the distance between any two ferroelectric capacitors that make a pair. As a result, each any two ferroelectric capacitors can be isolated from any adjacent pair of the ferroelectric capacitors.

Figure 24D:
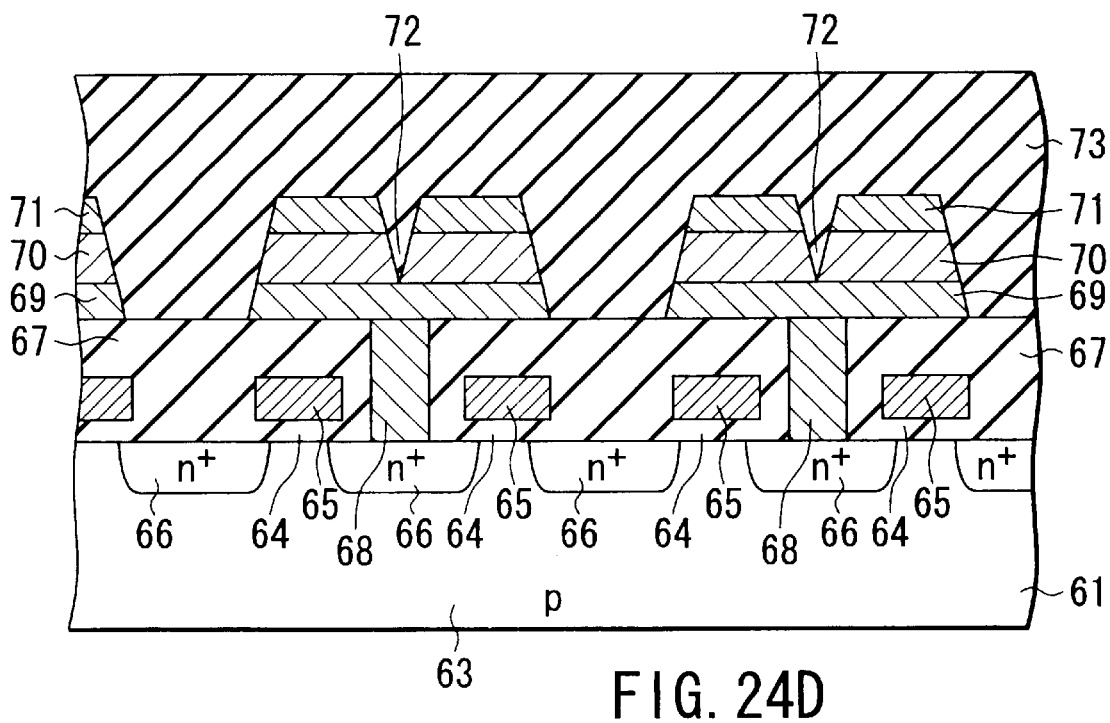
Figure 24E:
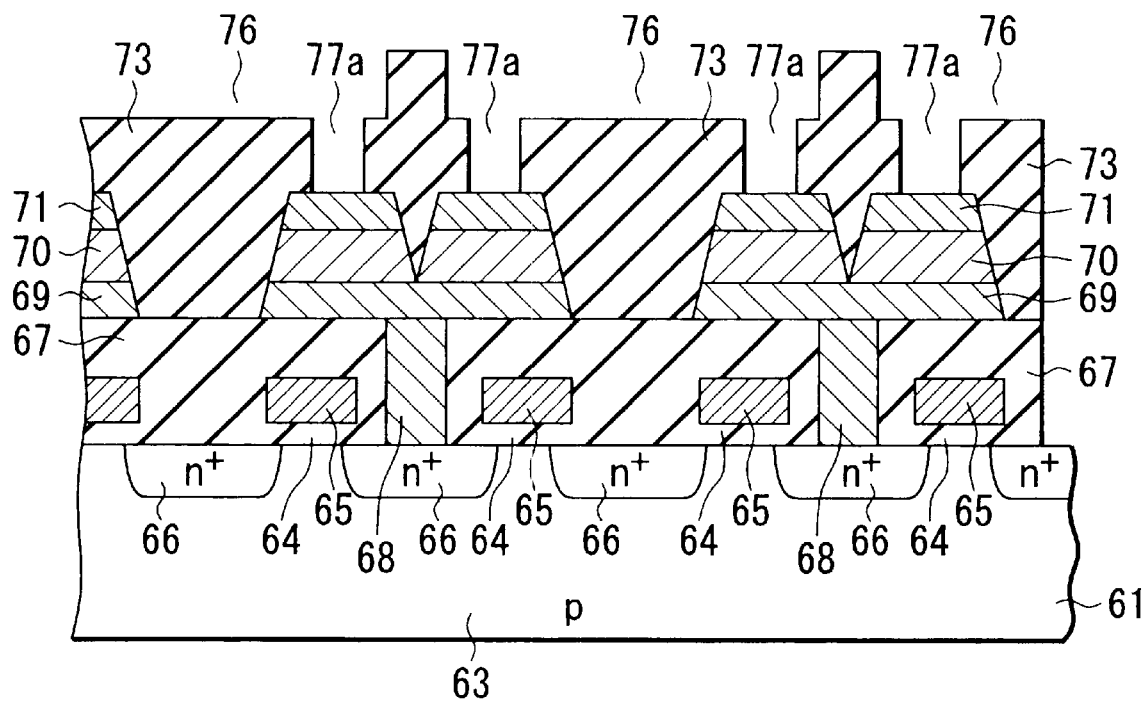
Figure 24F:
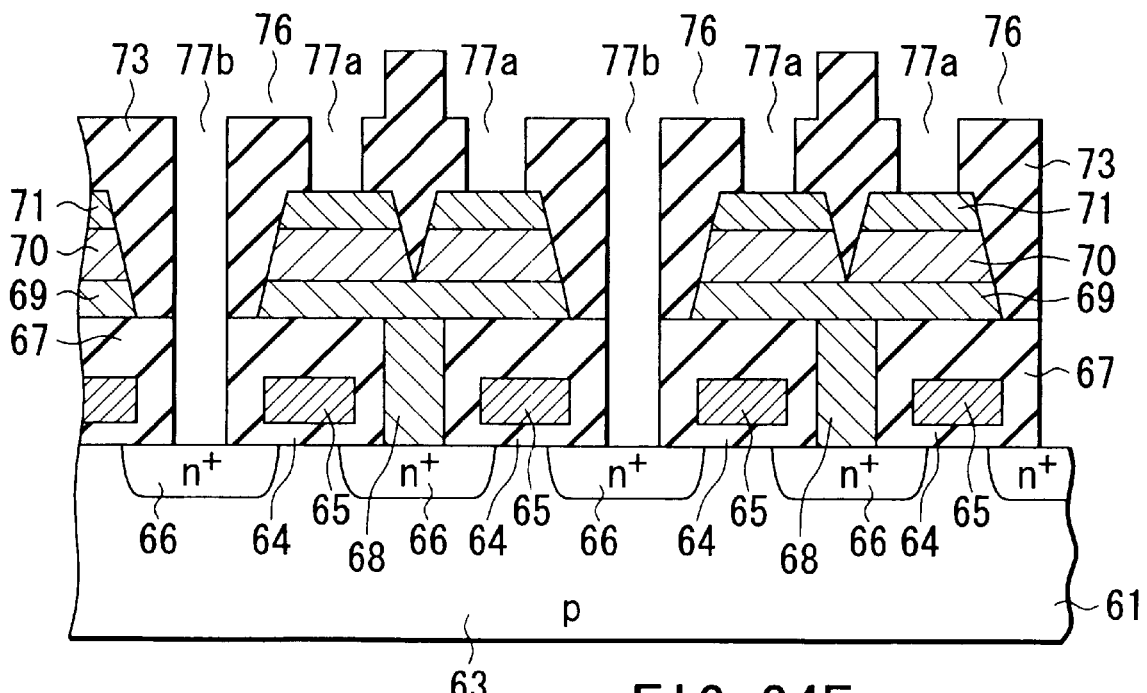

Thereafter, as shown in FIG. 24D, the interlayer insulating film 73 covering the ferroelectric capacitor is deposited and flattened. Subsequently, as shown in FIG. 24E, wiring grooves 76 are formed for connecting the upper electrodes 71 to the diffusion regions 66, and contact holes 77a for the upper electrodes 71 are formed. Annealing is then carried out by introducing oxygen into the contact holes 77a to recover from damage. Thereafter, as shown in FIG. 24F, contact holes 77b for the diffusion areas 66 are formed. Then, as previously shown in FIG. 23B, the wiring layer 74 is buried in the contact holes 77a and 77b and in the wiring grooves 76 by means of the Al reflow process.

Although not shown, an interlayer insulating film is further deposited to form bit and plate lines.

Figure 25:
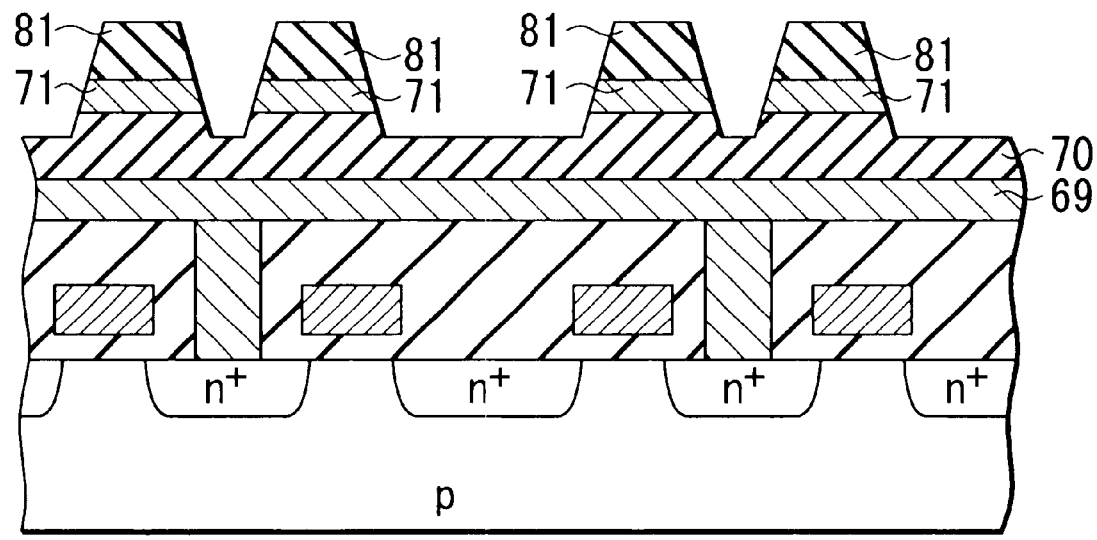
FIG. 25 is a sectional view of a step of etching an upper electrode according to a comparative example.
Figure 26:
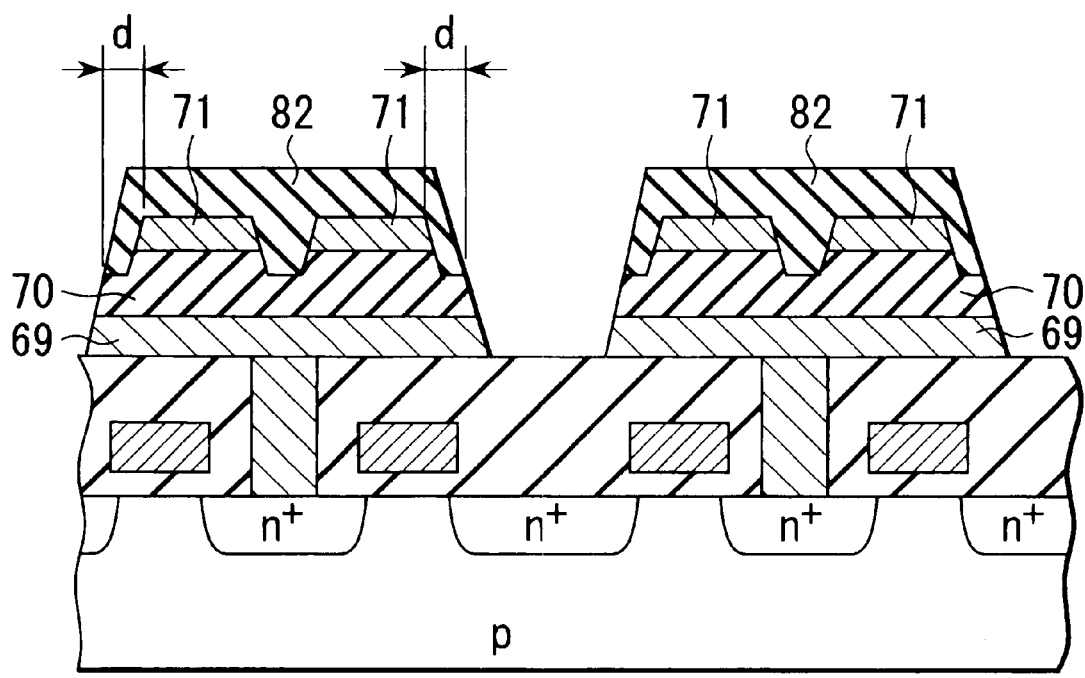
FIG. 26 is a sectional view of a step of etching a lower electrode according to a comparative example.
Figure 27A:
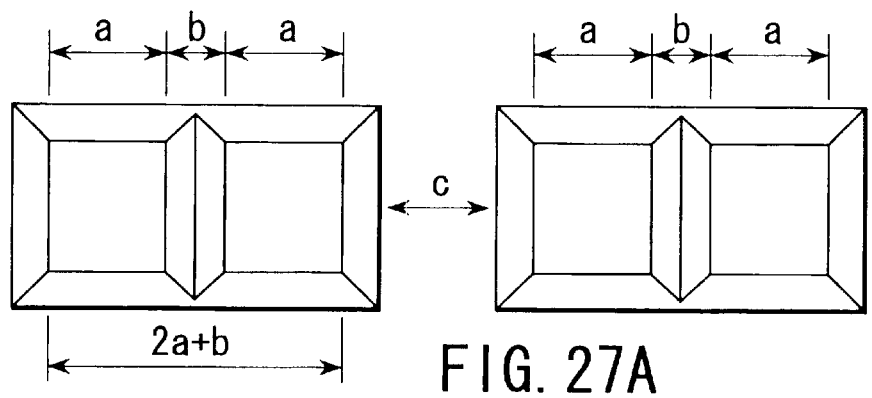
FIGS. 27A and 27B are a top view and a sectional view showing how ferroelectric capacitors are arranged in the series connected TC unit type ferroelectric RAM according to the eighth embodiment of the present invention.
Figure 27B:
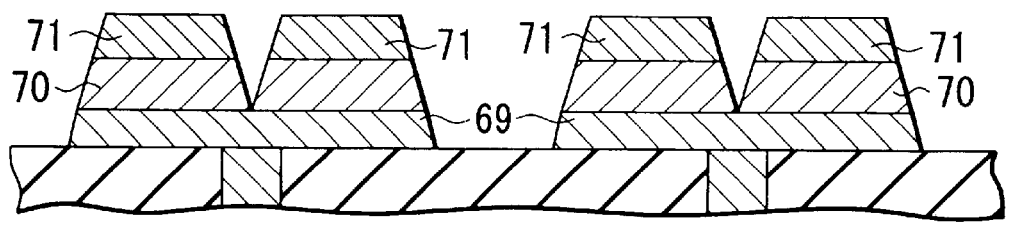
Figure 28A:
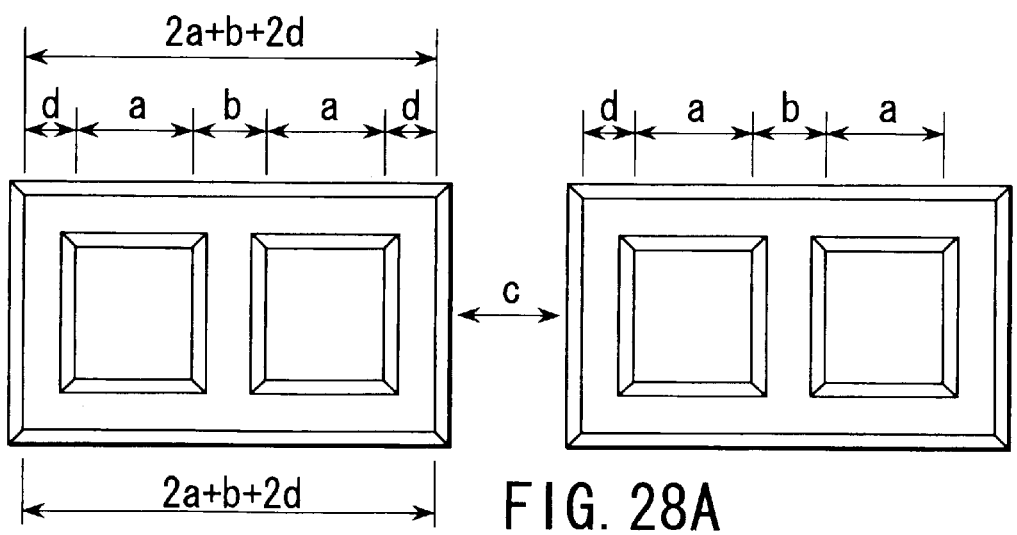
FIGS. 28A and 28B are a top view and a sectional view showing how ferroelectric capacitors are arranged in a series connected TC unit type ferroelectric RAM according to a comparative example.
Figure 28B:
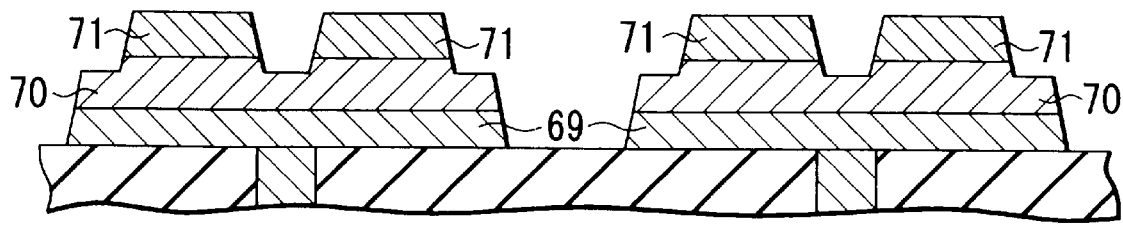

The reason why the unit cell are is reduced according to the manufacturing method of this embodiment will be specifically described in comparison with comparative examples. If the two upper electrodes have the shared lower electrode, then in the first to seventh embodiments, the upper electrodes and the lower electrode are patterned in different steps. When, for example, the first embodiment shown in FIGS. 3A to 3F is used as a comparative example, FIGS. 25 and 26 show a comparison of the steps of this example with the step in FIG. 24C. FIG. 25 shows a step of etching the upper electrode 71 using an etching mask 81 obtained by the first lithography step. FIG. 26 shows a step of etching the lower electrode 69 using an etching mask 82 obtained by the second lithography step. In this case, the step in FIG. 26 requires an aligning margin d for the upper electrodes 71 so as not to etch the already processed upper electrodes 71.

The aligning margin d affects the magnitude of the unit cell area. FIGS. 27A, 27B, 28A, and 28B show a comparison between the eighth embodiment and the comparative example for the dimensions of the ferroelectric capacitor. If the comparative example and the eighth embodiment have the same width a of the upper electrode 71 (exactly speaking, the width at a bottom surface position of the upper electrode), the same separation space b between the upper electrodes 71 of the paired ferroelectric capacitors (the space at the bottom surface position of the upper electrodes), and the same space c which must include a margin for forming a contact (the space at a bottom surface position of the lower electrode), and reference d denotes a space required in the comparative example to pattern the lower electrodes, then the width of the paired ferroelectric capacitors is given by 2a+b+2d in the comparative example and by 2a+b in the eighth embodiment.

As described above, the manufacturing method according to the eighth embodiment can further reduce the area per unit cell compared to the first to eighth embodiments. Further, in the method of processing the lower electrodes after the upper electrodes, the upper electrodes may be partly etched if the aligning margin is insufficient. This may significantly vary cell characteristics particularly if fine cells are arranged. In contrast, in this embodiment, the upper electrodes are prevented from being exposed to etching, resulting in excellent characteristics even with fine cells.

Figure 29A:
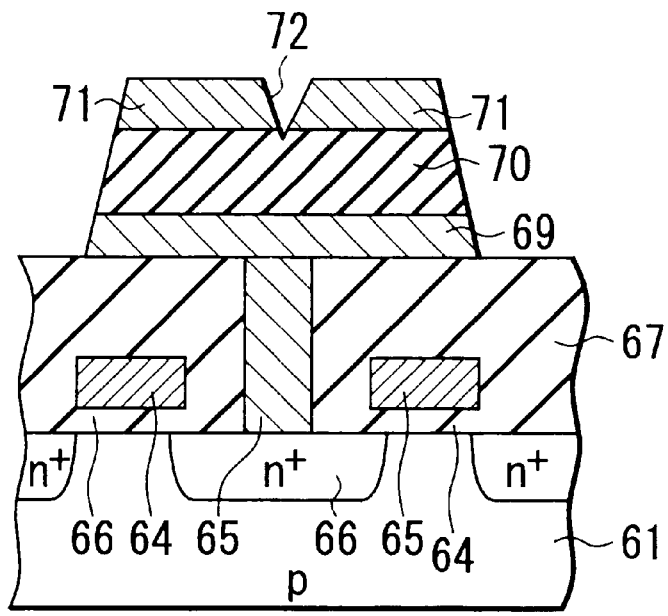
FIGS. 29A and 29B are sectional views of a series connected TC unit type ferroelectric RAM according to a ninth embodiment of the present invention.
Figure 29B:
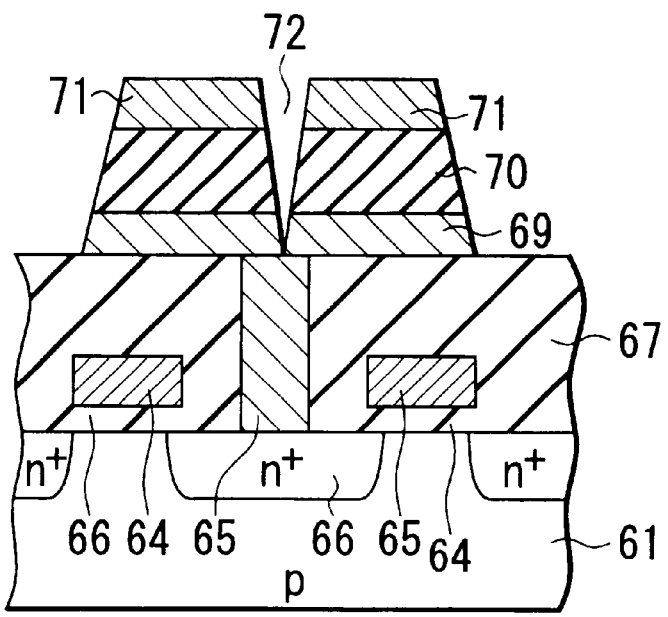

FIGS. 29A and 29B shows cross section of a series connected TC unit type ferroelecric RAM according to a ninth embodiment of the present invention, views corresponding to a cross section of FIG. 23B. In FIG. 23B, the V-shaped groove 72 separating the two upper electrodes 71 on the shared lower electrode 69 has its tip just reaching the lower electrode 69 to almost completely separate the ferroelectric film 70. In such a structure is preferable for reliably preventing leakage between the adjacent capacitors. The ferroelectric film, however, is not necessarily required to be separated.

As shown in 28A, the V-shaped groove 72 has the minimum depth that is required to separate the upper electrode 71. To give this depth to the groove 72, it suffices to narrow the space b0 in the etching mask 75 in the manufacturing step shown in FIG. 25B (the eighth embodiment). The area of the unit cell can thereby be reduced further. Additionally, the V-shaped groove 72 may be used to separate the ferroelectric film 70 and the lower electrode 69 from each other.

Figure 30:
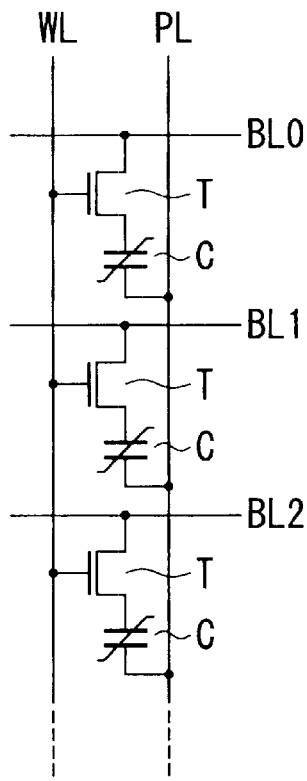
FIG. 30 is an equivalent circuit diagram of a series connected TC unit type ferroelectric RAM having a cell array of one transistor and one capacitor according to the present invention.

The present invention is not limited to series connected TC unit type ferroelecric RAMs but is applicable to ordinary FeRAM of a one-transistor/one-capacitor cell structure or a two-transistor/two-capacitor cell structure. For example, FIG. 31 shows a word-line-wise cross section of a cell array of transistors T and ferroelectric capacitors C, shown in FIG. 30.

In this case, the ferroelectric capacitors C, in which a set of ferroelectric capacitors comprises a plurality of them arranged in the word line direction, have a common continuous lower electrode 69, and the upper electrodes 71 are separated by the V-shaped groove 72. This capacitor structure can be formed by using an etching mask covering the upper electrodes 71 to etch the laminated film composed of the material film of the lower electrode 69, the ferroelectric film 70, and the material film of the upper electrode 71, as in the above eighth embodiment. The one set of ferroelectric capacitors have their peripheries formed into continuous inclined surfaces extending continuously from the top surface of the upper electrode 71 to the bottom surface of the lower electrode 69 and having no step, and the upper electrodes 71 are separated by a V-shaped groove.

In this embodiment, in the one set of ferroelectric capacitors, the space between the upper electrodes 71 is half or less of the width of the upper electrode 71.

Figure 31:
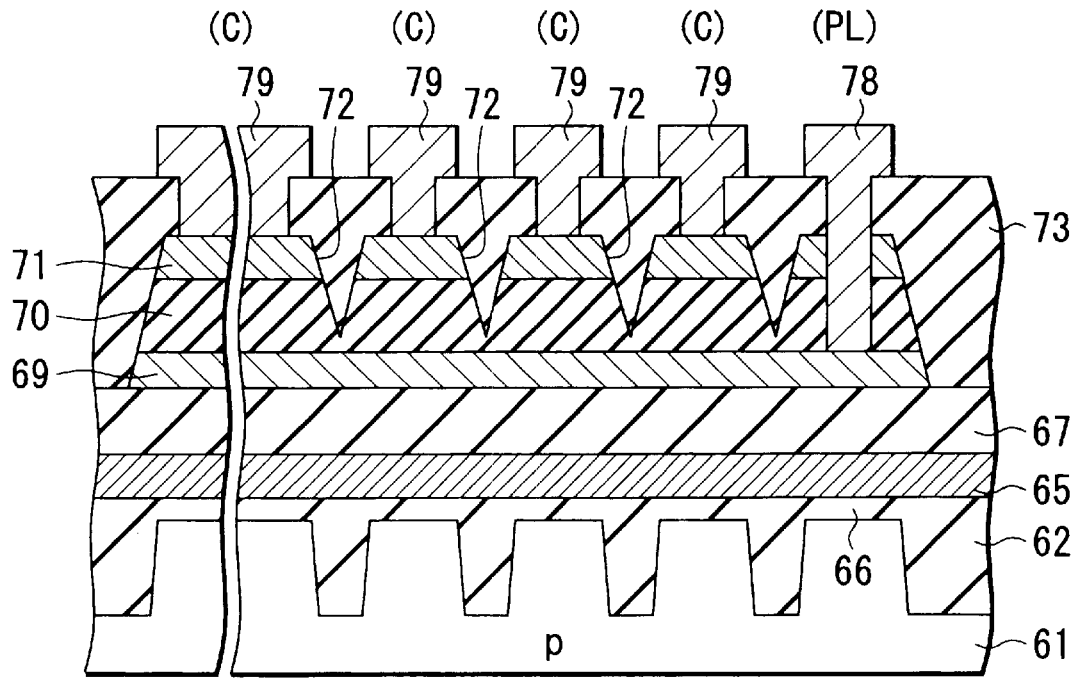
FIG. 31 is a sectional view showing the element structure of the series connected TC unit type ferroelectric RAM shown in FIG. 30 as seen in the direction of word lines.

In FIG. 31, a dummy capacitor is provided at one end of the array of the one set of ferroelectric capacitors, and a wiring layer 78 that penetrates the upper electrode 71 and ferroelectric film 70 of this dummy capacitor to contact with the lower electrode 71 constitutes a plate line PL. The upper electrodes 71 of the other ferroelectric capacitors are connected to the diffusion regions of the corresponding transistors via wiring layers 79 constituting cell node electrodes.

This embodiment also reduces the unit cell area.

As described above, with the series connected TC unit type ferroelecric RAMs according to the eighth and ninth embodiments, the shared lower electrode and the individual upper electrodes are processed within the single lithography step, thus reducing the unit cell area of the ferroelectric memory without any dimensional error in the electrodes associated with misalignment.

Figure 32A:
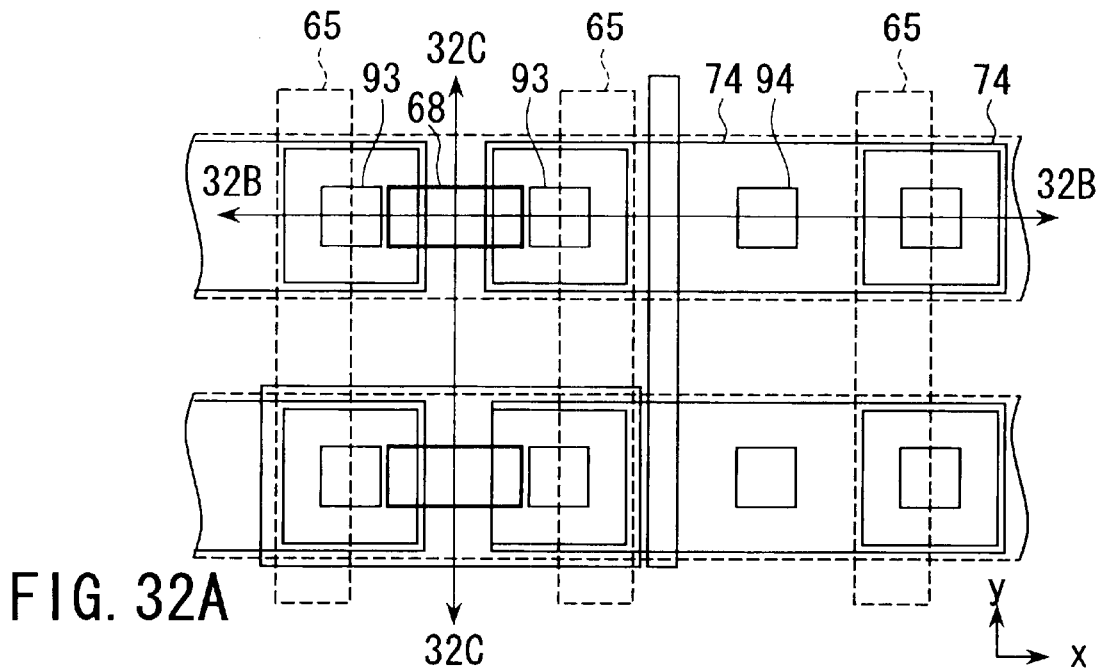
FIG. 32A is a view showing a layout of a cell array area of a series connected TC unit type ferroelectric RAM according to a tenth embodiment of the present invention.
Figure 32B:
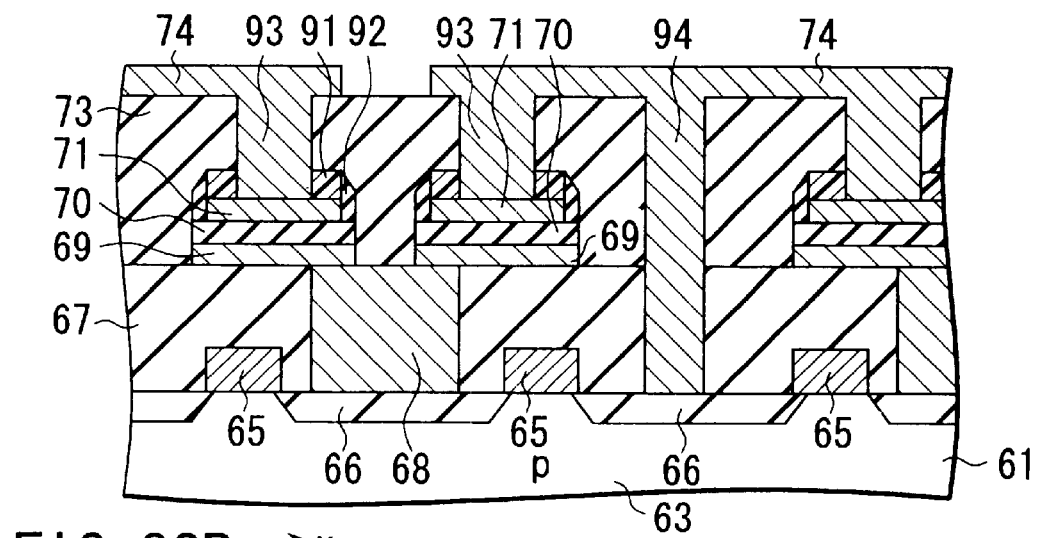
FIGS. 32B and 32C are different sectional views of FIG. 32A.
Figure 32C:
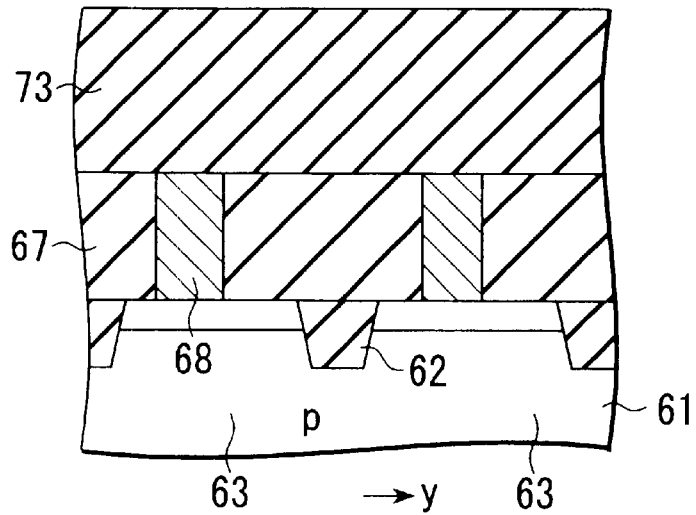

FIG. 32A shows a layout of a cell array area of a series connected TC unit type ferroelecric RAM according to a tenth embodiment of the present invention. FIGS. 32B and 32C show different cross sections of FIG. 32A.

A cell array is formed in and on a p-type region of the silicon semiconductor substrate 61. The silicon semiconductor substrate 61 has the plurality of element forming areas 63 formed therein and partitioned by the isolation film 62 as shown in FIG. 32C. The gate electrode 65 is formed on each of the element forming areas 62 via a gate insulating film (not shown). Moreover, the source and drain regions 66 of transistors are formed by introducing n-type impurities into the element forming areas 63 using the gate electrodes 65 as a mask. In the cell array block arranged in the direction x in FIG. 32A, the diffusion regions 66 of the plurality of transistors are each shared by the corresponding adjacent transistors. As shown in FIGS. 32A and 32C, the gate electrodes 65 are continuously patterned over a plurality of cell array blocks arranged in the direction y to constitute the word line WL.

The substrate with the transistors formed thereon is covered with the interlayer insulating film 67. The contact plugs 68 are buried in the interlayer insulating film 67 in such a manner that every other contact plug 68 is connected to the corresponding diffusion region 66. The contact plugs 68 compose impurity-doped polysilicon or tungsten. The contact plugs 68 each have the pair of lower electrodes 69 formed thereon so as to contact therewith. The lower electrodes 69 each have the ferroelectric film 70 formed thereon and patterned similarly thereto, and the ferroelectric film 70 has the upper electrode 71 formed thereon and patterned so as to have a planar shape smaller than the lower electrode 69 and the ferroelectric film 70. Thus, each contact plug 68 has two ferroelectric capacitors formed thereon and each composed of the lower electrode 68, the ferroelectric film 70, and the upper electrode 71.

The lower electrodes 69 are each a TiAlN/IrO$_x$/Pt electrode including a barrier metal, the ferroelectric films 70 are each an SBT or a PZT film, and the upper films 71 are each an Ir/IrO$_x$ electrode.

In each ferroelectric capacitor, the upper electrode 71 has an etching mask 91 formed thereon and used for patterning, and the laminated film composed of the upper electrode 71 and the mask 91 has a side wall insulating film 92 formed on side walls thereof and used to pattern the ferroelectric film 70 and the lower electrode 69. Further, the interlayer insulating film 73 is deposited on the entire top surface, and contacts 93 are each formed so as to penetrate the interlayer insulating film 73 and the corresponding mask 91 and to contact with a part of a surface of the upper electrode 71 corresponding to this mask 91. Moreover, the interlayer insulating films 73 and 67 have contacts 94 each formed therein so as to contact every other diffusion region 66 having no contact plug 68 buried therein. Both contacts are connected together via the wiring layer 74.

Next, a method for manufacturing a series connected TC unit type ferroelecric RAM as shown in FIGS. 32A to 32C will be described with reference to the sectional views in FIGS. 33A, 33B to 39A, and 39B. FIGS. 33A to 39A correspond to cross sections of FIG. 32B, and FIGS. 33B to 39B correspond to cross sections of FIG. 32C.

Figure 33B:
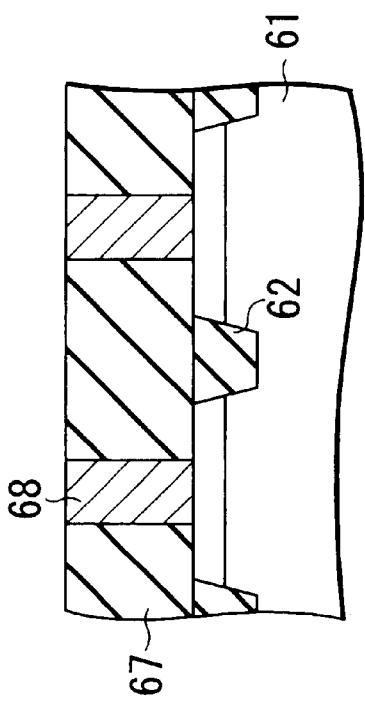
Figure 33A:
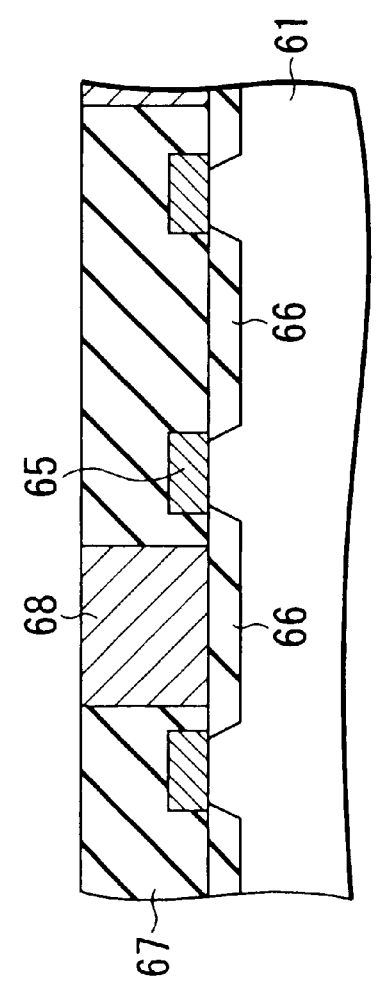

At the steps shown in FIGS. 33A and 33B, transistors are formed and the contact plugs 68 having a rectangular cross section are formed. First, the isolation film 62 is formed in the silicon semiconductor substrate 61, and the plurality of striped element forming areas 63 are formed. Subsequently, the gate electrode 65 is formed on each of the element forming areas, and the source and drain diffusion regions 66 are formed by diffusing impurities.

Subsequently, the interlayer insulating film 67 is deposited on the entire top surface and the flattened. Holes for the plug contacts are then opened in the interlayer insulating film 67, and an electrode material for the plugs, that is, impurity-doped polysilicon or tungsten is deposited on the film and flattened by means of CMP or CDE (Chemical Dry Etching) to form the contact plugs 68. At this time, the contact plugs 68 are formed so as to have a cross section with its long sides extending in a direction crossing the direction in which the gate electrode 65 extends.

Figure 34B:
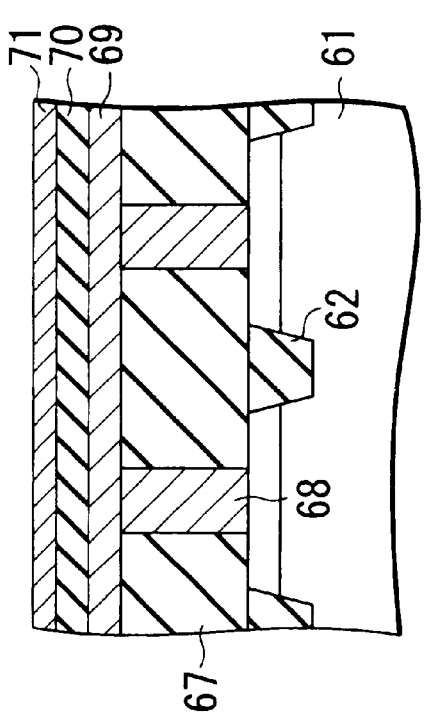
Figure 34A:
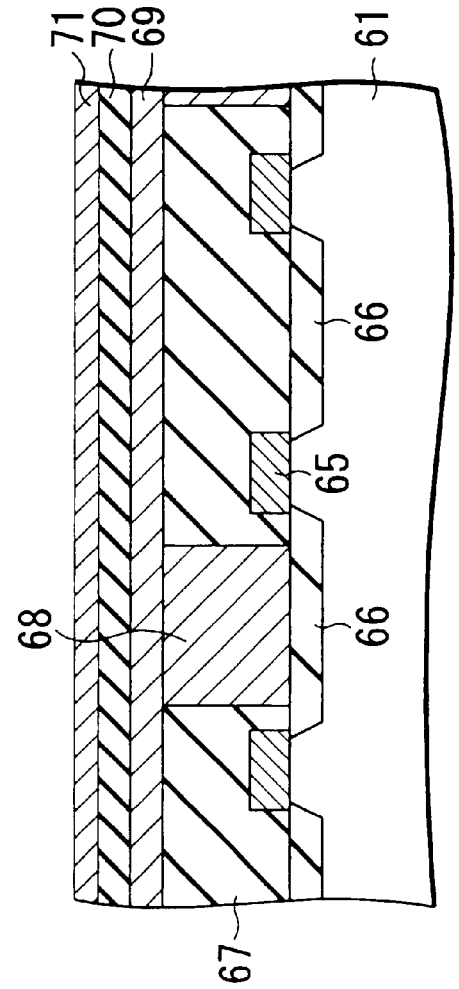

At the next steps shown in FIGS. 34A and 34B, the material film of the lower electrode 69, the ferroelectric film 70, and the material film of the upper electrode 71 are sequentially deposited on the contact plugs 68. The lower electrode 69 is made of TiAlN, IrO$_x$, or Pt, including a barrier metal, or alloy of Ir and Sr$_x$O$_y$. The ferroelectric film 70 is made of SBT or PZT. The upper electrode 71 is made of Ir, IrO$_x$ or alloy of Ir and Sr$_x$O$_y$.

Figure 35B:
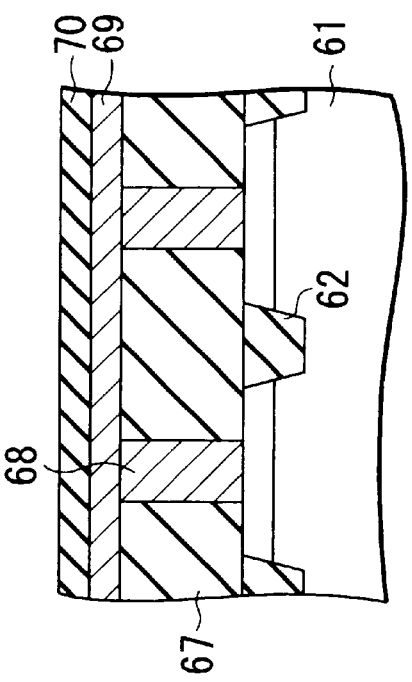
Figure 35A:
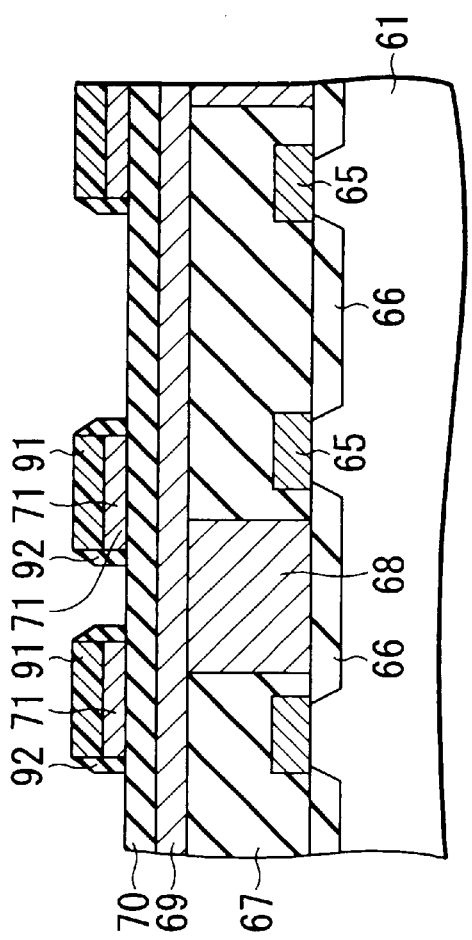

Then, at the steps shown in FIGS. 35A and 35B, the material film of the upper electrode 71 is deposited, the mask 91 for processing the upper electrode is formed, and the material film of the upper electrode 71 is etched so as to obtain the pair of upper electrodes 71 on the one contact plug 68. Thereafter, an insulating film is deposited on the entire top surface and etched by means of the RIE process to leave the side wall insulating film 92 on the side walls of the laminated film composed of the mask 91 and the upper electrode 71.

Figure 36B:
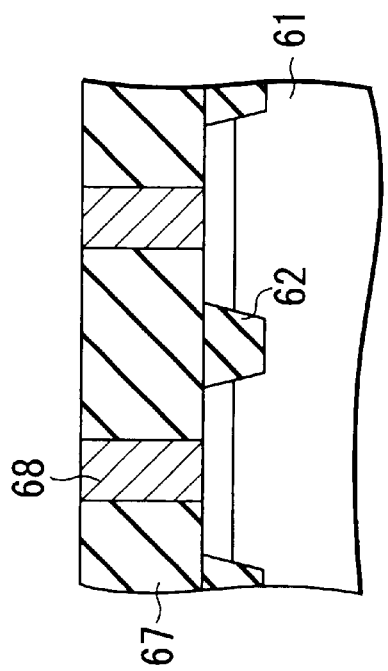
Figure 36A:
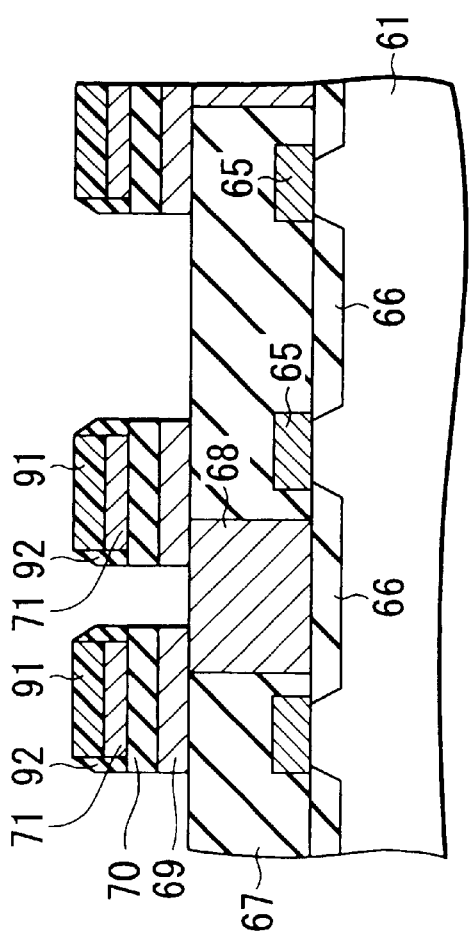

Then, at the steps shown in FIGS. 36A and 36B, the mask 91 and the side wall insulating film 92 are used as an etching mask to etch the material films of the ferroelectric film 70 and of the lower electrode 69 by means of the RIE process to thereby form the ferroelectric film 70 and the lower electrode 69 in a self-aligning manner. At this time, these layers a are laid out such that the size of the space between the pair of lower electrodes 69 located on the one contact plug 68 is smaller the width of the contact plug 68 and that the pair of lower electrodes 69 are prevented from shifting from their appropriate positions on the contact plug 68 despite misalignment.

Figure 37B:
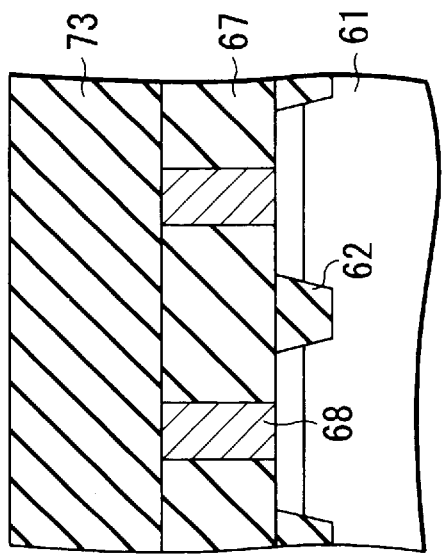
Figure 38B:
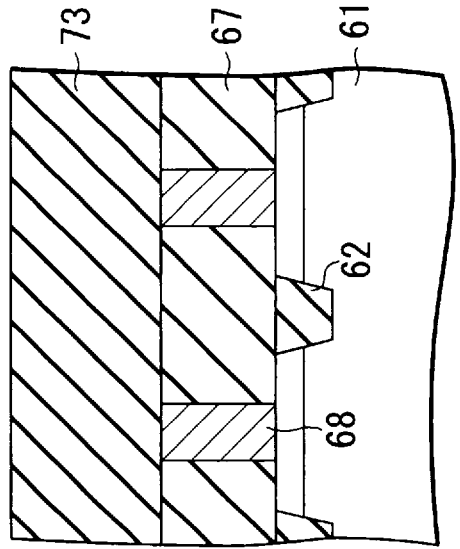
Figure 37A:
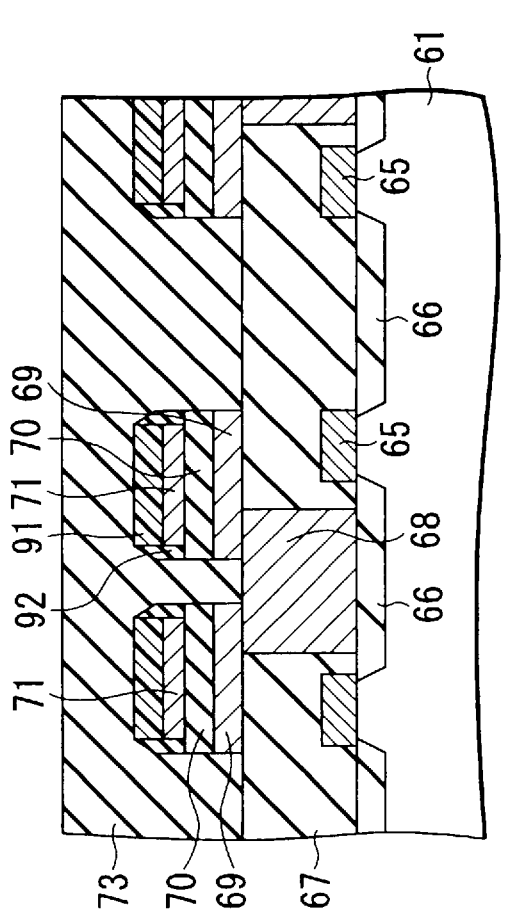
Figure 38A:
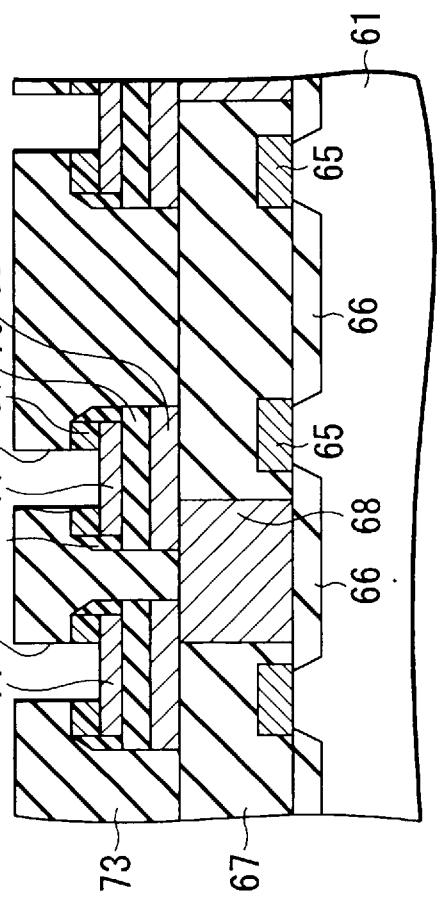

Then, at the steps shown in FIGS. 37A and 37B, the interlayer insulating film 73 is deposited on the entire top surface and then flattened. At the steps shown in FIGS. 38A and 38B, contact holes 93a for contacts 93 corresponding to the diffusion region 66 are formed in the interlayer insulating films 73 and 67. Thereafter, Al is deposited on the entire top surface and then flattened by means of the CMP process to form the contacts 93 and 94 and the wiring layer 74, thereby completing the series connected TC unit type ferroelecric RAM configured as shown in FIGS. 32A to 32C and having the upper electrodes 71 and the diffusion areas 66 connected together.

Thus, according to this embodiment, the mask 91 for patterning the upper electrode 71 is formed in such a manner that the pair of ferroelectric capacitors is located on the one contact plug 68. The mask 91 is then used to pattern the material film of the upper electrode 71, and the side wall insulating film 92 is formed on the side walls of the patterned upper electrode 71. Then, the ferroelectric film 70 and the lower electrode 69 are patterned using the upper electrode 71 and the side wall insulating film 92 as a mask.

Thus, the series connected TC unit type ferroelecric RAM of the COP structure requires no aligning margin between the upper electrode 71 and the lower electrode 69, thus making it possible to reduce the unit cell area. Further, only one etching mask is required to form both the upper electrode 71 and the lower electrode 69, thereby reducing the number of manufacturing steps.

Figure 40A:
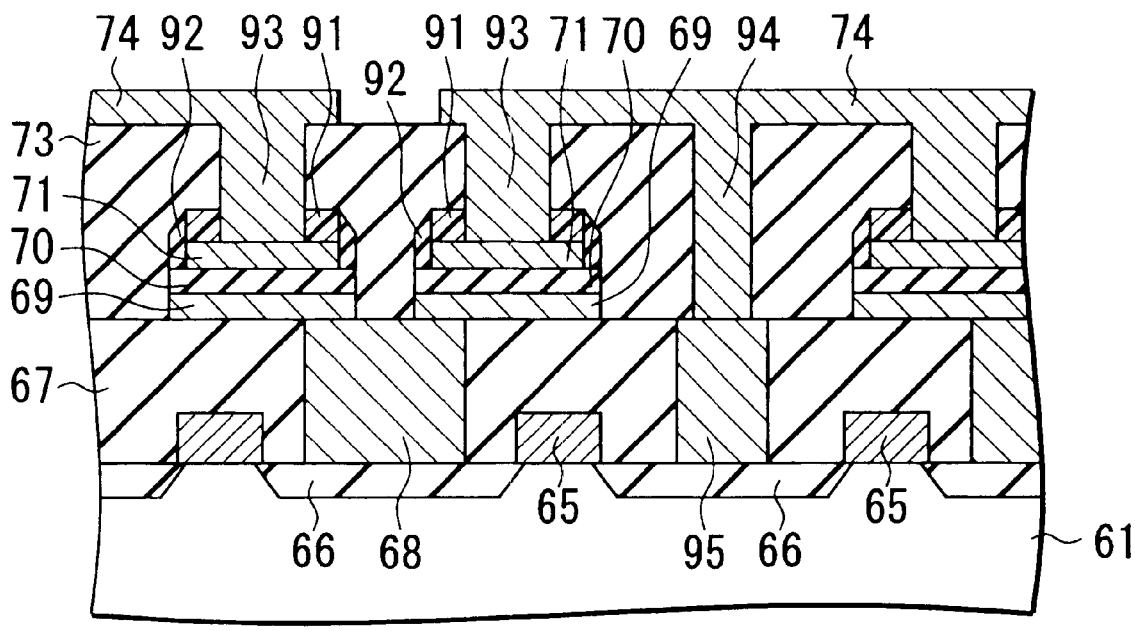
FIGS. 40A and 40B are different sectional views of a cell array area of a series connected TC unit type ferroelectric RAM according to an eleventh embodiment of the present invention.
Figure 40B:
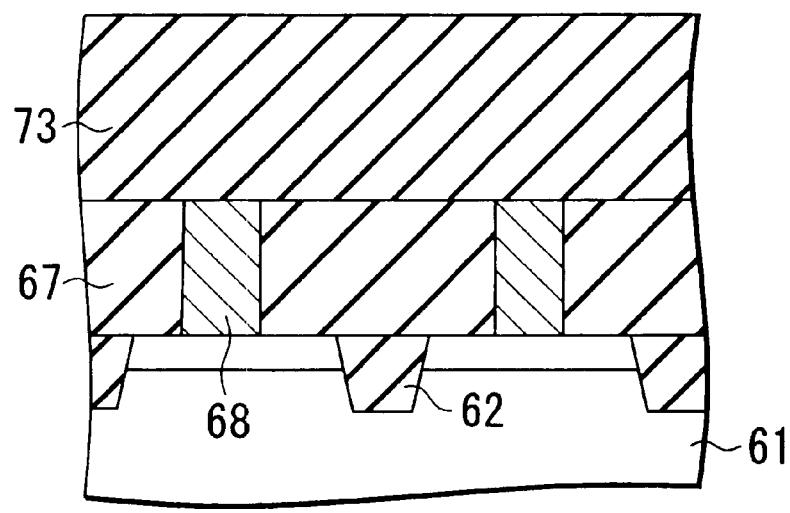

FIGS. 40A and 40B show a cross section of a cell array area of a series connected TC unit type ferroelecric RAM according to an eleventh embodiment of the present invention. FIGS. 40A and 40B correspond to cross sections of FIGS. 32B and 32C.

The cell in this embodiment differs from the cell according to the tenth embodiment shown in FIGS. 32A to 32C in that when the wiring layer 74 is connected to the diffusion areas 66, a contact plug 95 is formed in the interlayer insulating film 67 and the contact 94 is formed on this contact plug 95, rather than continuously forming the contact 94 so as to penetrate the interlayer insulating films 73 and 67.

In the method for manufacturing a series connected TC unit type ferroelecric RAM according to the above-mentioned tenth embodiment, the RAM configured as described above can be formed by forming transistors, depositing and flattening the interlayer insulating film 67, opening contact holes leading to the diffusion regions 66 at the steps in FIGS. 33A and 33B, depositing an electrode material for plugs, for example, tungsten, and flattening the electrode material by means of the CMP or CDE process, In this embodiment, the contact plug 95 is formed under the contact 94, so that the contact 94 is deeper and can be formed easily.

Figure 41A:
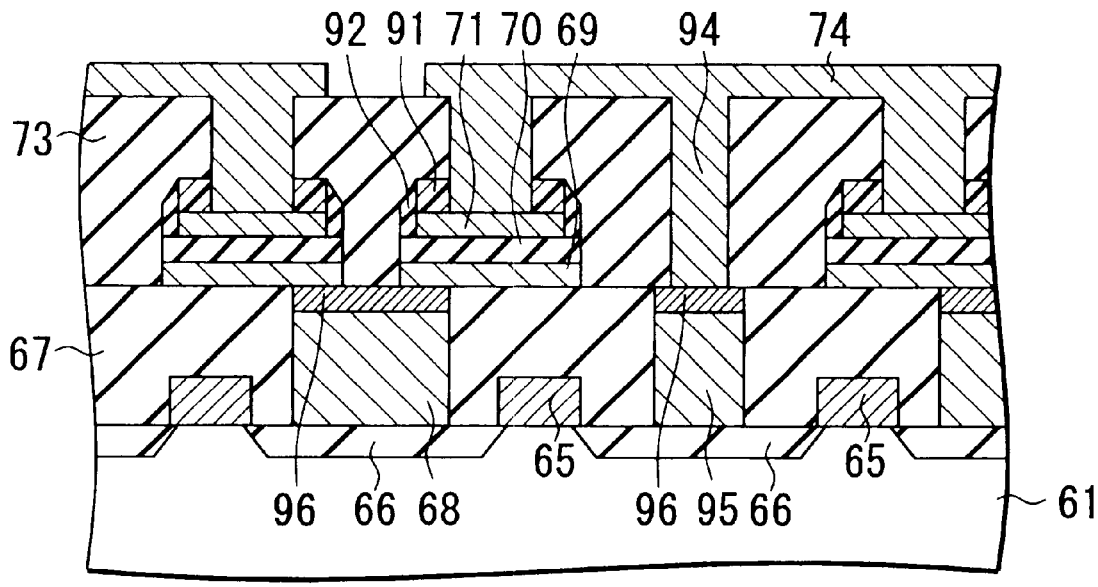
FIGS. 41A and 41B are different sectional views of a cell array area of a series connected TC unit type ferroelectric RAM according to a twelfth embodiment of the present invention.
Figure 41B:
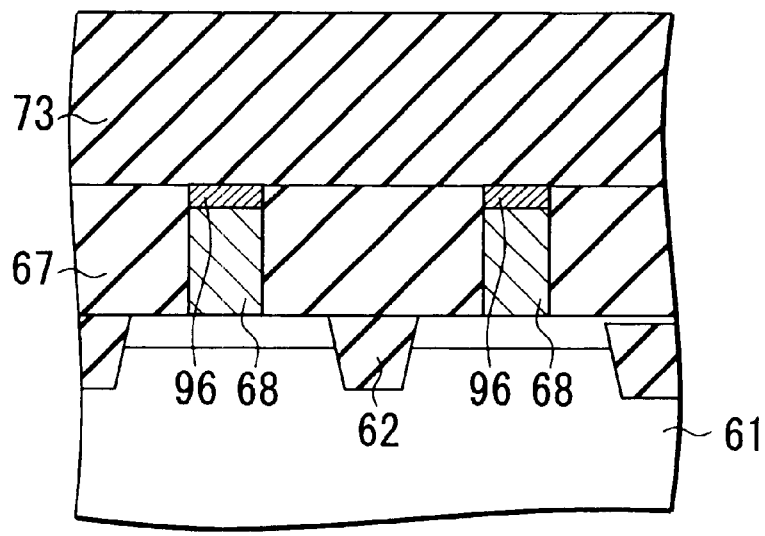

FIGS. 41A and 41B show a cross section of a cell array area of a series connected TC unit type ferroelecric RAM according to a twelfth embodiment of the present invention. FIGS. 41A and 41B corresponds to cross sections of FIGS. 32B and 32C.

The series connected TC unit type ferroelecric RAM of this embodiment is the RAM of the eleventh embodiment wherein oxidation-resistant conductive films 96 for restraining transmission of oxygen, for example, films composed of Ir, IrO$_2$, Ru, RuO$_2$, or the like are buried and formed on the contact plugs 68 and 95.

In the method for manufacturing the series connected TC unit type ferroelecric RAM according to the above-mentioned eleventh embodiment, the RAM configured as described above can be formed by forming the contact plugs 68 and 95, etching the contact plugs 68 and 95 back to a position lower than the contact surface, and depositing and burying the material of the oxidation-resistant conductive film 96 on the plugs.

This embodiment enables recovery annealing in an oxidative environment after the contact hole 94b has been opened, thus forming ferroelectric capacitors having appropriate characteristics.

In the manufacturing methods according to the tenth, eleventh, and twelfth embodiments, the side wall insulating film 92 is formed on the side walls of the upper electrode 71. However, the mask 91 may be formed on the upper electrode 71 without forming the side wall insulating film 92 and only this mask may be used to simultaneously etch the upper electrode 71, the ferroelectric film 70, and the lower electrode 69 to thereby form a pair of ferroelectric capacitors on the contact plug 68, the pair being composed of the pairs of lower electrodes 69, ferroelectric films 70 and upper electrodes 71.

Figure 42A:
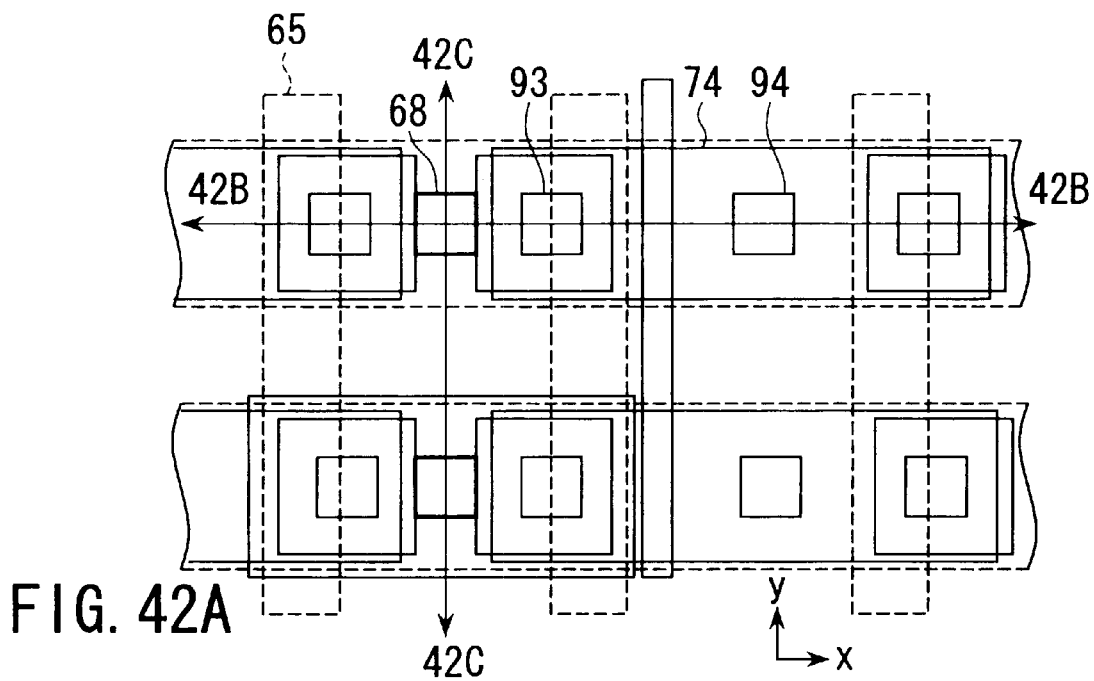
FIG. 42A is a view showing a layout of a cell array area of a series connected TC unit type ferroelectric RAM according to a thirteenth embodiment of the present invention.
Figure 42B:
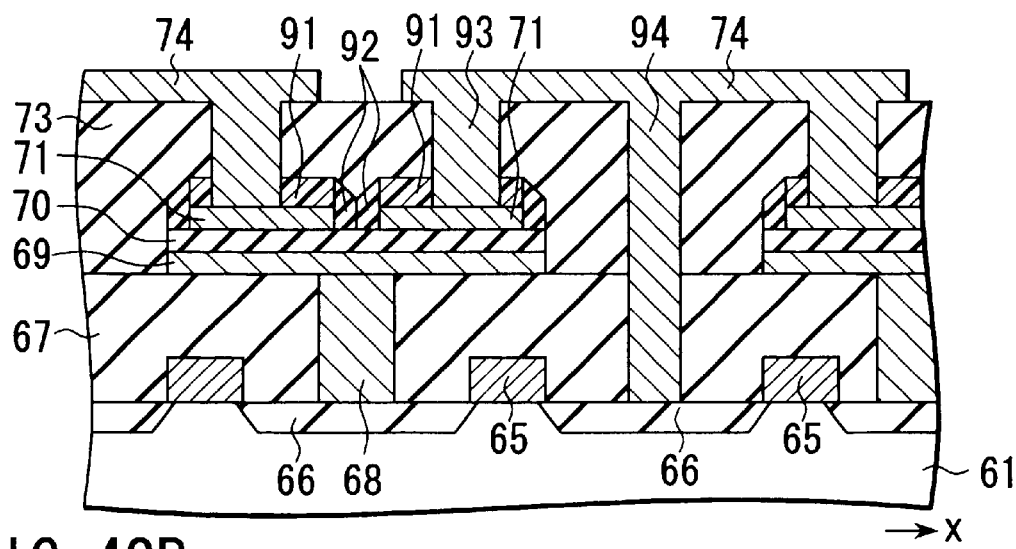
FIGS. 42B and 42C are different sectional views of FIG. 42A.
Figure 42C:
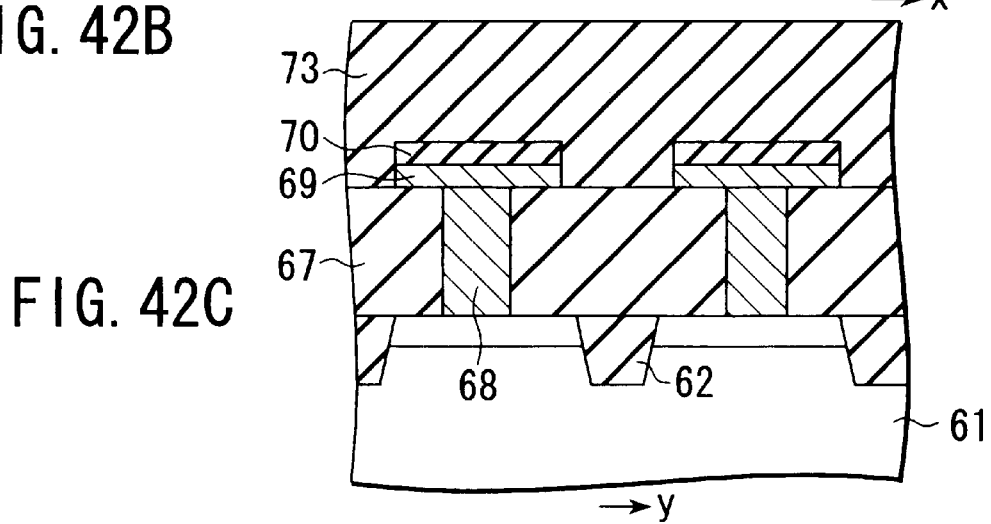

FIGS. 42A to 42C show a layout of a cell array area of a series connected TC unit type ferroelecric RAM according to a thirteenth embodiment of the present invention. FIGS. 42B and 42C show different cross sections of FIG. 42A.

The series connected TC unit type ferroelecric RAM of this embodiment differs from that of the tenth embodiment shown in FIGS. 32A to 32C in that the mask 91 is formed such that the side wall insulating film 92 formed on the side walls of the pair of upper electrodes 71 substantially fills the space between the pair of upper electrodes 71 on the ferroelectric film 70 so that no break occurs in the ferroelectric film 70 and in the lower electrode 69 when the ferroelectric film 70 and the lower electrode 69 are etched so as to self-align with the upper electrodes 71.

Next, a method for manufacturing the RAM as described above will be described with reference to the sectional views in FIGS. 43A and 43B to 49A and 49B. FIGS. 43A to 49A correspond to cross sections of FIG. 42B, and FIGS. 43B to 49B correspond to cross sections of the FIG. 42C.

Figure 43B:
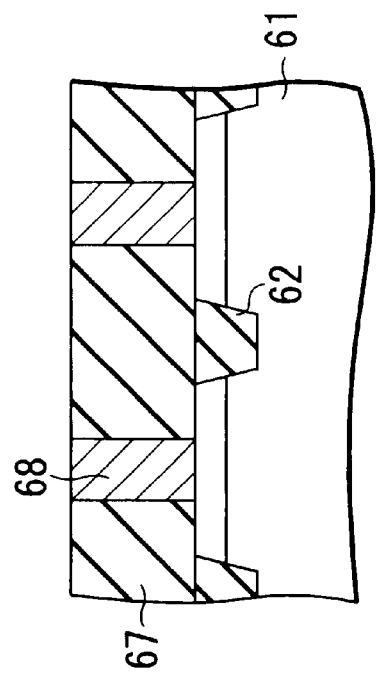
Figure 43A:
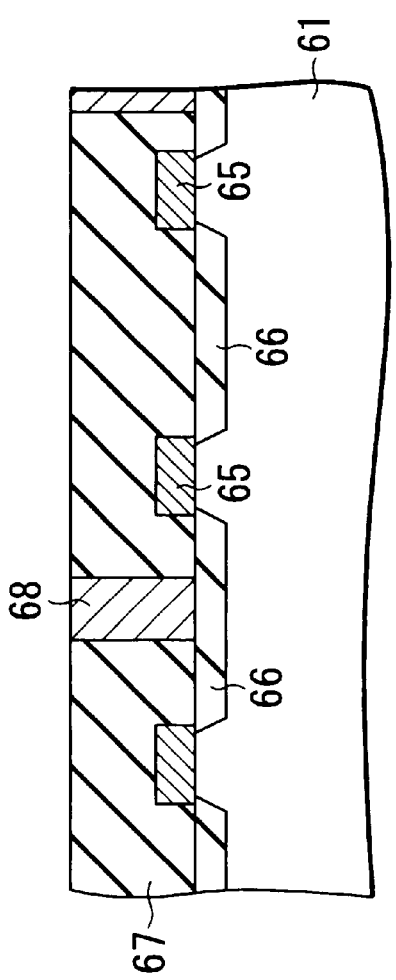

At the steps shown in FIGS. 43A and 43B, transistors are formed in the same manner as in FIGS. 33A and 33B, and the contact plug 68 having a generally square cross section is formed. That is, after the transistors have been formed, the interlayer insulating film 67 is deposited on the entire top surface and then flattened. A Hole for the plug contact is then opened, and an electrode material for the plug, that is, impurity-doped polysilicon or tungsten is deposited on the film and flattened by means of CMP or CDE to form the contact plug 68.

Figure 44B:
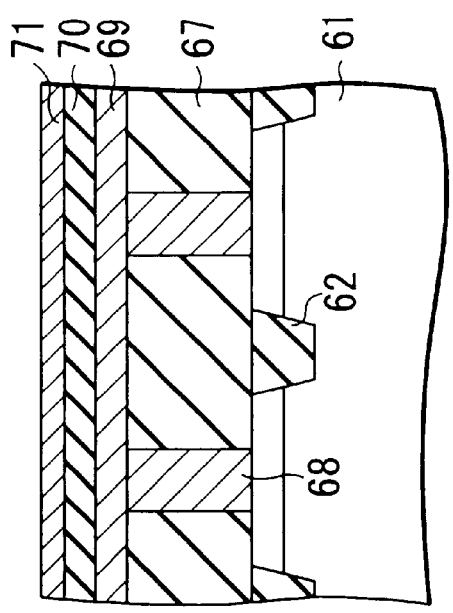
Figure 44A:
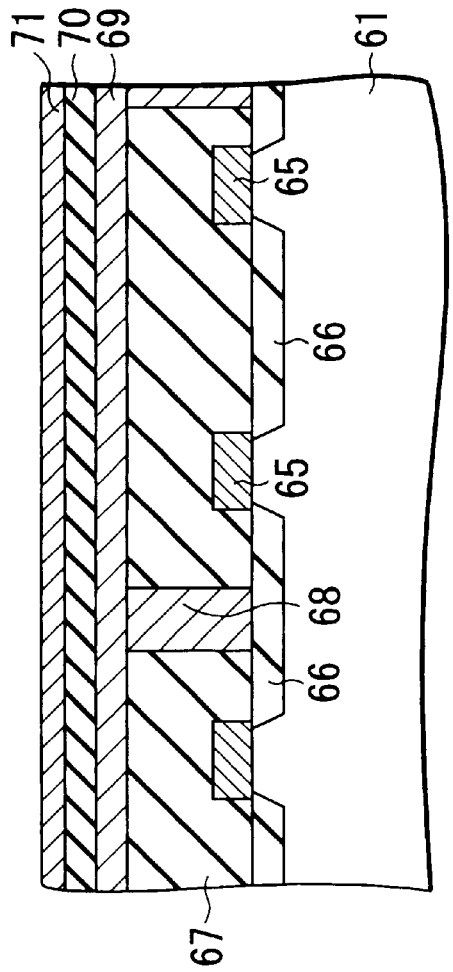

At the steps shown in FIGS. 44A and 44B, the material film of the lower electrode 69, the ferroelectric film 70, and the material film of the upper electrode 71 are sequentially deposited on the contact plug 68.

Figure 45B:
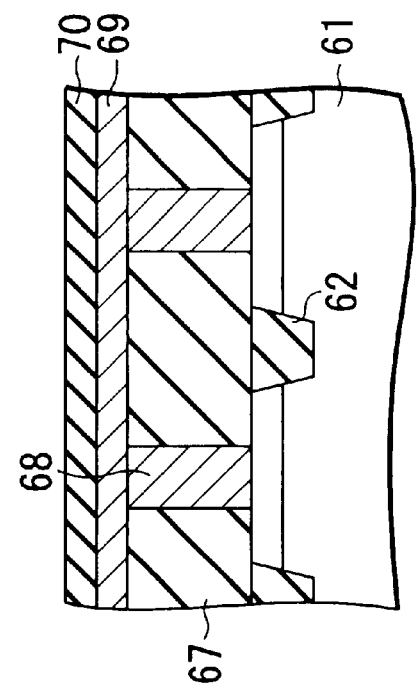
Figure 45A:
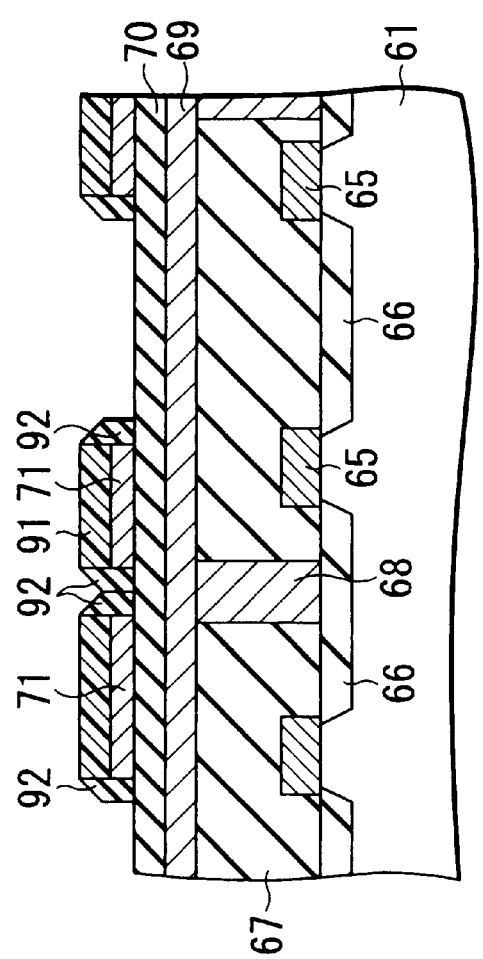

At the steps shown in FIGS. 45A and 45B, the mask 91 for processing the upper electrode is formed on the material film of the upper electrode 71. The mask 91 is used to etch the material film of the upper electrode 71 to thereby form the pair of upper electrodes 71 near above the contact plug 68. Thereafter, an insulating film is deposited on the entire top surface and then etched by means of the RIE process to leave the side wall insulating film 92 on the side walls of the laminated film composed of the upper electrode 71. In this case, a space in the mask 91 which is formed near above the contact plug 68 is completely filled with the side wall insulating film 92 when the latter is formed. To obtain such a structure, the space in this portion of the mask 91 is made sufficiently small or the thickness of the insulating film deposited to form the side wall insulating film 92 is increased.

Figure 46B:
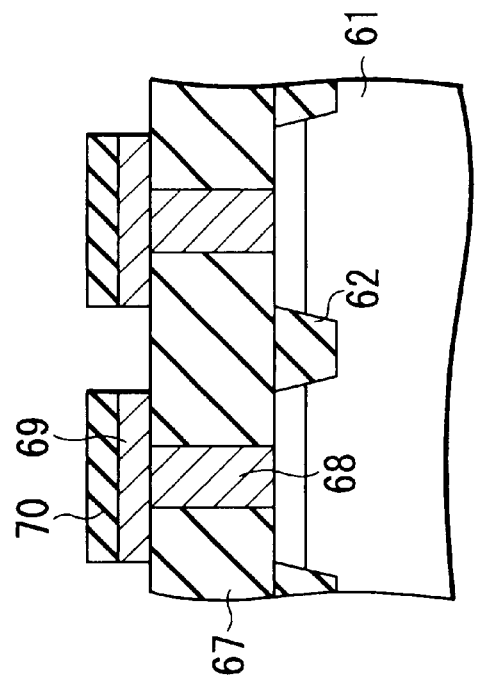
Figure 46A:
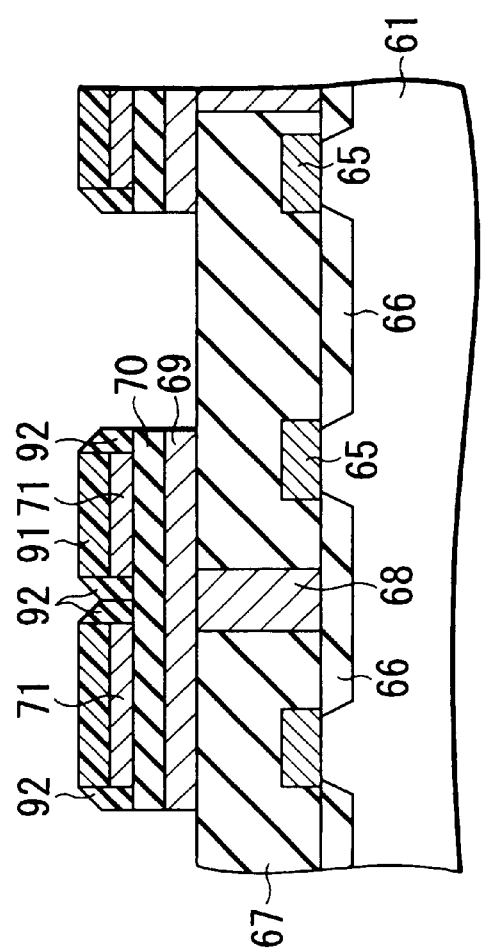

At the steps shown in FIGS. 46A and 46B, the mask 91 and the side wall insulating film 92 are used as an etching mask to etch the material films of the ferroelectric film 70 and of the lower electrode 69 by means of the RIE process to thereby process the ferroelectric film 70 and the lower electrode 69 so as to self-align with the upper electrodes 71. At this time, the side wall insulating films 92 of the pair of upper electrodes 71 located near above the one contact plug 68 are in contact with each other, so that the ferroelectric film 70 and the lower electrode 69 are not etched in this portion. As a result, the ferroelectric film 70 and the lower electrode 69 located on the contact plug 68 are shared by the two adjacent ferroelectric capacitors.

At the steps shown in FIGS. 47A and 47B, the interlayer insulating film 73 is deposited on the entire top surface and then flattened. At the steps in FIGS. 48A and 48B, contact holes 93a for contacts 93 are formed in the interlayer insulating film 93 so as to correspond to the pair of upper electrodes 71.

At the steps shown in FIGS. 49A and 49B, contact holes 94a for contacts 94 are formed in the interlayer insulating films 73 and 67 so as to correspond to the diffusion areas 66. Thereafter, Al is deposited on the entire top surface and flattened by the CMP process to form the contacts 93 and 94 and the wiring layer 74, thereby completing the series connected TC unit type ferroelectric RAM configured as shown in FIGS. 32A to 32C and having the upper electrodes 71 and the diffusion areas 66 connected together.

Thus, according to this embodiment, the patterning mask 91 for the upper electrodes 71 is formed such that a pair of ferroelectric capacitors are located on the one contact plug 68, this mask 91 is used to pattern the material films of the upper electrodes 71, and the side wall insulating film 92 is formed on the side walls of the patterned upper electrodes 71. Then, the upper electrodes 71 and the side wall insulating film 92 are used as a mask to pattern the ferroelectric film 70 and the material film of the lower electrode 69. At this time no break occurs in the lower electrode 69. The lower electrode 69 is therefore shared by the pair of ferroelectric capacitors. Damage to the ferroelectric film is thereby prevented at the time of processing the upper electrode, notwithstanding the mutual displacement of the contact plug 68 and the lower electrode 69. Hence, insufficient contact between the ferroelectric capacitors and the contact plug 68 is prevented as in the tenth to twelfth embodiments.

Figure 50A:
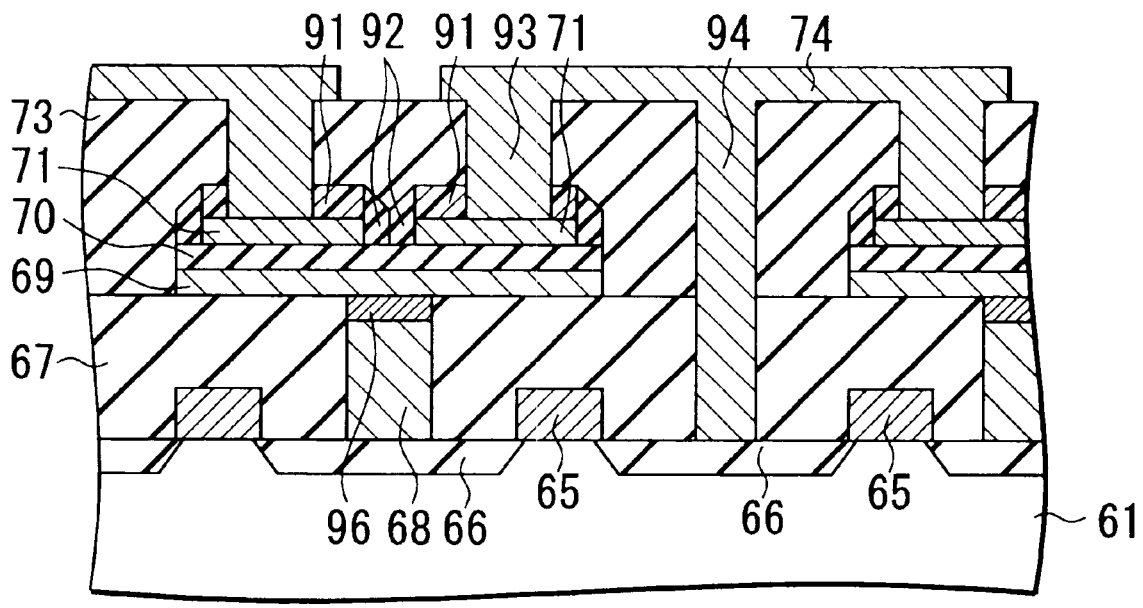
FIGS. 50A and 50B are different sectional views of a cell array area of a series connected TC unit type ferroelectric RAM according to a fourth embodiment of the present invention.
Figure 50B:
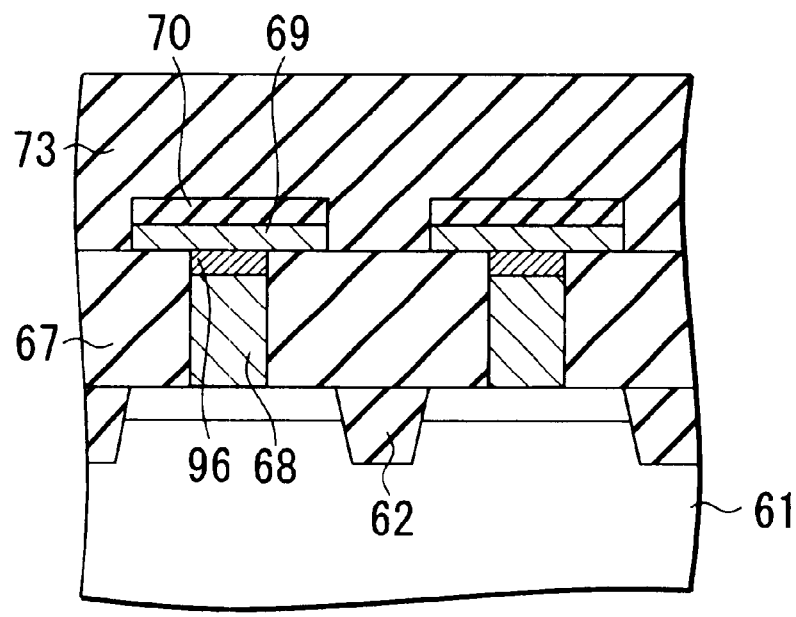

FIGS. 50A and 50B show cross sections of a cell array area of a series connected TC unit type ferroelecric RAM according to a fourteenth embodiment of the present invention. FIGS. 50A and 50B corresponds to cross sections of FIGS. 42B and 42C for the thirteenth embodiment.

The cell in this embodiment differs from the cell according to the twelfth embodiment in that the oxidation-resistant conductive film 96 for restraining transmission of oxygen, for example, a film composed of Ir, $IrO_2$, Ru, $RuO_2$, or the like is buried and formed on the contact plug 68.

A method for manufacturing a series connected TC unit type ferroelecric RAM as in this embodiment is achieved by providing, after the contact plug 68 has been formed at the steps in FIGS. 43A and 43B for the above twelfth embodiment, an additional step of etching the contact plugs 68 back to a position lower than the surface of the interlayer insulating film 67 and depositing and burying the material of the oxidation-resistant conductive film 96 on the plug.

In this embodiment, the oxidation-resistant conductive film 96 is expected to prevent the contact plugs 68 from being oxidized.

Figure 51A:
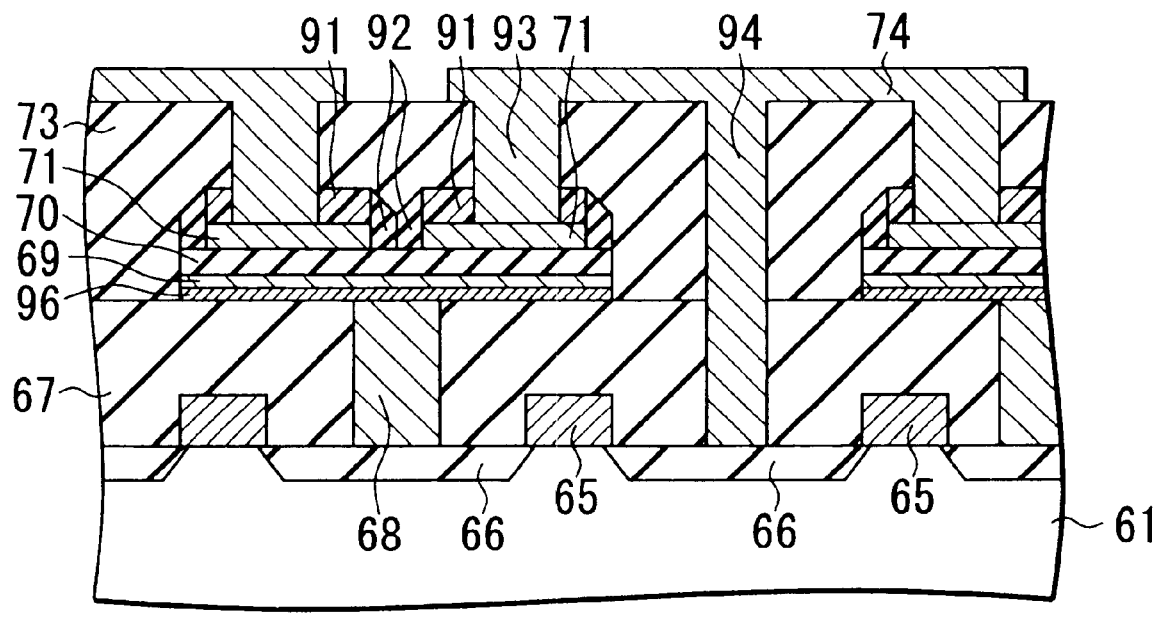
FIGS. 51A and 51B are different sectional views of a cell array area of a series connected TC unit type ferroelectric RAM according to a fifteenth embodiment of the present invention.
Figure 51B:
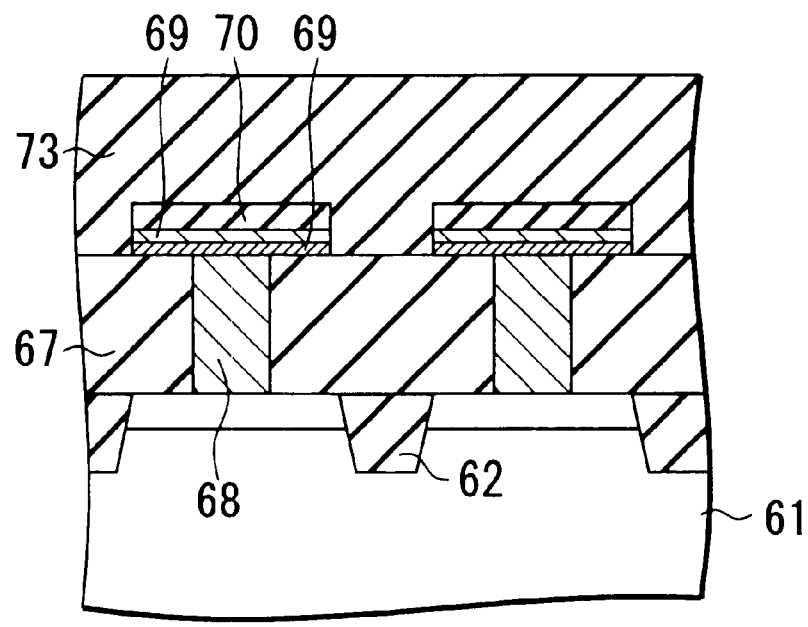

FIGS. 51A and 51B show cross sections of a cell array area of a series connected TC unit type ferroelecric RAM according to a fifteenth embodiment of the present invention. FIGS. 51A and 51B corresponds to cross sections of FIGS. 42B and 42C for the thirteenth embodiment.

The cell in this embodiment differs from the cell according to the thirteenth embodiment in that the oxidation-resistant conductive film 96 is formed under the lower electrode 69.

A method for manufacturing a series connected TC unit type ferroelecric RAM as in this embodiment is achieved by providing, after the contact plug 68 has been formed at the steps in FIGS. 43A and 43B for the twelfth embodiment, an additional step of depositing the material film of the oxidation-resistant conductive film 96 before forming the material film of the lower electrode 69.

This embodiment simplifies the steps compared to the method for manufacturing a series connected TC unit type ferroelecric RAM according to the fourteenth embodiment.

Figure 52A:
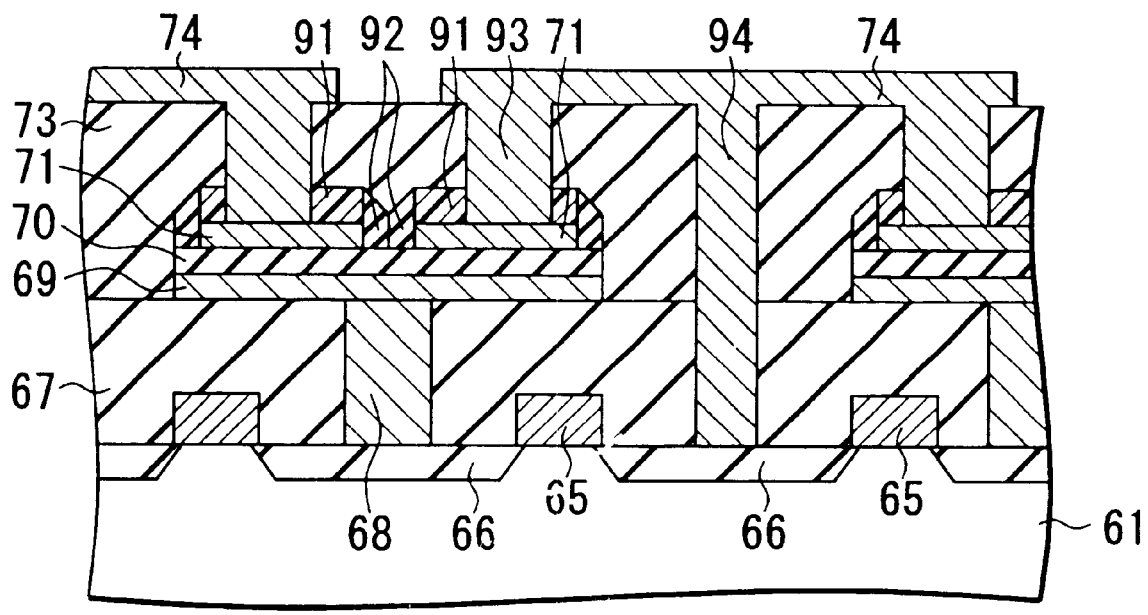
FIGS. 52A and 52B are different sectional views of a cell array area of a series connected TC unit type ferroelectric RAM according to a sixteenth embodiment of the present invention.
Figure 52B:
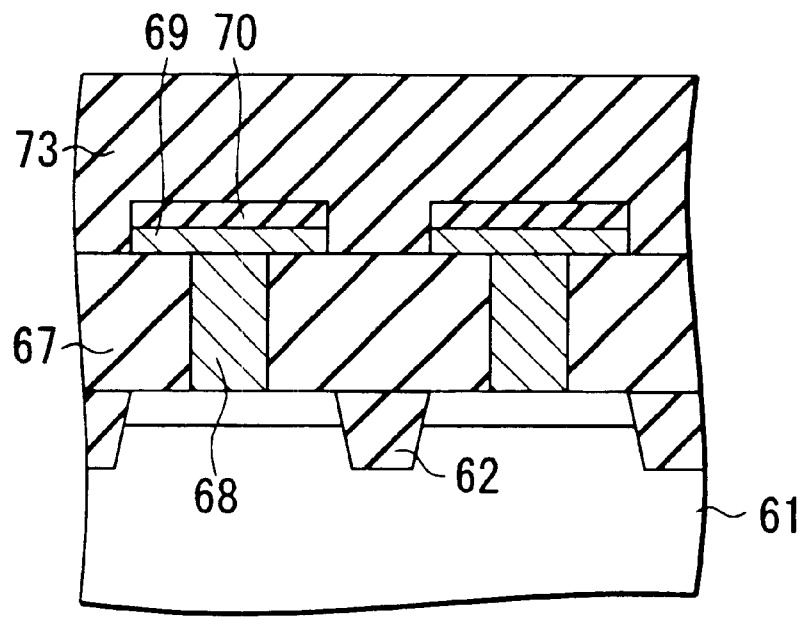

FIGS. 52A and 52B show cross sections of a cell array area of a series connected TC unit type ferroelecric RAM according to a sixteenth embodiment of the present invention. FIGS. 52A and 52B corresponds to cross sections of FIGS. 42B and 42C for the thirteenth embodiment.

The cell in this embodiment differs from the cell according to the thirteenth embodiment in that the contact plug is formed using an oxidation-resistant conductive film composed of, for example, Ir, $IrO_2$, Ru, or $RuO_2$.

A method for manufacturing a series connected TC unit type ferroelecric RAM as in this embodiment is achieved by burying, during the contact plug forming steps in FIGS. 43A and 43B for the twelfth embodiment, the material of the oxidation-resistant conductive film instead of the plug electrode material after opening the contact holes.

This embodiment simplifies the steps compared to the method for manufacturing a series connected TC unit type ferroelecric RAM according to the fifteenth embodiment.

As described above, according to the tenth to sixteenth embodiments, when a COP type series connected TC unit type ferroelecric RAM is manufactured, the upper electrodes, ferroelectric film, and lower electrode of the ferroelectric capacitor can be simultaneously formed and the aligning margin between the upper electrodes and the lower electrode is not required, thereby making it possible to reduce the unit cell area. Further, the processing can be achieved only with the mask for processing the upper electrodes instead of the two masks for the upper and lower electrodes, thus reducing the number of manufacturing steps. This enables realization of inexpensive series connected TC unit type ferroelecric RAMs.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
    a first interlayer insulating film formed on a semiconductor substrate;
    a lower electrode formed on said first interlayer insulating film;
    a pair of ferroelectric films formed on said lower electrode separately from each other; and
    a pair of upper electrodes formed on said pair of ferroelectric films,
    wherein said lower electrode, said pair of ferroelectric films, and said pair of upper electrodes constitute a pair of ferroelectric capacitors, and a first portion of said lower electrode, which is a part of said lower electrode located under said pair of ferroelectric films, and a second portion of said lower electrode, which extends between edge portions of said pair of ferroelectric films, each have uniform thicknesses, and a film thickness of the first portion is greater than a film thickness of the second portion.

2. The semiconductor device according to claim 1, further comprising:

a second interlayer insulating film formed on the entire top surface;

a pair of first openings and a second opening each formed in said second interlayer insulating film, the first openings leading to surfaces of said pair of upper electrodes, the second opening leading to a surface of said lower electrode;

a pair of first metal layers formed in said pair of first openings; and a second metal layer formed in said second opening.

3. A semiconductor device comprising:

a first interlayer insulating film formed on a semiconductor substrate;

a first lower electrode formed on said first interlayer insulating film;

a pair of second lower electrodes formed on said first lower electrode separately from each other, each of said pair of second lower electrodes comprises a horizontal first portion and a second portion extending vertically from an end of the first portion, and a first recess portion is formed with the first and second portions;

a pair of ferroelectric films formed so as to fill said first recess portions of said pair of second lower electrodes, each of said pair of ferroelectric films has a second recess portion; and a pair of upper electrodes formed so as to fill said second recess portions of said pair of ferroelectric films, wherein said first lower electrode, said pair of second lower electrodes, said pair of ferroelectric films, and said pair of upper electrode constitute a pair of ferroelectric capacitors, wherein each of the first and second recess portions is a U-shaped recess portion, and wherein the vertically extending second portion of each of the pair of second electrodes extends entirely vertically from the end of the first portion to a top surface of the pair of ferroelectric capacitors.

4. A semiconductor storage device comprising:

a semiconductor substrate;

a plurality of transistors formed on said semiconductor substrate;

a first interlayer insulating film formed so as to cover said plurality of transistors; and a plurality of ferroelectric capacitors each composing a laminated structure of a lower electrode, a ferroelectric film, and an upper electrode sequentially formed on said first interlayer insulating film, wherein said plurality of ferroelectric capacitors constitute sets each comprising two of said ferroelectric capacitors, said lower electrode is shared by said one set of ferroelectric capacitors, said upper electrode is individually separated between said one set of ferroelectric capacitors, and a space between said upper electrodes of said one set of ferroelectric capacitors is smaller than a space between said upper electrodes of said one set of ferroelectric capacitors and said upper electrodes of an adjacent set of ferroelectric capacitors, wherein said one set of ferroelectric capacitors have peripheries thereof formed into inclined surfaces extending continuously from a top surface of said upper electrode to a bottom surface of said lower electrode and having no step, and said individual upper electrodes of said one set of ferroelectric capacitors are separated by a generally V-shaped groove.

5. The semiconductor storage device according to claim 4, wherein said space between the upper electrodes of said one set of ferroelectric capacitors is half or less of a width of the upper electrode.

6. The semiconductor storage device according to claim 4, wherein said semiconductor substrate is partitioned into a plurality of element forming areas, said element forming areas each have said plurality of transistor formed therein, adjacent ones of said plurality of transistors share a diffusion region and are arranged in a row, and said ferroelectric capacitors are connected in parallel with said transistors to constitute a cell array block.

7. The semiconductor storage device according to claim 6, wherein said plurality of transistors each have a gate electrode, and said gate electrodes extended in a direction crossing a transistor arranging direction of said cell array block constitute a word line, and wherein said space between said upper electrodes of said one set of ferroelectric capacitors is smaller than a width of said word line.

8. The semiconductor storage device according to claim 7, wherein said space is equal to a minimum dimension according to design rules.

9. The semiconductor storage device according to claim 6, wherein said diffusion region includes a first and a second diffusion region which are adjacent to each other, the semiconductor storage device further comprising:

a contact plug buried in said first interlayer insulating film, for connecting the shared lower electrode of said one set of ferroelectric capacitors and said first diffusion region together;

a second interlayer insulating film formed on the entire top surface including surfaces of said plurality of ferroelectric capacitors;

a first contact hole formed in said second interlayer insulating film so as to expose the upper electrodes of said one set of ferroelectric capacitors;

a second contact hole formed continuously in said first and second interlayer insulating films so as to expose said second diffusion region; and a wiring layer formed so as to cover said second interlayer insulating film and said first and second contact holes, for connecting the upper electrodes of said one set of ferroelectric capacitors and said second diffusion region together.

10. A semiconductor storage device comprising:

a semiconductor substrate;

a plurality of transistors formed on said semiconductor substrate;

a first interlayer insulating film formed so as to cover said plurality of transistors; and a plurality of ferroelectric capacitors each composing a laminated structure of a lower electrode, a ferroelectric film, and an upper electrode sequentially formed on said first interlayer insulating film, wherein said plurality of ferroelectric capacitors constitute sets each comprising two of said ferroelectric capacitors, said lower electrode is shared by said one set of ferroelectric capacitors, said upper electrode is individually separated between said one set of ferroelectric capacitors and has a space, said one set of ferroelectric capacitors have peripheries thereof formed into inclined surfaces extending continuously from a top surface of said upper electrode to a bottom surface of said lower electrode and having no step, and said individual upper electrodes in said one set of ferroelectric capacitors are separated by a generally V-shaped groove.

11. The semiconductor storage device according to claim 10, wherein said space between the upper electrodes of said one set of ferroelectric capacitors is half or less of a width of the upper electrode.

* * * * *